US012763291B2

(12) United States Patent
Walker et al.

(10) Patent No.: US 12,763,291 B2
(45) Date of Patent: Oct. 13, 2026

(54) SINTERED YTTRIUM OXIDE BODY OF LARGE DIMENSION

(71) Applicant: Heraeus Covantics North America LLC, Chandler, AZ (US)

(72) Inventors: Luke Walker, Chandler, AZ (US); Matthew Joseph Donelon, Chandler, AZ (US); Lillian Thompson, Chandler, AZ (US)

(73) Assignee: Heraeus Covantics North America LLC, Chandler, AZ (US)

(*) Notice: Subject to any disclaimer, the term of this patent is extended or adjusted under 35 U.S.C. 154(b) by 811 days.

(21) Appl. No.: 18/247,392

(22) PCT Filed: Sep. 30, 2021

(86) PCT No.: PCT/US2021/052989
§ 371 (c)(1),
(2) Date: Mar. 30, 2023

(87) PCT Pub. No.: WO2022/072711
PCT Pub. Date: Apr. 7, 2022

(65) Prior Publication Data

US 2024/0010510 A1 Jan. 11, 2024

Related U.S. Application Data

(60) Provisional application No. 63/124,541, filed on Dec. 11, 2020, provisional application No. 63/087,204, filed on Oct. 3, 2020.

(51) Int. Cl.
*H01J 37/32* (2006.01)

(52) U.S. Cl.
CPC .. *H01J 37/32467* (2013.01); *H01J 37/32495* (2013.01); *C01P 2002/85* (2013.01);
(Continued)

(58) Field of Classification Search
CPC ................ C04B 35/645; C04B 35/505; C04B 2235/3418; C04B 2235/72; C04B 2235/77; C01F 17/218
See application file for complete search history.

(56) References Cited

U.S. PATENT DOCUMENTS 5,262,029 A 11/1993 Erskine et al.
5,798,016 A 8/1998 Oehrlein et al.
(Continued)

FOREIGN PATENT DOCUMENTS

CN 101628812 A 1/2010
CN 101048856 B 11/2010
(Continued)

OTHER PUBLICATIONS

American elements (via web.archive.org). Yttrium Oxide. https://web.archive.org/web/20180323030805/https://www.americanelements.com/yttrium-oxide-1314-36-9. Published on or before Mar. 23, 2018. retrieved on Jan. 21, 2026 (Year: 2018).*
(Continued)

*Primary Examiner* — Noah S Wiese
(74) *Attorney, Agent, or Firm* — Dicke, Billig & Czaja, PLLC

(57) ABSTRACT

Disclosed herein is a sintered yttrium oxide body having a total impurity level of 40 ppm or less, a density of not less than 4.93 g/cm3, wherein the sintered yttrium oxide body has at least one grain boundary comprising silica in an amount of not less than 1 to not greater than 10 atoms/nm2 wherein the sintered yttrium oxide body has at least one surface comprising at least one pore, wherein no pore is larger than 5 µm in diameter. A process for making the sintered yttrium oxide body is also disclosed.

15 Claims, 35 Drawing Sheets

(52) U.S. Cl.
CPC ...... *C01P 2002/88* (2013.01); *C01P 2004/03* (2013.01); *C01P 2006/10* (2013.01); *C01P 2006/12* (2013.01); *C01P 2006/17* (2013.01); *C01P 2006/80* (2013.01); *H01J 2237/334* (2013.01)

(56) References Cited

U.S. PATENT DOCUMENTS

| | | | | |
|---|---|---|---|---|
| 5,838,529 | A | 11/1998 | Shufflebotham et al. | |
| 5,911,852 | A | 6/1999 | Katayama et al. | |
| 6,123,791 | A | 9/2000 | Han et al. | |
| 6,352,611 | B1 | 3/2002 | Han et al. | |
| 7,932,202 | B2 * | 4/2011 | Hamada | C04B 35/62655 501/152 |
| 8,158,544 | B2 * | 4/2012 | Okamoto | C04B 35/505 501/126 |
| 2006/0043067 | A1 | 3/2006 | Kadkhodayan et al. | |
| 2008/0207432 | A1 | 8/2008 | Hamada | |
| 2011/0129684 | A1 | 6/2011 | Okamoto et al. | |

FOREIGN PATENT DOCUMENTS

| | | | | |
|---|---|---|---|---|
| CN | 102015577 | A | 4/2011 | |
| CN | 203062932 | U | 7/2013 | |
| JP | 2004026616 | A | 1/2004 | |
| JP | 2006021990 | A | 1/2006 | |
| JP | 2014001427 | A | 1/2014 | |
| JP | 2015209583 | A | 11/2015 | |
| JP | 2017095778 | A | 6/2017 | |
| KR | 100599998 | B1 * | 7/2006 | C04B 35/505 |
| RU | 185572 | U1 | 12/2018 | |
| TW | 200944488 | A | 11/2009 | |

OTHER PUBLICATIONS

Kindelmann Moritz, et al., “Erosion behavior of Y 2 0 3 in fluorine-based etching plasmas: Orientation dependency and reaction layer formation”, Journal of the American Ceramic Society, [Online] vol. 104, No. 3, Nov. 4, 2020 (Nov. 4, 2020), pp. 1465-1474, XP055877435, US, ISSN: 0002-7820, DOI: 10.1111/jace.17556 Retrieved from the Internet: URL: https://onlinelibrary.wiley.com/doi/full-xml/10.1111/jace.17556 [retrieved on Jan. 10, 2022]I; “Introduction”; II. “Experimental Procedure”.

Hidehiro Yoshida et al., “Low-Temperature Spark Plasma Sintering of Yttria Ceramics with Ultrafine Grain Size: Low-Temperature SPS of Yttria Ceramics with Ultrafine Grain Size”, Journal of the American Ceramic Society, vol. 94, No. 10, May 3, 2011 (May 3, 2011), pp. 3301-3307, XP055380315, US, ISSN: 0002-7820, DOI: 10.1111/j.1551-2916.2011.04583.x I; “Introduction”; II. “Experimental Procedure”.

Cao Yu-Chao, et al., “Plasma etching behavior of Y2O3ceramics: Comparative study with A12O3”, Applied Surface Science, Elsevier, Amsterdam, NL, vol. 366, Jan. 14, 2016 (Jan. 14, 2016), pp. 304-309, XP029654964, ISSN: 0169-4332, DOI: 10.1016/J.APSUSC.2016.01.092 the whole document.

“Spark Plasma Sintering of Ti Matrix Composites”, Zhaohui Zhang, National Defense Industry Press, Mar. 2018.

“The Quantitative Analysis of Thin Specimens: A Review of Progress from the Cliff-Lorimer to the New Factor Methods”, M. Watanabe & D.B. Williams, Journal of Microscopy, vol. 221, pp. 89-109. Feb. 2, 2006.

“Quantification of Boundary Segregation in the Analytical Electron Microscope”, V.J. Keast & D.B. Williams, Journal of Microscopy, vol. 199, pp. 45-55, Jul. 2000.

* cited by examiner

Pre Etch

Post CF4/O2 Etch

107

118

SINTERED YTTRIUM OXIDE BODY OF LARGE DIMENSION

TECHNICAL FIELD

The present disclosure relates to a highly pure and highly dense sintered yttrium oxide body having characteristics that translate into exceptional etch resistance when used as a component in a plasma etch chamber. Moreover, the present disclosure provides a process for making the sintered yttrium oxide body.

BACKGROUND

In the field of semiconductor material processing, vacuum processing chambers are used for etching and chemical vapor deposition (CVD) of materials on substrates. Process gases are introduced into the processing chamber while a radio frequency (RF) field is applied to the process gases to generate a plasma of the process gases.

During processing of semiconductor substrates, the substrates are typically supported within the vacuum chamber by substrate holders as disclosed, for example, in U.S. Pat. Nos. 5,262,029 and 5,838,529. Process gas can be supplied to the chamber by various gas supply systems. Other equipment used in processing semiconductor substrates includes windows, nozzles, shower heads, (etch) chamber liners, mixing manifolds, wafer supports, electronic wafer chucks, and various rings such as focus rings and protective rings, among other components.

In such processes, the plasmas are typically used to remove materials on the chamber walls and substrates. The plasma etch conditions create significant ion bombardment of the surfaces of the processing chamber that are exposed to the plasma. This ion bombardment, combined with plasma chemistries and/or etch by-products, can produce significant surface roughening, erosion, corrosion and corrosion-erosion of the plasma-exposed surfaces of the processing chamber. As a result, the surface materials are removed by physical and/or chemical attack. This attack causes problems including short part lifetimes which lead to extended tool downtime, increased consumable costs, particulate contamination, on-wafer transition metal contamination and process drift.

Moreover, plasma processing chambers have been designed to include parts such as disks, rings, and cylinders that confine the plasma over the wafer being processed. However, these parts used in plasma processing chambers are continuously attacked by the plasma and, consequently, erode or accumulate contaminants and polymer build-up.

Because of this erosive and corrosive nature of the plasma environment in such reactors, there is a need to minimize particle and/or metal contamination. Accordingly, it is desirable for components of such equipment, including consumables and other parts, to have suitably high erosion and corrosion resistance. Such parts have been formed from materials that provide resistance to corrosion and erosion in plasma environments and have been described, for example, in U.S. Pat. Nos. 5,798,016, 5,911,852, 6,123,791 and 6,352,611.

Yttrium oxide is known to exhibit remarkably higher resistance to halogen-based corrosive gases and plasmas of such gases as compared to other common ceramic materials such as alumina, silicon carbide, silicon nitride and zirconia. As such, yttrium oxide is commonly applied as a layer to corrosion-resistant components in plasma processing-involving semiconductor manufacturing apparatuses.

But there are drawbacks to the use of yttrium oxide. Yttrium oxide suffers from persistent problems such as low sintering strength which prevents the development of yttrium oxide as a structural material in these plasma-resistant applications. Low sintering strength may also be a limiting factor to making large parts due to breakage with increasing component dimensions. Accordingly, yttrium oxide may be used as a corrosion resistant member coating in some cases, where components are produced by spraying yttrium oxide to a base material formed of a metal material or formed of a ceramic material made of other materials, such as alumina, which are lower in price and higher in strength than yttrium oxide.

Yttrium oxide materials, however, still suffer from many drawbacks in plasma etching processes such as significant porosity within the yttria coating and reduced adhesion strength between the yttria and base layer. The presence of porosity in the coating will adversely affect the corrosion and erosion resistance of the component. Further, yttrium oxide is difficult to sinter with traditional methods, in particular to form a sintered body of large dimension. As a result, there is a need for a yttrium oxide material for use in plasma etch chambers that does not suffer from such drawbacks.

SUMMARY

These and other needs are addressed by the various embodiments, aspects and configurations as disclosed herein:

Embodiment 1. A sintered yttrium oxide body having a total impurity level of 40 ppm or less, a density of not less than 4.93 g/cm$^3$, wherein the sintered yttrium oxide body has at least one grain boundary comprising silica in an amount of not less than 1 to not greater than 10 atoms/nm$^2$ wherein the sintered yttrium oxide body has at least one surface comprising at least one pore, wherein no pore is larger than 5 μm in diameter.

Embodiment 2. The sintered yttrium oxide body of embodiment 1 wherein the density is not less than 4.96 g/cm$^3$.

Embodiment 3. The sintered yttrium oxide body according to embodiments 1 or 2 wherein the density is not less than 4.98 g/cm$^3$.

Embodiment 4. The sintered yttrium oxide body as in any one of embodiments 1, 2, and 3 wherein the density is not less than 5.01 g/cm$^3$.

Embodiment 5. The sintered yttrium oxide body as in any of the preceding embodiments wherein no pore is larger than 4 μm in diameter.

Embodiment 6. The sintered yttrium oxide body as in any of the preceding embodiments wherein no pore is larger than 3 μm in diameter.

Embodiment 7. The sintered yttrium oxide body as in any of the preceding embodiments wherein no pore is larger than 2 μm in diameter.

Embodiment 8. The sintered yttrium oxide body as in any of the preceding embodiments wherein no pore is larger than 1 μm in diameter.

Embodiment 9. The sintered yttrium oxide body as in any of the preceding embodiments wherein the total impurity level is 35 ppm or less.

Embodiment 10. The sintered yttrium oxide body as in any of the preceding embodiments wherein the total impurity level is 30 ppm or less.

Embodiment 11. The sintered yttrium oxide body as in any of the preceding embodiments wherein the total impurity level is 25 ppm or less.

Embodiment 12. The sintered yttrium oxide body as in any of the preceding embodiments wherein the total impurity level is 20 ppm or less.

Embodiment 13. The sintered yttrium oxide body as in any of the preceding embodiments wherein the total impurity level is 15 ppm or less.

Embodiment 14. The sintered yttrium oxide body as in any of the preceding embodiments wherein the total impurity level is 10 ppm or less.

Embodiment 15. The sintered yttrium oxide body as in any of the preceding embodiments wherein the sintered yttrium oxide body has a dielectric loss of from $1.5\times10^{-2}$ to $5.0\times10^{-2}$ at a frequency of 1 MHz as measured at ambient temperature in accordance with ASTM D150.

Embodiment 16. The sintered yttrium oxide body as in any of the preceding embodiments exhibiting an etch volume of less than about 375,000 $\mu m^3$ in a process wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step is 24 hours.

Embodiment 17. The sintered yttrium oxide body as in any of the preceding embodiments exhibiting an etch volume of less than about 325,000 $\mu m^3$.

Embodiment 18. The sintered yttrium oxide body as in any of the preceding embodiments exhibiting an etch volume of less than about 275,000 $\mu m^3$.

Embodiment 19. The sintered yttrium oxide body as in any of the preceding embodiments having a pore size distribution with a maximum pore size of 1.50 μm for 95% or more of all pores on the at least one surface.

Embodiment 20. The sintered yttrium oxide body as in any of the preceding embodiments having a pore size distribution with a maximum pore size of 1.75 μm for 97% or more of all pores on the at least one surface.

Embodiment 21. The sintered yttrium oxide body as in any of the preceding embodiments having a pore size distribution with a maximum pore size of 2.00 μm for 99% or more of all pores on the at least one surface.

Embodiment 22. The sintered yttrium oxide body as in any of the preceding embodiments exhibiting an etch rate of less than 1.0 nm/min in a process wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step is 24 hours.

Embodiment 23. The sintered yttrium oxide body as in any of the preceding embodiments wherein the etch rate is less than 0.9 nm/min.

Embodiment 24. The sintered yttrium oxide body as in any of the preceding embodiments wherein the etch rate is less than 0.8 nm/min.

Embodiment 25. The sintered yttrium oxide body as in any of the preceding embodiments exhibiting a developed interfacial area, Sdr, as determined by ISO Standard 25178-2-2012, section 4.3.2, in an unetched area of less than $250\times10^{-5}$.

Embodiment 26. The sintered yttrium oxide body as in any of the preceding embodiments wherein the developed interfacial area in the unetched area is less than $225\times10^{-5}$.

Embodiment 27. The sintered yttrium oxide body as in any of the preceding embodiments wherein the developed interfacial area in the unetched area is less than $200\times10^{-5}$.

Embodiment 28. The sintered yttrium oxide body as in any of the preceding embodiments exhibiting a developed interfacial area as determined by ISO Standard 25178-2-2012, section 4.3.2, in an etched area of less than $200\times10^{-5}$ in a process wherein a 6 mm×6 mm area of the at least one surface is subjected to etching conditions at pressure of 10 millitorr with a $CF_4$ flow rate of 90 sccm, an oxygen flow rate of 30 sccm, an argon flow rate of 20 sccm, and a bias of 600 volts and 2000 Watt ICP power for a duration of 24 hours.

Embodiment 29. The sintered yttrium oxide body as in any of the preceding embodiments wherein the developed interfacial area in the etched area is less than $175\times10^{-5}$.

Embodiment 30. The sintered yttrium oxide body as in any of the preceding embodiments wherein the developed interfacial area in the etched area is less than $150\times10^{-5}$.

Embodiment 31. The sintered yttrium oxide body as in any of the preceding embodiments exhibiting an arithmetical mean height, Sa, of less than 30 nm as determined by ISO Standard 25178-2-2012, section 4.1.7, in a process wherein a 10 mm×5 mm area of the at least one surface is subjected to etching conditions at pressure of 10 millitorr, an argon flow rate of 20 sccm, and a bias of 600 volts and 2000 Watt ICP power, wherein the process has a first step and a second step, wherein the first step has a $CF_4$ flow rate of 90 sccm, an oxygen flow rate of 30 sccm for 300 seconds and the second step has a $CF_4$ flow rate of 0 sccm and an oxygen flow rate of 100 sccm for 300 seconds, wherein steps 1 and 2 are sequentially repeated for a total etch time of 6 hours.

Embodiment 32. The sintered yttrium oxide body as in any of the preceding embodiments wherein the Sa is less than 20 nm.

Embodiment 33. The sintered yttrium oxide body as in any of the preceding embodiments wherein the Sa is less than 15 nm.

Embodiment 34. The sintered yttrium oxide body as in any of the preceding embodiments wherein the at least one surface has an area of which less than 0.15% is occupied by pores.

Embodiment 35. The sintered yttrium oxide body as in any of the preceding embodiments wherein the at least one surface has an area of which less than 0.10% is occupied by pores.

Embodiment 36. The sintered yttrium oxide body as in any of the preceding embodiments wherein the sintered yttrium oxide body exhibits a step height change of from 0.27 to 0.28 μm after an $SF_6$ etch process.

Embodiment 37. The sintered yttrium oxide body as in any of the preceding embodiments having a grain size d50 of from 0.1 μm to 25 μm.

Embodiment 38. The sintered yttrium oxide body as in any of the preceding embodiments having a grain size d50 of from 0.5 μm to 15 μm.

Embodiment 39. The sintered yttrium oxide body as in any of the preceding embodiments having a grain size d50 of from 0.5 μm to 10 μm.

Embodiment 40. The sintered yttrium oxide body as in any of the preceding embodiments having at least one dimension of from 100 mm to 600 mm.

Embodiment 41. The sintered yttrium oxide body as in any of the preceding embodiments having at least one dimension of from 100 mm to 406 mm.

Embodiment 42. The sintered yttrium oxide body as in any of the preceding embodiments having at least one dimension of from 200 mm to 600 mm.

Embodiment 43. The sintered yttrium oxide body as in any of the preceding embodiments having at least one dimension of from 350 mm to 600 mm.

Embodiment 44. The sintered yttrium oxide body as in any of the preceding embodiments having at least one dimension of from 500 mm to 600 mm.

Embodiment 45. The sintered yttrium oxide body as in any of the preceding embodiments having at least one dimension of from 550 mm to 600 mm.

Embodiment 46. The sintered yttrium oxide body as in any of the preceding embodiments wherein the density does not vary by more than 3% along the at least one dimension.

Embodiment 47. The sintered yttrium oxide body as in any of the preceding embodiments wherein the density does not vary by more than 2% along the at least one dimension.

Embodiment 48. The sintered yttrium oxide body as in any of the preceding embodiments wherein the density does not vary by more than 1% along the at least one dimension.

Embodiment 49. A process of making a sintered yttrium oxide body, the process comprising the steps of: a) disposing yttrium oxide powder inside an inner volume defined by a spark plasma sintering tool, wherein the spark plasma sintering tool comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide and creating vacuum conditions inside the inner volume; b) applying a pressure of from 10 MPa to 60 MPa to the yttrium oxide powder by moving at least one of the upper punch and the lower punch within the inner volume of the die to apply pressure to the yttrium oxide powder while heating to a sintering temperature of from 1200 to 1600° C. and performing sintering to form a sintered yttrium oxide body; and c) lowering the temperature of the sintered yttrium oxide body, wherein the yttrium oxide powder of step a) has a surface area of 10 $m^2/g$ or less, wherein the sintered yttrium oxide body has a total impurity level of 40 ppm or less, a density of not less than 4.93 $g/cm^3$, at least one surface comprising at least one pore, wherein no pore is larger than 5 μm in diameter.

Embodiment 50. The process of embodiment 49, further comprising the steps of: d) optionally annealing the sintered yttrium oxide body by applying heat to raise the temperature of the sintered yttrium oxide body to reach an annealing temperature, performing annealing; e) lowering the temperature of the annealed sintered yttrium oxide body to an ambient temperature by removing the heat source applied to the sintered yttrium oxide body; and f) optionally machining the annealed sintered yttrium oxide body to create a sintered yttrium oxide body component, wherein the component is selected from the group consisting of a dielectric window or RF window, a focus ring, a nozzle or a gas injector, a shower head, a gas distribution plate, an etch chamber liner, a plasma source adapter, a gas inlet adapter, a diffuser, an electronic wafer chuck, a chuck, a puck, a mixing manifold, an ion suppressor element, a faceplate, an isolator, a spacer, and a protective ring.

Embodiment 51. The process as in any one of embodiments 49-50 wherein the yttrium oxide powder is calcined prior to step a).

Embodiment 52. The process as in any one of embodiments 49-51 wherein the pressure applied to the yttrium oxide while heating is from 10 MPa to 40 MPa.

Embodiment 53. The process as in any one of embodiments 49-52 wherein the pressure applied to the yttrium oxide while heating is from 20 MPa to 40 MPa.

Embodiment 54. The process as in any one of embodiments 49-53 wherein the yttrium oxide powder has a surface area of from 1.5 to 7.0 $m^2/g$.

Embodiment 55. The process as in any one of embodiments 49-54 wherein the yttrium oxide powder has a surface area of from 2.0 to 4.0 $m^2/g$.

Embodiment 56. The process as in any one of embodiments 49-55 wherein the purity of the yttrium oxide powder is higher than 99.998%.

Embodiment 57. The process as in any one of embodiments 49-56 wherein the purity of the yttrium oxide powder is higher than 99.999%.

Embodiment 58. The process as in any one of embodiments 49-57 wherein the sintered yttrium oxide body has a purity of between 99.99 and 99.999%.

Embodiment 59. The process as in any one of embodiments 49-58 wherein the sintered yttrium oxide body has a purity of between 99.999 and 99.9996%.

Embodiment 60. The process as in any one of embodiments 49-59 wherein the sintering is performed for a time of from 1 minute to 120 minutes.

Embodiment 61. The process as in any one of embodiments 49-60 wherein the sintering is performed for a time of from 2 minutes to 60 minutes.

Embodiment 62. The process as in any one of embodiments 49-61 wherein the sintered yttrium oxide body has a density of not less than 4.96 $g/cm^3$.

Embodiment 63. The process as in any one of embodiments 49-62 wherein the sintered yttrium oxide body has a density of not less than 4.98 $g/cm^3$.

Embodiment 64. The process as in any one of embodiments 49-63 wherein the sintered yttrium oxide body has a density of not less than 5.01 $g/cm^3$.

Embodiment 65. The process as in any one of embodiments 49-64 wherein no pore on the at least one surface is larger than 4 μm in diameter.

Embodiment 66. The process as in any one of embodiments 49-65 wherein no pore on the at least one surface is larger than 3 μm in diameter.

Embodiment 67. The process as in any one of embodiments 49-66 wherein no pore on the at least one surface is larger than 2 μm in diameter.

Embodiment 68. The process as in any one of embodiments 49-67 wherein no pore on the at least one surface is larger than 1 μm in diameter.

Embodiment 69. The process as in any one of embodiments 49-68 wherein the total impurity level of the sintered yttrium oxide body is 35 ppm or less.

Embodiment 70. The process as in any one of embodiments 49-69 wherein the total impurity level of the sintered yttrium oxide body is 30 ppm or less.

Embodiment 71. The process as in any one of embodiments 49-70 wherein the total impurity level of the sintered yttrium oxide body is 25 ppm or less.

Embodiment 72. The process as in any one of embodiments 49-71 wherein the total impurity level of the sintered yttrium oxide body is 20 ppm or less.

Embodiment 73. The process as in any one of embodiments 49-72 wherein the total impurity level of the sintered yttrium oxide body is 15 ppm or less.

Embodiment 74. The process as in any one of embodiments 49-73 wherein the total impurity level of the sintered yttrium oxide body is 10 ppm or less.

Embodiment 75. The process as in any one of embodiments 49-74 wherein the total impurity level of the sintered yttrium oxide body is 6 ppm or less.

Embodiment 76. The process as in any one of embodiments 49-75 wherein the sintered yttrium oxide body exhibits an etch volume of less than about 375,000 $\mu m^3$ in a process wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step is 24 hours.

Embodiment 77. The process as in any one of embodiments 49-76 wherein the sintered yttrium oxide body exhibits an etch volume of less than about 325,000 $\mu m^3$.

Embodiment 78. The process as in any one of embodiments 49-77 wherein the sintered yttrium oxide body exhibits an etch volume of less than about 275,000 $\mu m^3$.

Embodiment 79. The process of as in any one of embodiments 49-78 wherein the sintered yttrium oxide body has a pore size distribution with a maximum pore size of 1.50 μm for 95% or more of all pores on the at least one surface.

Embodiment 80. The process as in any one of embodiments 49-79 wherein the sintered yttrium oxide body has a pore size distribution with a maximum pore size of 1.75 μm for 97% or more of all pores on the at least one surface.

Embodiment 81. The process as in any one of embodiments 49-80 wherein the sintered yttrium oxide body has a pore size distribution with a maximum pore size of 2.00 μm for 99% or more of all pores on the at least one surface.

Embodiment 82. The process as in any one of embodiments 49-81 wherein the sintered yttrium oxide body exhibits an etch rate of less than 1.0 nm/min in a process wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step is 24 hours.

Embodiment 83. The process as in any one of embodiments 49-82 wherein the etch rate is less than 0.9 nm/min.

Embodiment 84. The process as in any one of embodiments 49-83 wherein the etch rate is less than 0.8 nm/min.

Embodiment 85. The process as in any one of embodiments 49-84 wherein the sintered yttrium oxide body exhibits a developed interfacial area, Sdr, as determined by ISO Standard 25178-2-2012, section 4.3.2, in an unetched area of less than $250\times10^{-5}$.

Embodiment 86. The process as in any one of embodiments 49-85 wherein the developed interfacial area in the unetched area is less than $225\times10^{-5}$.

Embodiment 87. The process as in any one of embodiments 49-86 wherein the developed interfacial area in the unetched area is less than $200\times10^{-5}$.

Embodiment 88. The process as in any one of embodiments 49-87 wherein the sintered yttrium oxide body exhibits a developed interfacial area as determined by ISO Standard 25178-2-2012, section 4.3.2, in an etched area of less than $200\times10^{-5}$ in a process wherein a 6 mm×6 mm area of the at least one surface is subjected to etching conditions at pressure of 10 millitorr with a $CF_4$ flow rate of 90 sccm, an oxygen flow rate of 30 sccm, an argon flow rate of 20 sccm, and a bias of 600 volts and 2000 Watt ICP power.

Embodiment 89. The process as in any one of embodiments 49-88 wherein the developed interfacial area in the etched area is less than $175\times10^{-5}$.

Embodiment 90. The process as in any one of embodiments 49-89 wherein the developed interfacial area in the etched area is less than $150\times10^{-5}$.

Embodiment 91. The process as in any one of embodiments 49-90 wherein the sintered yttrium oxide body exhibits an arithmetical mean height, Sa, of less than 30 nm as determined by ISO Standard 25178-2-2012, section 4.1.7, in a process wherein a 10 mm×5 mm area of the at least one surface is subjected to etching conditions at pressure of 10 millitorr, an argon flow rate of 20 sccm, and a bias of 600 volts and 2000 Watt ICP power, wherein the process has a first step and a second step, wherein the first step has a $CF_4$ flow rate of 90 sccm, an oxygen flow rate of 30 sccm for 300 seconds and the second step has a $CF_4$ flow rate of 0 sccm and an oxygen flow rate of 100 sccm for 300 seconds, wherein steps 1 and 2 are sequentially repeated for a total etch time of 6 hours.

Embodiment 92. The process as in any one of embodiments 49-91 wherein the Sa is less than 20.

Embodiment 93. The process as in any one of embodiments 49-92 wherein the Sa is less than 15.

Embodiment 94. The process as in any one of embodiments 49-93 wherein the at least one surface has an area of which less than 0.15% is occupied by pores.

Embodiment 95. The process as in any one of embodiments 49-94 wherein the at least one surface has an area of which less than 0.10% is occupied by pores.

Embodiment 96. The process as in any one of embodiments 49-95 wherein the sintered yttrium oxide body has a grain size d50 of from 0.1 μm to 25 μm.

Embodiment 97. The process as in any one of embodiments 49-96 wherein the sintered yttrium oxide body has a grain size d50 of from 0.5 μm to 15 μm.

Embodiment 98. The process as in any one of embodiments 49-97 wherein the sintered yttrium oxide body has a grain size d50 of from 0.5 μm to 10 μm.

Embodiment 99. The process as in any one of embodiments 49-98 wherein the sintered yttrium oxide body has at least one dimension of from 100 mm to 600 mm.

Embodiment 100. The process as in any one of embodiments 49-99 wherein the sintered yttrium oxide body has at least one dimension of from 100 mm to 406 mm.

Embodiment 101. The process as in any one of embodiments 49-100 wherein the sintered yttrium oxide body has at least one dimension of from 200 mm to 600 mm.

Embodiment 102. The process as in any one of embodiments 49-101 wherein the sintered yttrium oxide body has at least one dimension of from 350 mm to 600 mm.

Embodiment 103. The process as in any one of embodiments 49-102 wherein the sintered yttrium oxide body has at least one dimension of from 500 mm to 600 mm.

Embodiment 104. The process as in any one of embodiments 49-103 wherein the sintered yttrium oxide body has at least one dimension of from 550 mm to 600 mm.

Embodiment 105. The process as in any one of embodiments 49-104 wherein the density does not vary by more than 3% along the at least one dimension.

Embodiment 106. The process as in any one of embodiments 49-105 wherein the density does not vary by more than 2% along the at least one dimension.

Embodiment 107. The process as in any one of embodiments 49-106 wherein the density does not vary by more than 1% along the at least one dimension.

Embodiment 108. The process as in any one of embodiments 49-107 wherein the sintered yttrium oxide body exhibits a step height change of from 0.27 to 0.28 μm after an $SF_6$ etch process.

Embodiment 109. The process as in any one of embodiments 49 to 108 wherein the inner wall of the die comprises at least one conductive foil.

Embodiment 110. The process of embodiment 109 wherein the at least one conductive foil comprises graphite, niobium, nickel, molybdenum, or platinum.

Embodiment 111. The process of any one of embodiments 109 to 110 wherein the die, upper punch and lower punch comprise at least one graphite material.

Embodiment 112. The process of embodiment 111 wherein the at least one graphite material has a grain size selected from the group consisting of from 1 to 50 um, from 1 to 40 um, from 1 to 30 um, from 1 to 20 um, from 5 to 50 um, from 5 to 40 um, from 5 to 30 um, from 5 to 20 um, from 5 to 15 um, and from 5 to 10 um.

Embodiment 113. The process of any one of embodiments 111 to 112 wherein the at least one graphite material has a density selected from the group consisting of from 1.45 to 2.0 g/cc, from 1.45 to 1.9 g/cc, from 1.45 to 1.8 g/cc, from 1.5 to 2.0 g/cc, from 1.6 to 2.0 g/cc, from 1.7 to 2.0 g/cc, and from 1.7 to 1.9 g/cc.

Embodiment 114. The process of any one of embodiments 110 to 113 wherein the coefficient of thermal expansion of the at least one graphite material varies about the central axis by at least one amount selected from the group consisting of $0.3\times10^{-6}$/° C. and less, $0.2\times10^{-6}$/° C. and less, $0.1\times10^{-6}$/° C. and less, $0.08\times10^{-6}$/° C. and less, and $0.06\times10^{-6}$/° C. and less.

The afore-described embodiments of a sintered yttrium oxide body and process for making the sintered yttrium oxide body can be combined in any way and embodiments may be combined. Thus, the above-mentioned characteristics can be combined to describe the yttrium oxide body and/or process and vice versa as outlined in the description below.

BRIEF DESCRIPTION OF THE DRAWINGS

The developments will be described by way of example in connection with the accompanying drawings wherein features disclosed in connection with the sintered yttrium oxide bodies also apply to the processes and vice versa.

DETAILED DESCRIPTION

Figure 1:
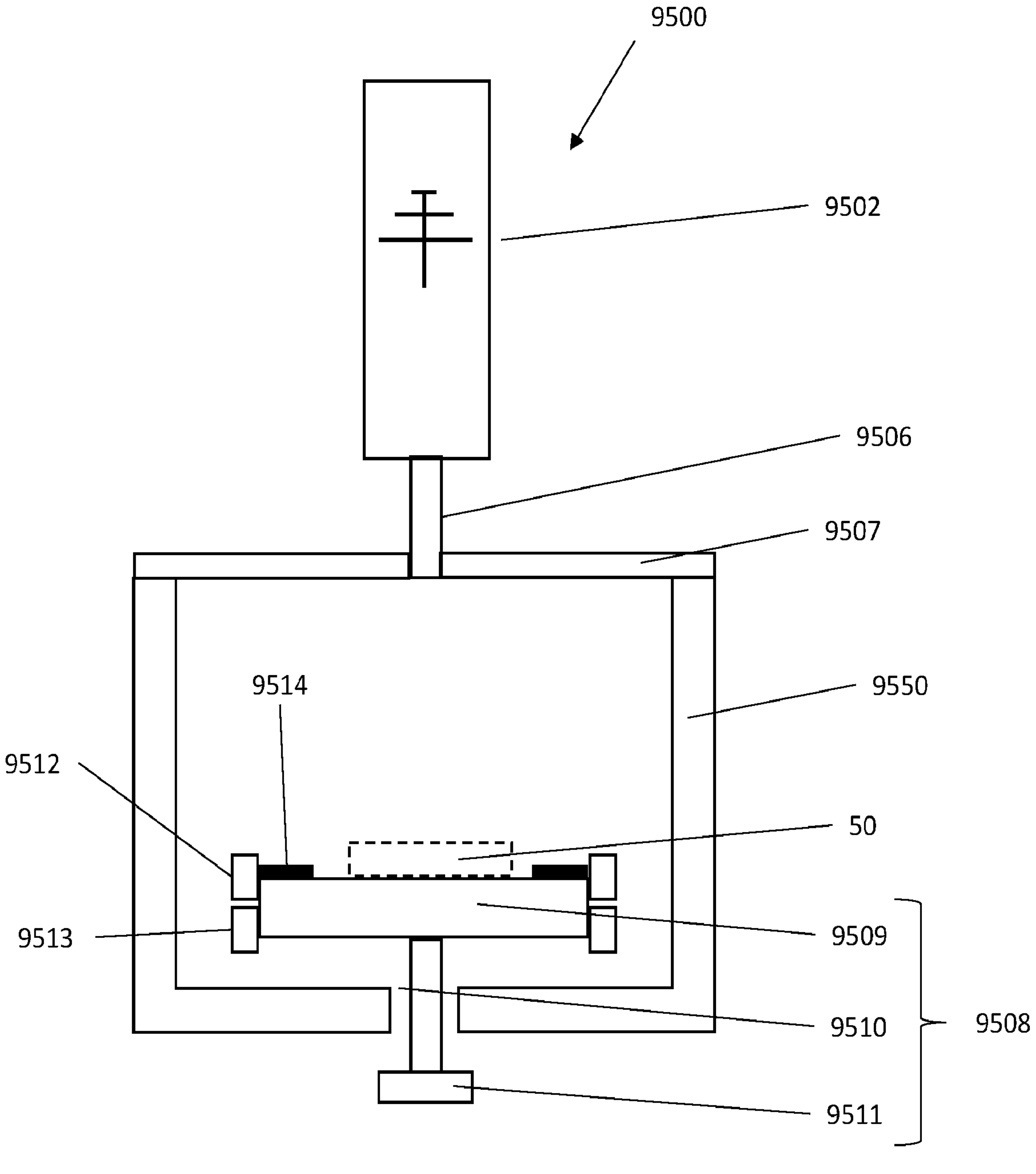
FIG. 1 illustrates a semiconductor processing system according to embodiments of the present technology.

A sintered yttrium oxide body is proposed as material for parts used in plasma etch processing chambers that is prepared by a sintering process as disclosed herein. Such parts may include windows, nozzles, shower heads, (etch) chamber liners, mixing manifolds, wafer supports, electronic wafer chucks, and various rings such as focus rings and protective rings, among other components.

Reference will now be made in detail to specific embodiments. Examples of the specific embodiments are illustrated in the accompanying drawings. While the disclosure will be described in conjunction with these specific implementations, it will be understood that it is not intended to limit the disclosure to such specific embodiments. On the contrary, it is intended to cover alternatives, modifications, and equivalents as may be included within the spirit and scope as defined by the appended claims. In the following description, numerous specific details are set forth in order to provide a thorough understanding of the disclosed embodiments. The disclosure may be practiced without some or all of these specific details.

Definitions

As used herein, the terms "semiconductor wafer," "wafer," "substrate," and "wafer substrate," are used interchangeably. A wafer or substrate used in the semiconductor device industry typically has a diameter of, for example, 200 mm, or 300 mm, or 450 mm.

As used herein, the term "sintered yttrium oxide body" is synonymous with "sinter", "body" or "sintered body" or "ceramic sintered body" and refers to a solid article comprising yttrium oxide and formed upon being subjected to a pressure and heat treatment process which creates a monolithic sintered yttrium oxide body from yttrium oxide powder as is disclosed herein.

As used herein, the term "purity" refers to the presence of various contaminants typically considered to be detrimental in application in the starting materials from which a sintered yttrium oxide body may be formed, as disclosed herein.

As used herein, the term "impurity" refers to those elements, compounds, or other substances present in the starting materials or during processing, from which a sintered yttrium oxide body may be formed, typically considered to be detrimental in application. Impurity contents are measured relative to the total mass of the yttria powders or the sintered yttria body.

As used herein, the term "tool set" is one that may comprise a die and upper and lower punches.

As used herein, the terms "stiffness" and "rigidity" are synonymous and consistent with the definition of Young's modulus, as known to those skilled in the art.

The term "calcination" or "calcining" when used as relates to heat treatment processes is understood herein to mean heat treatment steps which may be conducted on a powder in air at a temperature less than a sintering temperature to remove moisture and/or impurities, increase crystallinity and in some instances modify powder mixture surface area.

The term "annealing" when applied to heat treatment of ceramics is understood herein to mean a heat treatment conducted on the disclosed sintered yttrium oxide bodies in air to a temperature and allowed to cool slowly to relieve stress and/or normalize stoichiometry.

The term "Sa" as known in the art relates to the arithmetical mean height of a surface and represents the absolute value of the arithmetical mean across the surface. The definition according to ISO 25178-2-2012 section 4.1.7 is the arithmetic mean of the absolute of the ordinate values within a definition area (A).

The term "Sdr" as known in the art refers to a calculated numerical value defined as the "developed interfacial area ratio" and is a proportional expression for an increase in actual surface area beyond that of a completely flat surface. The definition according to ISO 25178-2-2012 section 4.3.2 is the ratio of the increment of the interfacial area of the scale-limited surface within the definition area (A) over the definition area.

As used here, the term "about" as it is used in connection with numbers allows for a variance of plus or minus 10%.

In the following description, given ranges include the lower and upper threshold values. Accordingly, a definition in the sense of "in the range of X and Y" or "in the range between X and Y" of a parameter A means that A can be any value of X, Y and any value between X and Y. Definitions in the sense of "up to Y" or "at least X" of a parameter A means, that accordingly A may be any value less than Y and Y, or A may be X and any value greater than X, respectively.

Sintered Yttrium Oxide Body

The following detailed description assumes the invention is implemented within equipment such as etch or deposition chambers necessary as part of the making of a semiconductor wafer substrate. However, the invention is not so limited. The work piece may be of various shapes, sizes, and materials. In addition to semiconductor wafer processing, other work pieces that may take advantage of this invention include various articles such as fine feature size inorganic circuit boards, magnetic recording media, magnetic recording sensors, mirrors, optical elements, micro-mechanical devices and the like.

Semiconductor processing reactors as relates to etch or deposition processes require chamber components fabricated from materials having high resistance to chemical corrosion by reactive plasmas necessary for semiconductor processing. These plasmas or process gases may be comprised of various halogen, oxygen and nitrogen-based chemistries such as $O_2$, F, $Cl_2$, HBr, $BCl_3$, $CCl_4$, $N_2$, $NF_3$, NO, $N_2O$, $C_2H_4$, $CF_4$, $SF_6$, $C_4F_8$, $CHF_3$, $CH_2F_2$. Use of the corrosion resistant materials as disclosed herein provides for reduced chemical corrosion during use.

Figure 2:
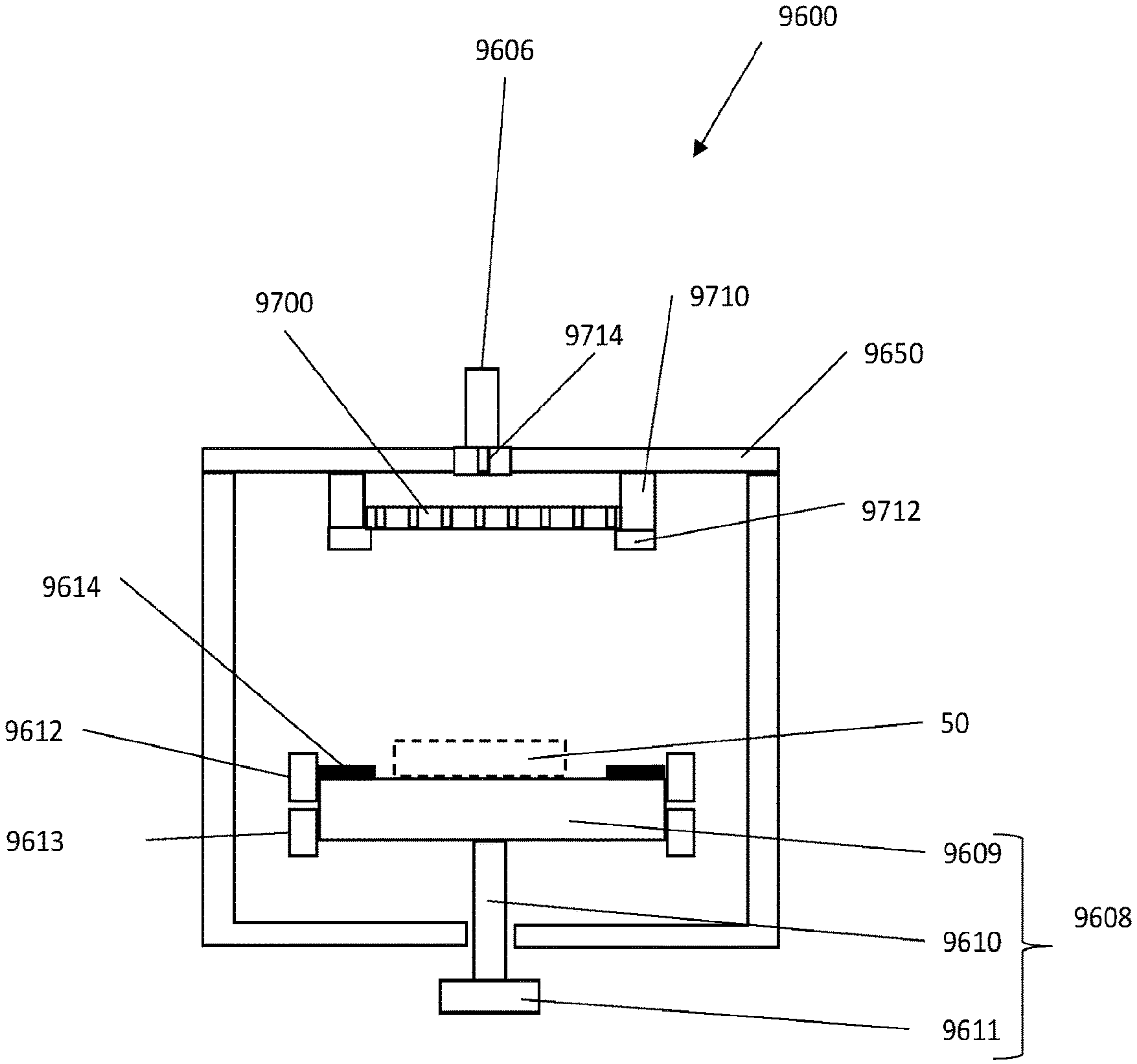
FIG. 2 illustrates another embodiment of a semiconductor processing system according to embodiments of the present technology.

FIG. 1 and FIG. 2 illustrate etch/deposition chambers in which sintered yttrium oxide bodies disclosed herein are useful. As shown in FIG. 1, embodiments of the present technology may include a semiconductor processing system 9500, also denoted as processing system. Processing system 9500 may include a remote plasma region. The remote plasma region may include a plasma source 9502, which is also denoted as remote plasma source ("RAS").

Processing system 9500, which may represent a capacitively coupled plasma (CCP) processing apparatus, comprises a vacuum chamber 9550, a vacuum source, and a chuck 9508 on which a wafer 50, also denoted as semiconductor substrate, is supported. A window 9507 forms an upper wall of the vacuum chamber 9550. The window 9507 may be made of a sintered yttrium oxide body according to according to one of the preceding embodiments. In some embodiments, the window 9507 may be partially made of a sintered yttrium oxide body according to one of the preceding embodiments. 9506 may be a gas inlet, gas inlet assembly gas delivery system injector or nozzle may be made of the sintered yttrium oxide body. Gas injector 9506 may comprise a separate member of the same or different material as the window.

The plasma source 9502 is provided outside of the window 9507 of the vacuum chamber 9550 for accommodating the wafer 50 to be processed. In the vacuum chamber 9550, a capacitively coupled plasma may be generated by supplying a processing gas to the vacuum chamber 9550 and a high frequency power to the plasma source 9502. By using the capacitively coupled plasma thus generated, a predetermined plasma processing is performed on the wafer 50. A planar antenna having a predetermined pattern is widely used for the high frequency antenna of the capacitively coupled processing system 9500.

Processing system 9500 may further include an electrostatic chuck 9508 that is designed to carry a wafer 50. The chuck 9508 may comprise a puck 9509, for supporting the wafer 50. The puck 9509 may have a chucking electrode disposed within the puck proximate a support surface of the puck 9509 to electrostatically retain the wafer 50 when disposed on the puck 9509. The chuck 9508 may comprise a base 9511 having a ring-like extending to support the puck 9509; and a shaft 9510 disposed between the base and the puck to support the puck above the base such that a space is formed between the puck 9509 and the base 9510, wherein the shaft 9510 supports the puck proximate a peripheral edge of the puck 9509. The puck 9509 may be made of a sintered yttrium oxide body according to according to one of the preceding embodiments, to minimize the generation particle that may contaminate the wafer.

In physical vapor deposition (PVD) processes, a substrate ring comprising a cover ring 9514 is provided about the periphery of the substrate. The cover ring 9514 typically surrounds the wafer and has a lip or ledge that rests on the wafer supporting surface of the puck 9509. The cover ring 9514 shields the sidewall surfaces and peripheral edge of the puck 9509 that would otherwise be exposed to the energized gas in the chamber, from deposition of process residues. Therefore, the cover ring 9514 reduces the accumulation of process residues on the puck 9509. Such accumulation of process residues would eventually flake off and contaminate the wafer. The cover ring 9514 may be made of a sintered yttrium oxide body according to according to one of the preceding embodiments.

The cover ring 9514 can also reduce erosion of the puck 9509 by the energized gas. Providing a cover ring 9514 also lowers the frequency with which the chuck and/or the puck 9509 requires cleaning, because cover ring itself can be periodically removed from the chamber and cleaned, for example, with HF and $HNO_3$, to remove process residues that accumulate on the ring during substrate process cycles. The arrangement of a cover ring 9514 can be seen in FIG. 1, where it covers parts of the supporting surface of the puck 9509. Further parts of the surface of the puck 9509 may be covered with a top shield ring 9512 and/or a shield ring 9513. To have suitably high erosion and corrosion resistance, the top shield ring 9512 and/or the shield ring 9513 may be made of a sintered yttrium oxide body according to according to one of the preceding embodiments.

As shown in FIG. 2, another embodiment of the present technology may include a semiconductor processing system 9600. Processing system 9600, which may represent an inductively coupled plasma (ICP) processing apparatus, comprises a vacuum chamber 9650, a vacuum source, and a chuck 9608 on which a wafer 50, also denoted as semiconductor substrate, is supported. A showerhead 9700 forms an upper wall or is mounted beneath an upper wall of the vacuum chamber 9650. The ceramic showerhead 9700 includes a gas plenum in fluid communication with a plurality of showerhead gas outlets for supplying process gas to the interior of the vacuum chamber 9650. Furthermore, the showerhead 9700 may comprise a central opening configured to receive a central gas injector. An RF energy source energizes the process gas into a plasma state to process the semiconductor substrate. The flow rate of the process gas supplied by the central gas injector and the flow rate of the process gas supplied by the ceramic showerhead 9700 can be independently controlled. The processing system 9600 may comprise a showerhead 9700 which may be made of a sintered yttrium oxide body according to according to one of the preceding embodiments. The showerhead 9700 may be in fluid communication with a gas delivery system 9606. Gas delivery system 9606 may be made of the sintered yttrium oxide body and may have an injector or nozzle 9714 made of the sintered yttrium oxide body.

System 9600 may further include a chuck 9608 that is designed to carry a wafer 50. The chuck 9608 may comprise a puck 9609, for supporting the wafer 50. The puck 9609 may be formed from a dielectric material and may have a chucking electrode disposed within the puck proximate a support surface of the puck 9609 to electrostatically retain the wafer 50 when disposed on the puck 9609. The chuck 9608 may comprise a base 9611 having a ring-like extending to support the puck 9609; and a shaft 9610 disposed between the base and the puck to support the puck above the base such that a space is formed between the puck 9609 and the base 9610, wherein the shaft 9610 supports the puck proximate a peripheral edge of the puck 9609. The puck 9609 may be made of a sintered yttrium oxide body according to according to one of the preceding embodiments, to minimize the generation particle that may contaminate the wafer.

Parts of the surface of the showerhead 9700 may be covered with a shield ring 9712. Parts of the surface of the showerhead 9700, especially radial sides of the surface of the showerhead 9700 may be covered with a top shield ring 9710. Parts of the supporting surface of the puck 9609 may be covered with a cover ring 9614. Further parts of the surface of the puck 9609 may be covered with a top shield ring 9612 and/or an insulator ring 9613. To have suitably high erosion and corrosion resistance, the cover ring 9614 and/or the top shield ring 9612 and/or the insulator ring 9613 may be made of a sintered yttrium oxide body according to according to one of the preceding embodiments.

The showerhead 9700 may comprise two parallel plates, both of which may comprise or consist of a sintered yttrium oxide body according to one of the herein disclosed embodiments. The two plates may be coupled with one another to define a volume between the plates. The coupling of the plates may be so as to provide fluid channels through the upper and lower plates. The showerhead may distribute via said fluid channels process gases which contain plasma effluents upon excitation by a plasma in chamber plasma region or from a plasma source. An ion suppressor (not shown) may be positioned proximate a surface of second plate and may be coupled with surface of second plate. The ion suppressor may comprise or consist of a sintered yttrium oxide body according to one of the herein disclosed embodiments. Ion suppressor may be configured to reduce ionic migration into a processing region of the processing chamber housing a wafer. Ion suppressor may define a plurality of apertures through the structure.

The sintered yttrium oxide bodies as disclosed herein may be useful as sintered ceramic components in plasma processing chambers designed for either semiconductor etch and/or deposition processes.

Providing a chamber component material such as, for example, a yttria ceramic sintered body having a very high purity provides a uniformly corrosion resistant body low in impurities which may serve as a site for initiation of corrosion. High resistance to erosion or spalling is also required of materials for use as chamber components. Erosion, however, as described above, may result from ion bombardment of component surfaces through use of inert plasma gases such as Ar. Further, components fabricated from highly dense materials having minimal porosity distributed at a fine scale may provide greater resistance to corrosion and erosion during etch and deposition processes. As a result, preferred chamber components may be those fabricated from materials having high erosion and corrosion resistance during plasma etching, deposition and chamber cleaning processes. This resistance to corrosion and erosion prevents the release of particles from the component surfaces into the etch or deposition chambers during semiconductor processing. Such particle release or shedding into the process chamber contributes to wafer contamination, semiconductor process drift and semiconductor device level yield loss.

Additionally, chamber components must possess enough flexural strength and rigidity for handleability as required for component installation, removal, cleaning and during use within process chambers. High mechanical strength allows for machining intricate features of fine geometries into the ceramic sintered body without breakage, cracking or chipping. Flexural strength or rigidity becomes particularly important at large component sizes used in state-of-the-art process tools. In some component applications such as a chamber window of diameter on the order of 200 to 600 mm, significant stress is placed upon the window during use under vacuum conditions, necessitating selection of corrosion resistant materials of high strength and rigidity.

The ceramic sintered body and related components as disclosed herein provide improved plasma etch resistance and enhanced ability to be cleaned within semiconductor processing chambers by way of specific material properties and features to be described following.

Disclosed is a sintered yttrium oxide body having a total impurity level of 40 ppm or less, a density of not less than 4.93 $g/cm^3$, wherein the sintered yttrium oxide body has at least one surface comprising at least one pore, wherein no pore is larger than 5 μm in diameter. The sintered yttrium oxide body disclosed herein is provided by applying specific preparation procedures and several specific process parameters in a Spark Plasma Sintering (SPS) process as will be described in more detail herein below.

The sintered yttrium oxide body made by the method disclosed herein has a total impurity level of 40 ppm or less. In one embodiment, the sintered yttrium oxide body has a total impurity level of 35 ppm or less. In another embodiment, the sintered yttrium oxide body has a total impurity level of 30 ppm or less. In another embodiment, the sintered yttrium oxide body has a total impurity level of 25 ppm or less. In yet another embodiment, the sintered yttrium oxide body has a total impurity level of 20 ppm or less. In yet another embodiment, the sintered yttrium oxide body has a total impurity level of 15 ppm or less. In yet another embodiment, the sintered yttrium oxide body has a total impurity level of 10 ppm or less. In still another embodiment, the sintered yttrium oxide body has a total impurity level of 5 ppm or less. In still another embodiment, the sintered yttrium oxide body has a total impurity level of 0 ppm. As used herein, the term "impurity" refers to any element or compound that is other than yttrium oxide. Exemplary impurities include, but are not limited to, silicon, calcium, sodium, strontium, zirconia, magnesium, potassium, iron, phosphorus, boron and low melting temperature elements such as zinc, tin and indium. Thus, in embodiments, the sintered yttrium oxide body is substantially free of or free of at least one of or all of these impurities.

The sintered yttrium oxide body disclosed herein has a density of not less than 4.93 $g/cm^3$, which is 98% of the theoretical density. According to D. R. Lide, CRC Handbook of Chemistry and Physics 84$^{th}$ Edition, 2012 ("the CRC Handbook"), the theoretical density of yttrium oxide is 5.03 $g/cm^3$. A sintered yttrium oxide body made according to the present disclosure has a density of not less than 98%, preferably, not less than 98.5%, more preferably not less than 99%, still more preferably not less than 99.5%, still more preferably not less than 100% of the theoretical density of yttrium oxide as stated in the CRC Handbook. Thus, in other words, a sintered yttrium oxide body disclosed herein has a density of not less than 4.93 g/$cm^3$ (not less than 98% of the theoretical value). In some embodiments, the sintered yttrium oxide body disclosed herein has a density of not less than 4.96 g/$cm^3$ (not less than 98.5% of the theoretical value). In other embodiments, the sintered yttrium oxide body disclosed herein has a density of not less than 4.98 g/$cm^3$ (not less than 99% of the theoretical value). In still other embodiments, the sintered yttrium oxide body disclosed herein has a density of not less than 5.01 g/$cm^3$ (not less than 99.5% of the theoretical value). Deviation of density measurements was measured and found to be 0.002 g/$cm^3$ thus measurements may vary accordingly. Density measurements were performed using the Archimedes method as is known to those skilled in the art. Thus, the sintered yttrium oxide body disclosed herein does not include mixtures of yttrium oxide with other oxides such as, for example, zirconium oxide or aluminum oxide; rather, the sintered yttrium oxide body disclosed herein consists essentially of or consists of yttrium oxide consistent with the potential impurity levels described above. Prior art solutions require combining yttrium oxide with other materials to enhance flexural strength as required for application to large scale semiconductor processing systems. The combination of the process and materials as disclosed provides for a greater than 98% theoretical density sintered body of high purity. Successful fabrication of sintered yttrium oxide bodies across a longest (greater than about 200 to 600 mm) dimension may also be enabled by controlling variation in density across at least one, longest dimension. Densities less than 98% also may have higher variations in density and reduced strength and handleability, thus a density of at least 98% is desirable with a variation in density of less than 3% across at least one dimension which may be a longest dimension. The solid yttrium oxide body as disclosed was tested using 4-point bend techniques in accordance with ASTM C1161-13, and an average flexural strength of 224 MPa with a standard deviation of 14 MPa was measured.

Mechanical strength properties are known to improve with decreasing grain size. In order to assess grain size, linear intercept grain size measurements were performed in accordance with the Heyn Linear Intercept Procedure described in ASTM standard E112-2010 "Standard Test Method for Determining Average Grain Size." Grain size measurements were also performed using electron backscattering diffraction (EBSD) techniques as known in the art. To meet the requirements of high flexural strength and rigidity for use in reactor chambers as large components of from 100 to 600 mm, the ceramic sintered body may have a fine grain size of, for example, a grain size d50 of from 0.1 μm to 25 μm, in some embodiments from 1 μm to 20 μm, in other embodiments from 0.5 μm to 20 μm, in other embodiments from 0.5 μm to 15 μm, in yet other embodiments from 0.5 μm to 10 μm, in other embodiments from 0.75 to 5 um, in other embodiments 2 μm and less, in other embodiments 1.5 μm and less, and in yet further embodiments 1.0 μm and less. These grain sizes may result in a sintered yttrium oxide body having a 4-point bend flexural strength according to ASTM C1161-13 of 250 MPa and less, 300 MPa and less, preferably 350 MPa and less, preferably at least 400 MPa and less. Grain sizes too large in diameter, on the order of greater than 25 um, may result in sintered bodies having low flexural strength values which may make them unsuitable for use as etch and/or deposition chamber components in particular of large dimension, thus it is preferable for the sintered yttrium oxide body to have an average grain size of preferably less than 13 um (i.e., from 0.01 μm to 13 μm).

The sintered yttrium oxide body disclosed herein has very small pores both on the surface and throughout the body. Preferably, the sintered yttrium oxide body consists solely of yttrium oxide made according to the process disclosed herein is, thus, an integral body having pores throughout the body. In other words, the porous structure measured on a surface may be representative of porosity levels within the bulk yttrium oxide body as will be detailed below in greater detail.

The sintered yttrium oxide body disclosed herein has at least one surface comprising at least one pore, wherein no pore is larger than 5 μm in diameter. In one embodiment, no pore is larger than 4.0 μm in diameter. In one embodiment, no pore is larger than 3 μm in diameter. In another embodiment, no pore is larger than 2 μm in diameter. In yet another embodiment, no pore is larger than 1.5 μm in diameter. In still another embodiment, no pore is larger than 1 μm in diameter. Pore size can be measured by, e.g., a scanning electron microscope (SEM).

The yttrium oxide body is further characterized by having a pore size distribution with a maximum pore size of 1.50 μm for 95% or more of all pores on the at least one surface of the sintered yttrium oxide body, preferably with a maximum pore size of 1.75 μm for 97% or more, more preferably with a maximum pore size of 2.00 μm for 99% or more of all pores on the at least one surface of the sintered yttrium oxide body. Pore size distribution and overall porosity was determined by porosity measurements across a range of 5 mm×5 mm polished samples through use of SEM images obtained from a Phenom XL scanning electron microscope. Representative SEM images were taken from the left, right, top and bottom regions of the samples to gather information on material uniformity across the entire sample area. Four images at 1000× having image dimension of 269 um×269 um and four images at 5000× having image dimension of 53.7 um×53.7 um were analyzed to determine the number of pores, fractional area of porosity and pore diameter across the total image measurement area. The total image measurement area across which porosity was measured was 0.301 $mm^2$. Images were imported into ImageJ Software for porosity analysis using contrast techniques. ImageJ has been developed at the National Institute of Health (NIH), USA, and is a Java-based public domain image processing and analysis program for image processing of scientific multidimensional images.

Preferably, the at least one pore occupies less than 0.2%, more preferably less than 0.15%, and most preferably less than 0.1%, of the surface area of the at least one surface of the sintered yttrium oxide body as determined by the method disclosed herein.

Sintered yttrium oxide bodies prepared according to the present development preferably exhibit a step height of from 0.2 to 0.98 μm for a two-step $CF_4/O_2$ etch process as disclosed herein, from 0.27 to 0.28 μm for an $SF_6$ etch process as disclosed herein, and from 0.1 to 0.13 μm for an $O_2$ etch process as disclosed herein. The step height as a result of etch processing can be directly measured by using the Keyence 3D Laser Scanning Confocal Digital Microscope Model VK-X250X at a magnification of 20×. Selected areas in etched and unetched regions of a sample are used to create separate reference planes. The average height difference across three measurements between these reference planes are taken as the step height.

The sintered yttrium oxide body disclosed herein exhibits a calculated $CF_4/O_2$ etch volume of less than about 375,000 $\mu m^3$, preferably less than about 325,000 $\mu m^3$, more preferably less than about 275,000 $\mu m^3$, more preferably less than about 175,000 $\mu m^3$.

The disclosed etch volume, etch rate and step height are measured according to a two-step etch process wherein the process is performed on a 10 mm×5 mm area of the at least one surface which is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm and oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step reaches 24 hours. The etch volume as a result of etch processing can be calculated by using the Keyence 3D Laser Scanning Confocal Digital Microscope Model VK-X250X at a magnification of 20×. Selected areas defined in an etched region of a sample are compared to height of a reference plane and the volume defined by the selected area between the height of the reference plane and the etched surface is the calculated etch volume. Thereby, the calculated etch volume relates to the volume of the yttrium oxide body being removed during the etch process.

The sintered yttrium oxide body disclosed herein exhibits a calculated etch rate of less than about 1.0 nm/min, preferably less than about 0.90 nm/min, more preferably less than about 0.8 nm/min, more preferably less than about 0.7 nm/min, more preferably less than about 0.6 nm/min, more preferably less than about 0.5 nm/min, more preferably less than about 0.4 nm/min, more preferably less than about 0.3 nm/min. This etch rate is measured wherein a two step etch process is performed wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 1500 seconds, and the second step has a $CF_4$ flow rate of 0 sccm and oxygen flow rate of 100 sccm for 300 seconds, wherein the first and second steps are repeated sequentially until the time of $CF_4$ exposure in the first step is 24 hours. The etch rate is calculated from the measured step height and the etch time. Thereby, the etch rate relates to the thickness reduction of the yttrium oxide body being removed during the indicated etch process.

The sintered yttrium oxide body disclosed herein is further characterized by having a developed interfacial area ratio, Sdr, in an unetched area of less than $250\times10^{-5}$, more preferably less than $225\times10^{-5}$, most preferably less than $200\times10^{-5}$, according to ISO standard 25178-2-2012, section 4.3.2. Typically, the surfaced is polished prior to determination of the developed interfacial area ratio in an unetched area.

The sintered yttrium oxide body disclosed herein is further characterized by having a developed interfacial area ratio, Sdr, in an etched area of less than $1500\times10^{-5}$, more preferably less than $1300\times10^{-5}$, more preferably less than $1000\times10^{-5}$, more preferably less than $800\times10^{-5}$, and most preferably less than $600\times10^{-5}$, according to ISO standard 25178-2-2012, section 4.3.2. This developed interfacial ratio is determined by a two-step etch process wherein a 10 mm×5 mm area of the at least one surface is subjected to etching conditions at pressure of 10 millitorr, an argon flow rate of 20 sccm, and a bias of 600 volts and 2000 Watt ICP power, wherein the process has a first step and a second step, wherein the first step has a $CF_4$ flow rate of 90 sccm, an oxygen flow rate of 30 sccm for 300 seconds and the second step has a $CF_4$ flow rate of 0 sccm and an oxygen flow rate of 100 sccm for 300 seconds, wherein steps 1 and 2 are repeated sequentially for a total etch time of 6 hours.

The sintered yttrium oxide body disclosed herein is further characterized by having a developed interfacial area ratio, Sdr, in an unetched area of less than $250\times10^{-5}$, more preferably less than $225\times10^{-5}$, most preferably less than $200\times10^{-5}$, according to ISO standard 25178-2-2012, section 4.3.2; and having a developed interfacial area ratio in an etched area of less than $1500\times10^{-5}$, more preferably less than $1300\times10^{-5}$, more preferably less than $1000\times10^{-5}$, more preferably less than $800\times10^{-5}$, and most preferably less than $600\times10^{-5}$, according to ISO standard 25178-2-2012, section 4.3.2. This latter developed interfacial ratio is determined by a two step etch process wherein a 10 mm×5 mm area of the at least one surface is subjected to etching conditions at a pressure of 10 millitorr, an argon flow rate of 20 sccm, a bias of 600 volts and 2000 Watt ICP power, wherein the process has a first step and a second step wherein the first step has a $CF_4$ flow rate of 90 sccm, oxygen flow rate of 30 sccm for 300 seconds, and the second step has a $CF_4$ flow rate of 0 sccm and oxygen flow rate of 100 sccm for 300 seconds, wherein steps 1 and 2 are sequentially repeated for a total etch time of 6 hours.

The sintered yttrium oxide body disclosed herein is further characterized by having an arithmetical mean height Sa in an unetched area of less than 10 nm, more preferably less than 8 nm, and most preferably less than 5 nm, according to ISO standard 25178-2-2012, section 4.1.7. Typically, the surface is polished prior to determination of the arithmetical mean height in an unetched area.

The sintered yttrium oxide body disclosed herein is further characterized as exhibiting an arithmetical mean height Sa of less than 20 nm, more preferably less than 16 nm, and most preferably less than 12 nm, according to ISO standard 25178-2-2012, section 4.1.7. This arithmetical mean height Sa is measured after a two-step etch process wherein a 10 mm×5 mm area of the at least one surface is subjected to etching conditions at pressure of 10 millitorr, an argon flow rate of 20 sccm, and a bias of 600 volts and 2000 Watt ICP power, wherein the process has a first step and a second step, wherein the first step has a $CF_4$ flow rate of 90 sccm, an oxygen flow rate of 30 sccm for 300 seconds and the second step has a $CF_4$ flow rate of 0 sccm and an oxygen flow rate of 100 sccm for 300 seconds, wherein steps 1 and 2 are sequentially repeated for a total etch time of 6 hours.

In another embodiment, the sintered yttrium oxide body exhibits an arithmetical mean height Sa of less than 10 nm, more preferably less than 8 nm, and most preferably less than 5 nm, according to ISO standard 25178-2-2012, section 4.1.7; and with an arithmetical mean height Sa of less than 20 nm, more preferably loss than 16 nm, and most preferably less than 12 nm, according to ISO standard 25178-2-2012, section 4.1.7. The latter arithmetical mean height Sa is achieved wherein a sample of the sintered yttrium oxide body having an area of 10 mm×5 mm of the at least one surface is subjected to two step etching conditions at pressure of 10 millitorr, an argon flow rate of 20 sccm, and a bias of 600 volts and 2000 Watt ICP power, wherein the process has a first step and a second step, wherein the first step has a $CF_4$ flow rate of 90 sccm, an oxygen flow rate of 30 sccm for 300 seconds and the second step has a $CF_4$ flow rate of 0 sccm and an oxygen flow rate of 100 sccm for 300 seconds, wherein steps 1 and 2 are sequentially repeated for a total etch time of 6 hours.

The above-described sintered yttrium oxide body exhibits an improved behaviour in etch process and can easily be used as materials for the preparation of components of etch chambers. The yttrium oxide materials, which are typically coatings made of yttrium oxide, used for etch chamber components until today suffer, as already mentioned above, from the main problem that under harsh etching conditions particles are generated which contaminate the products to be processed. The emphasis of the prior art to avoid such contamination and, thus, to avoid the generation of particles under etching conditions is mainly on bulk (percentage) porosity characteristics of the yttrium oxide materials used. The challenges to sinter solid yttrium oxide to sufficiently high densities results in lower strength materials which are unsuitable for semiconductor processing chambers requiring components of large, on the order of greater than 100 mm, dimension.

The sintered yttrium oxide bodies disclosed herein are low in dielectric loss owing at least in part to the high purity of the sintered bodies as listed in Table 9. Dielectric loss may also be affected by grain size and grain size distribution. Fine grain size also may provide reduced dielectric loss, and thereby reduced heating upon use at higher frequencies. Table 13 lists grain sizes of exemplary sintered yttria bodies as disclosed herein. Dielectric losses on the order of from $1\times10^{-4}$ to $5\times10^{-2}$, preferably from $1\times10^{-4}$ to $1\times10^{-2}$, preferably from $1.0\times10^{-2}$ to $5\times10^{-2}$, preferably from $1.5\times10^{-2}$ to $5.0\times10^{-2}$, and more preferably from $1\times10^{-4}$ to $1\times10^{-3}$ may be achieved for the sintered ceramic body comprising high purity, fine grain size yttrium oxide.

According to the characteristics above, the resulting microstructure and surface of the sintered yttrium oxide body after etching is uniform, with less volume of material etched while maintaining a low developed surface area and, thereby, increasing the lifecycle and low particle generation characteristics of the product in etching applications.

The sintered yttrium oxide body disclosed herein is the result of a particular preparation process. Whether a sintered yttrium oxide body exhibits the above characteristics or not can easily be determined by the person skilled in the art by applying the presently disclosed measuring methods which at least partly correspond to standard procedures (ISO standards). Accordingly, the person skilled in the art can directly and positively verify by tests or procedures adequately specified in the present specification or known to the person skilled in the art whether an yttrium oxide material fulfils the claimed characteristics. Carrying out these measurements do not require undue experimentation for the person skilled in the art. The process will now be disclosed in detail.

Apparatus/Spark Plasma Sintering Tool

Disclosed herein is a spark plasma sintering (SPS) tool comprising: a die comprising a sidewall comprising an inner wall and an outer wall, wherein the inner wall has a diameter that defines an inner volume capable of receiving at least one ceramic powder; and an upper punch and a lower punch operably coupled with the die, wherein each of the upper punch and the lower punch have an outer wall defining a diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 100 μm wide and, in some embodiments, from 10 μm to 70 μm wide and the yttrium oxide powder has a specific surface area (SSA) of from 1 to 10 $m^2/g$ as measured according to ASTM C1274.

Figure 3:
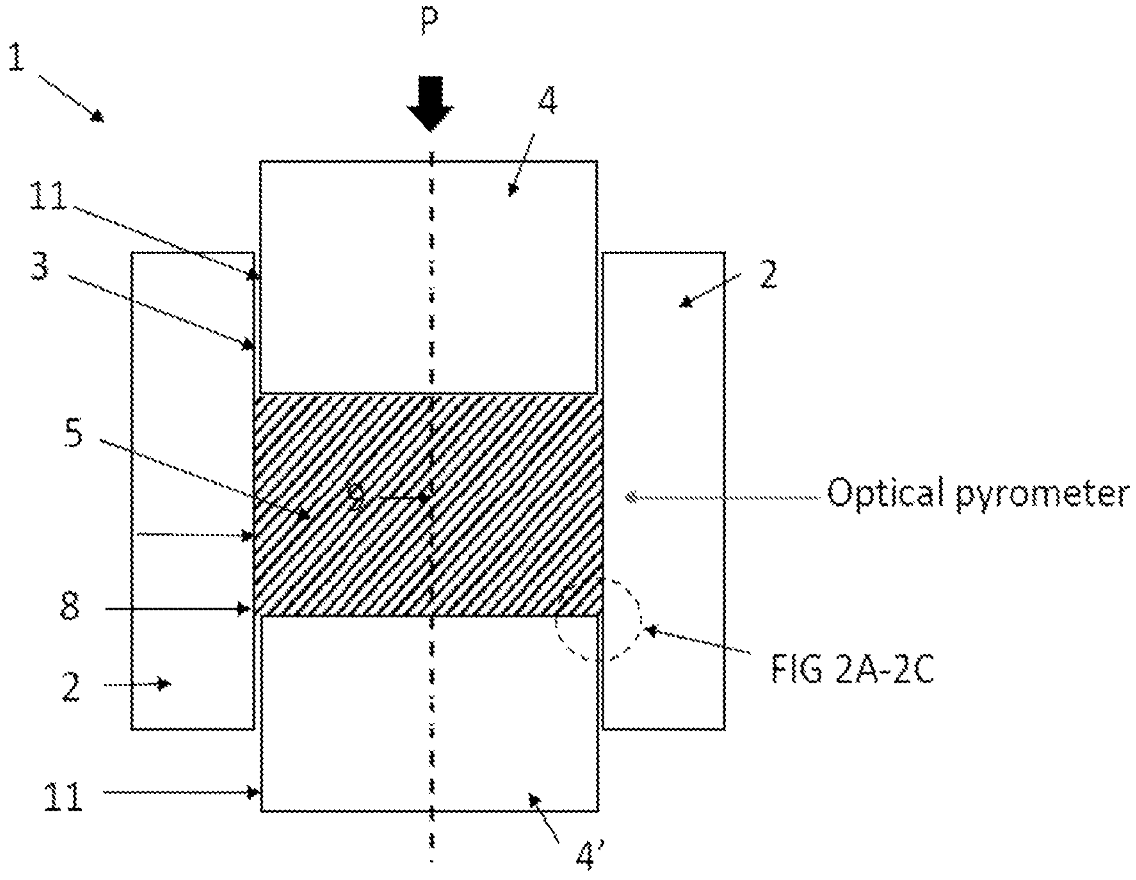
FIG. 3 is a cross-sectional view of a SPS sintering apparatus having a tool set located in a vacuum chamber (not shown) with a simple arrangement used for sintering ceramic materials.

FIG. 3 depicts an SPS tool 1 with a simplified die/punch arrangement used for sintering ceramic powders. Typically, the die/punch arrangement is within a vacuum chamber (not shown) as will be recognized by one of ordinary skill in the art. Referring to FIG. 3, the spark plasma sintering tool 1 comprises a die system 2 comprising a sidewall comprising an inner wall 8 having a diameter that defines an inner volume capable of receiving a yttrium oxide powder 5.

Still referring to FIG. 3, the spark plasma sintering tool 1 comprises an upper punch 4 and a lower punch 4' operably coupled with the die system 2, wherein each of the upper punch 4 and the lower punch 4' have an outer wall 11 defining a diameter that is less than the diameter of the inner wall 8 of the die system 2 thereby creating a gap 3 between each of the upper punch 4 and the lower punch 4' and the inner wall 8 of the die system 2 when at least one of the upper punch 4 and the lower punch 4' are moved within the inner volume of the die system 2.

The die system 2 and upper 4 and lower 4' punches may comprise at least one graphite material. In certain embodiments, the graphite material/s disclosed herein may comprise at least one isotropic graphite material. In other embodiments, the graphite material/s disclosed herein may comprise at least one reinforced graphite material such as for example a carbon-carbon composite, and graphite materials comprising fibers, particles or sheets or mesh or laminates of other electrically conductive materials such as carbon in a matrix of an isotropic graphite material. In other embodiments, the die and upper and lower punches may comprise combinations of these isotropic and reinforced graphite materials.

The graphite materials used for some or all of the parts of the tool such as, for example, die 6 and punches 4 and 4' may comprise porous graphite materials which exhibit a porosity of from about 5% to about 20%, from about 5% to about 17%, from about 5% to about 13%, from about 5% to about 10%, from 5% to about 8%, from about 8% to about 20%, from about 12% to 20%, from about 15% to about 20%, from about 11% to about 20%, from about 5% to 15%, from 6% to about 13%, and preferably from about 7% to about 12%.

Preferably, the graphite material has an average pore size (pore diameter) of from 0.4 to 5.0 μm, preferably from 1.0 to 4.0 μm and comprises pores with a surface pore diameter of up to 30 μm, preferably up to 20 μm, preferably up to 10 μm. More preferably, pores with a surface pore diameter of from 10 to 30 μm may be present.

The graphite materials used for the tool as disclosed herein may have an average grain size of <0.05 mm, preferably <0.04 mm, preferably <0.03 mm, preferably <0.028 mm, preferably <0.025 mm, preferably <0.02 mm, preferably <0.018 mm, preferably <0.015 mm, and preferably <0.010 mm.

The graphite materials used for the tool as disclosed herein may have an average grain size of >0.001 mm, preferably >0.003 mm, preferably >0.006 mm, preferably >0.008 mm, preferably >0.010 mm, preferably >0.012 mm, preferably >0.014 mm, preferably >0.020 mm preferably >0.025 mm, and preferably >0.030 mm.

The graphite materials used for the tool as disclosed herein may have a density of ≥1.45 $g/cm^3$, preferably ≥1.50 g/cm$^3$, preferably ≥1.55 g/cm$^3$, preferably ≥1.60 g/cm$^3$, preferably ≥1.65 g/cm$^3$, preferably ≥1.70 g/cm$^3$, and preferably ≥1.75 g/cm$^3$.

The graphite materials used for the tool as disclosed herein may have a density of ≤2.0 g/cm$^3$, preferably 1.90 g/cm$^3$, preferably ≤1.85 g/cm$^3$, and preferably ≤1.80 g/cm$^3$.

In embodiments, the graphite materials have a coefficient of thermal expansion (CTE) across a temperature range from about 400 to about 2,000° C. (or at least, as illustrated in the figures, to about 1200° C.) of ≥3.3×10$^{-6}$/° C., ≥3.5×10$^{-6}$/° C., ≥3.7×10$^{-6}$/° C., ≥4.0×10$^{-6}$/° C., ≥4.2×10$^{-6}$/° C., ≥4.4×10$^{-6}$/° C., ≥4.6×10$^{-6}$/° C., and ≥4.8×10$^{-6}$/° C.

In embodiments, the graphite materials may have a coefficient of thermal expansion (CTE) across a temperature range from about 400 to about 2,000° C. (or at least, as illustrated in the figures, to about 1200° C.) of ≤7.2×10$^{-6}$/° C., preferably ≤7.0×10$^{-6}$/° C., preferably ≤6.0×10$^{-6}$/° C., preferably ≤5.0×10$^{-6}$/° C., preferably ≤4.8×10$^{-6}$/° C., and preferably ≤4.6×10$^{-6}$/° C.

Table 1 lists properties of exemplary graphite materials as disclosed herein.

TABLE 1

| Property | Range |
|---|---|
| Density (g/cc) | 1.45 to 2.0 |
| Average Grain Size (um) | 1 to <50 |
| Resistivity (Ohm- cm) | 0.001 to 0.003 |
| Flexural Strength (MPa) | 40-160 |
| Compressive Strength (MPa) | 80-260 |
| CTE (×10$^{-6}$/C.) at 400° C. to 1400° C. | 3.3 to 7 |
| Porosity % | 5 to 20 |
| Average Pore Diameter (um) | 0.4 to 5 |
| Thermal K (W/m K) | 40-130 |
| Shore Hardness (HSD) | 55 to 59 |
| Tensile Strength (MPa) | 25 to 30 |
| Elastic Modulus (GPa) | 9 to 11 |
| Impurities/Ash (ppm) | 3 to 500 |

Figure 4A:
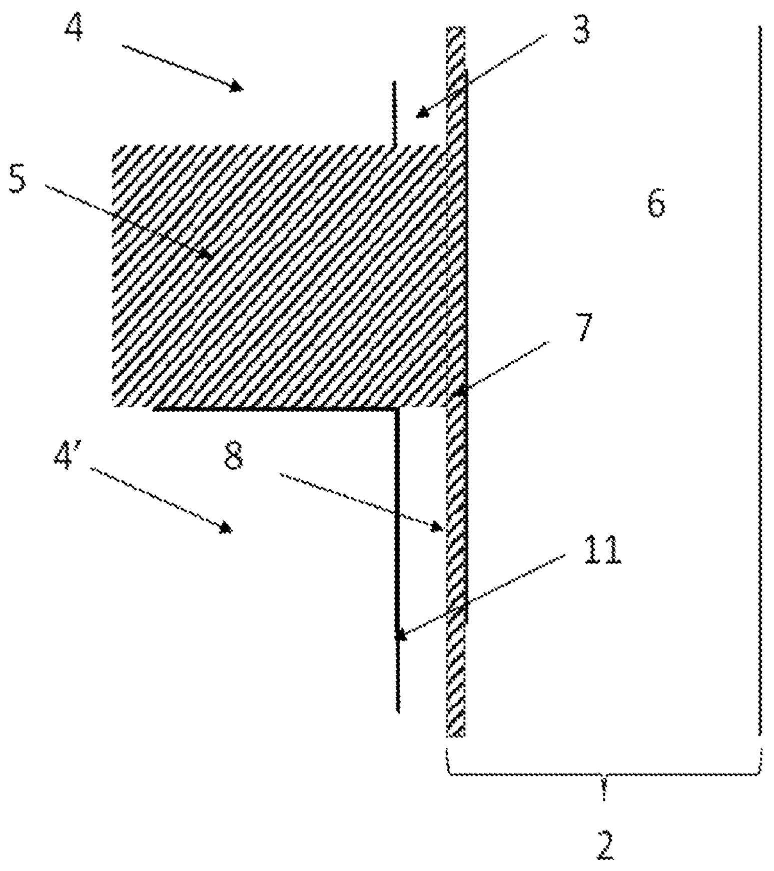
FIG. 4A illustrates an embodiment of FIG. 3 showing one foil layer.
Figure 4B:
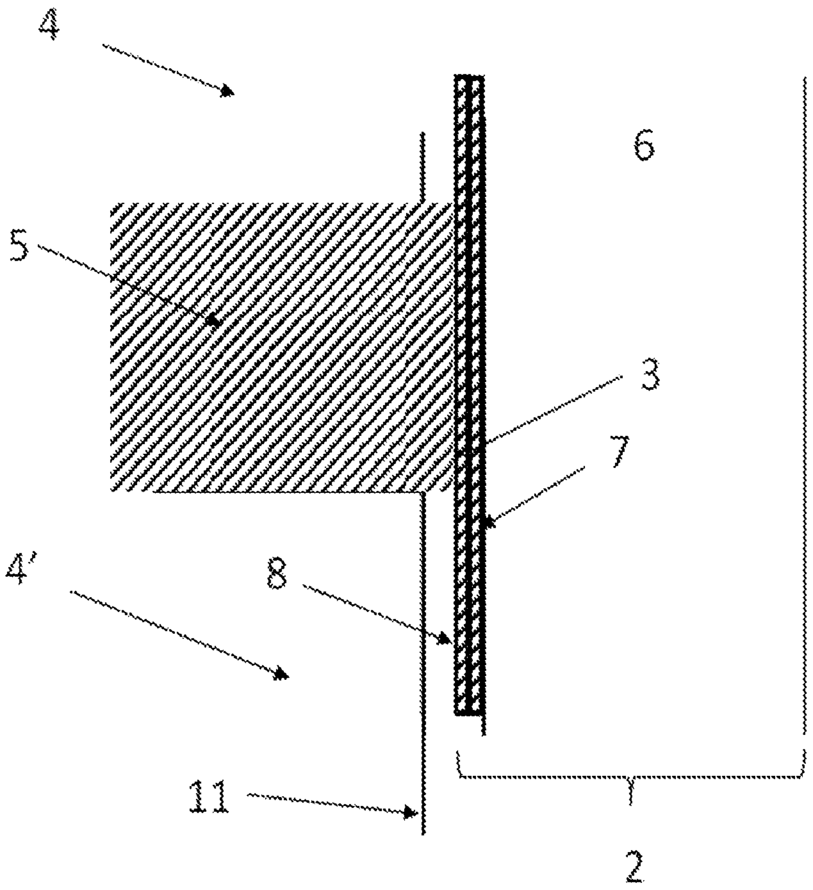
FIG. 4B illustrates an alternative embodiment of FIG. 3 showing two foil layers.
Figure 4C:
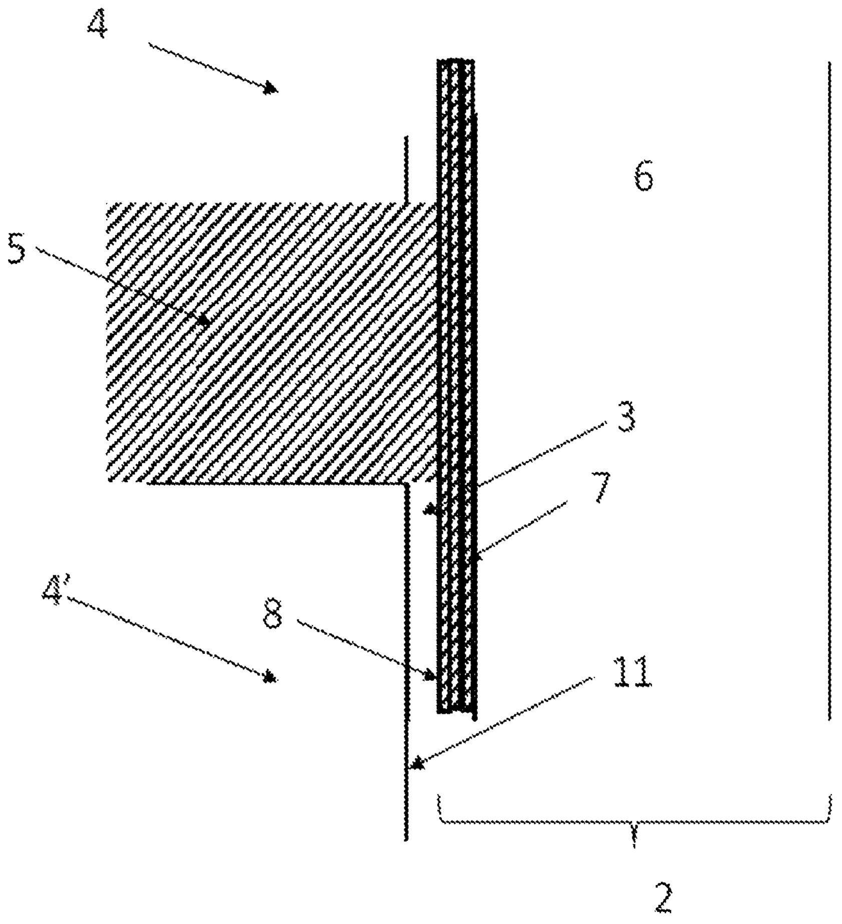
FIG. 4C illustrates another alternative embodiment of FIG. 3 showing three foil layers.

The die system 2 comprises a die 6 and optionally but preferably at least one conductive foil 7 located on the inner wall of the die as depicted in the embodiments of FIGS. 4A to 4C. The number of conductive foils on the inner wall of the die is not limited and 1, 2, 3, 4, 5, 6, 7, 8, 9, or 10 conductive foils may be provided as a circumferential liner between die 6 and each of upper 4 and lower 4' punches whereby the inner wall 8 of the die system 2 (including the at least one conductive foil, if present) and the outer wall 11 of each of the upper and lower punches defines the gap 3. The at least one conductive foil 7 may comprise graphite, niobium, nickel, molybdenum, platinum and other ductile, conductive materials and combinations thereof which are stable within the temperature range according to the method as disclosed herein.

In certain embodiments, the conductive foil may comprise a flexible and compressible graphite foil as disclosed herein having one or more of the following characteristics:

- carbon content of more than 99 wt %, preferably more than 99.2 wt %, more preferably more than 99.4 wt %, more preferably more than 99.6 wt %, more preferably more than 99.8 wt %, more preferably more than 99.9 wt %, more preferably more than 99.99 wt %, and more preferably more than 99.999 wt %;
- impurities of less than 500 ppm, preferably less than 400 ppm, more preferably less than 300 ppm, more preferably less than 200 ppm, more preferably less than 100 ppm, more preferably less than 50 ppm, more preferably less than 10 ppm, more preferably less than 5 ppm, and more preferably less than 3 ppm;
- tensile strength of the graphite foil in a range of from 4.0 to 6.0 MPa, preferably from 4.2 to 5.8 MPa, and more preferably from 4.4 or 5.6 MPa; and/or
- bulk density of the graphite foil preferably in a range of from 1.0 to 1.2 g/cc, preferably 1.02 to 1.18 g/cc, more preferably 1.04 to 1.16 g/cc, and more preferably 1.06 to 1.16 g/cc.

In embodiments, the at least one foil typically comprises graphite. In certain embodiments, the at least one foil as part of the die system may comprise a circumferential liner between a surface of the die and each of the upper and lower punches.

The graphite foils may improve the temperature distribution across the powder during sintering. Table 2 lists properties of exemplary graphite foils according to embodiments as disclosed herein such as Neograf Grafoil®, Sigraflex® graphite foils, and Toyo Tanso Perma-Foil®.

TABLE 2

| | |
|---|---|
| Thickness (mm) | 0.030 to 0.260 |
| Density (Mg/m3) | 0.5 to 2 |
| Tensile Strength (MPa) | 4.9-6.3 |
| Resistivity (μOhm-m; 25° C.) (parallel to surface) | 5 to 10 |
| Resistivity (μOhm-m; 25° C.) (perpendicular to surface) | 900 to 1100 |
| CTE (×10$^{-6}$/C.; parallel to surface) at 350° C. to 500° C. | 5 to 5.5 |
| CTE (perpendicular to surface) at 350° C. to 500° C. | 2 × 10$^{-4}$ |
| Compressibility (%) | 40-50 |
| Recovery (%) | 10 to 20 |
| thermal conductivity (W/mK at 25° C.; parallel to surface) | 175 to 225 |
| thermal conductivity (W/mK at 25° C.; perpendicular to surface) | ~5 |
| Impurities/Ash (wt %) | <0.5 |

Referring now to FIGS. 4A, 4B and 4C, an SPS tool set with embodiments of the graphite foil arrangement is shown. A yttrium oxide powder 5 is disposed between at least one of upper and lower punches 4 and 4' and gap 3 is shown between the outer wall 11 of each of the upper and lower punches and the inner wall 8 of the die system 2. FIGS. 4A, 4B and 4C depict 1 to 3 layers of conductive foil 7 respectively and die 6 as part of the die system 2. Accordingly, the gap extends from the inner wall 8 of the die system 2 to the outer wall 11 of each of the upper and lower punches. The gap distance is arranged such that the powder may degas before and/or during heating and sintering, while also maintaining ohmic contact between punch and die to improve the temperature distribution across the yttria ceramic powder during heating and sintering.

The graphite foils 7 may have a thickness of, for example, from 0.025 to 0.260 mm, preferably from 0.025 to 0.200 mm, preferably from 0.025 to 0.175 mm, preferably from 0.025 to 0.150 mm, preferably from 0.025 to 0.125 mm, preferably from 0.035 to 0.200 mm, preferably from 0.045 to 0.200 mm, and preferably from 0.055 to 0.200 mm.

The distance of gap 3 is measured from an inwardly facing surface of the foil 7 closest to the upper and lower punches 4 and 4' to the outer wall 11 of each of the upper and lower punches. Preferred ranges for the distance of gap 3 are preferably from 10 to 70 μm, preferably from 10 to 60 μm, preferably from 10 to 50 μm, preferably from 20 to 70 μm, preferably from 30 to 70 μm, preferably from 40 to 70 μm, preferably from 25 to 45 μm, preferably from 20 to 60 μm, and preferably from 30 to 60 μm.

Moreover, the width of gap 3 between the inner wall 8 of the die system 2 and the outer wall 11 of each of the upper 4 and lower 4' punches may be determined by the person skilled in the art so that the powder degassing during the preheating, heating and sintering processes are sufficiently facilitated on one hand and that a sufficient electrical contact for Joule or resistive heating and, thereby, sintering is achieved on the other hand. If the distance of gap 3 is less than 10 μm, the force required to move at least one of the upper and lower punches within the inner volume of the die system, and thereby assemble the tool set, may cause damage to the tool set. Further, a gap 3 of less than 10 μm may not allow for escape of adsorbed gases, organics, humidity and the like within the yttria powder 5 which would extend processing time during manufacturing and may result in residual porosity, and thereby lowered density, in the sintered yttria ceramic body. If the width of gap 3 is greater than 70 μm when sintering insulating powders of yttrium oxide, localized overheating may occur, resulting in thermal gradients within the tool set during sintering. As a result, in order to form a yttria sintered ceramic body of a large dimension, a gap of from 10 to 70 μm is preferable. Thus, in some embodiments, the distance of the gap 3 between the inner wall 8 of the die system 2 and the outer wall 11 of each of the upper and lower punches when sintering yttrium oxide powders is preferably from 10 to 70 μm, preferably from 10 to 60 μm, preferably from 10 to 50 μm, preferably from 10 to 40 μm, preferably from 20 to 70 μm, preferably from 30 to 70 μm, preferably from 40 to 70 μm, preferably from 50 to 70 μm, and preferably from 30 to 60 μm.

These thermal gradients may result in low overall or bulk density and high-density variations and a sintered yttrium oxide ceramic body which is fragile and prone to breakage. As a result, the distance of gap 3 between the inner wall 8 of the die system 2 and the outer wall 11 of each of the upper and lower punches when sintering yttrium oxide ceramic powders as disclosed herein is from 10 to 70 μm, preferably from 10 to 60 μm, preferably from 10 to 40 μm, preferably from 20 to 70 μm, preferably from 40 to 70 μm, preferably from 50 to 70 μm, preferably from 30 to 70 μm, and preferably from 40 to 60 μm. Without intending to be bound by a particular theory, it is believed that the gap distance between the inner wall 8 of the die system 2 and the outer wall 11 of each of the upper and lower punches during sintering functions to facilitate powder degassing of organics, moisture, adsorbed molecules, etc. during the sintering process. This leads to a yttria sintered ceramic body of a large size having high density and low volumetric porosity, low density variation and improved mechanical properties such that the body may be easily handled without breakage. Sintered ceramic bodies made as disclosed herein may have dimensions of from 100 mm to 610 mm and, in some embodiments, from 100 mm to 625 mm with regard to the greatest dimension of the sintered ceramic body.

Figure 5A:
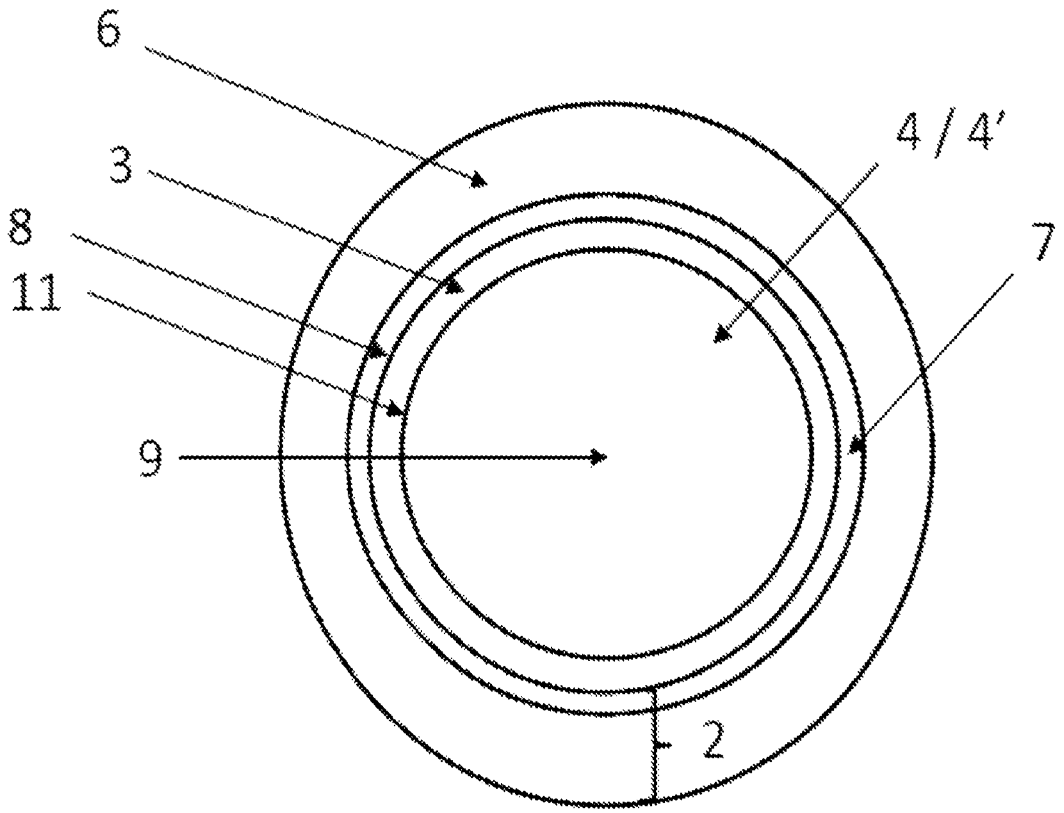
FIGS. 5A and 5B are top plan views of the SPS sintering apparatus of FIG. 3.
Figure 5B:
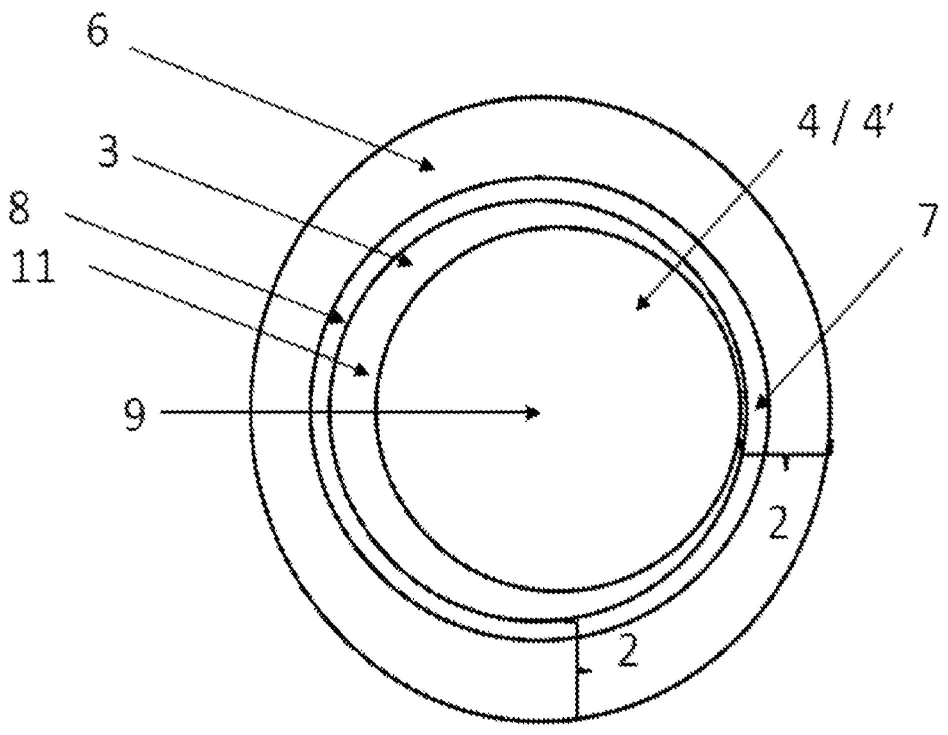

In practice, the upper and lower punches 4 and 4' are not always perfectly aligned about a central axis. FIG. 5A and FIG. 5B are plan views of the tool set 1, illustrating alignments of upper and lower punches 4 and 4', gap 3, any number of conductive foils 7, and die system 2 about central axis 9. In embodiments as depicted in FIG. 5A, the gap may be axisymmetric about central axis 9. In other embodiments as depicted in FIG. 5B, the gap may be asymmetric about central axis, 9. The gap 3 may extend between from 10 um to 70 um and, in some embodiments, from 10 um to 100 um when sintering the yttrium oxide powder to form a yttria sintered ceramic body as disclosed herein, in both axisymmetric and asymmetric embodiments as depicted.

Figure 6:
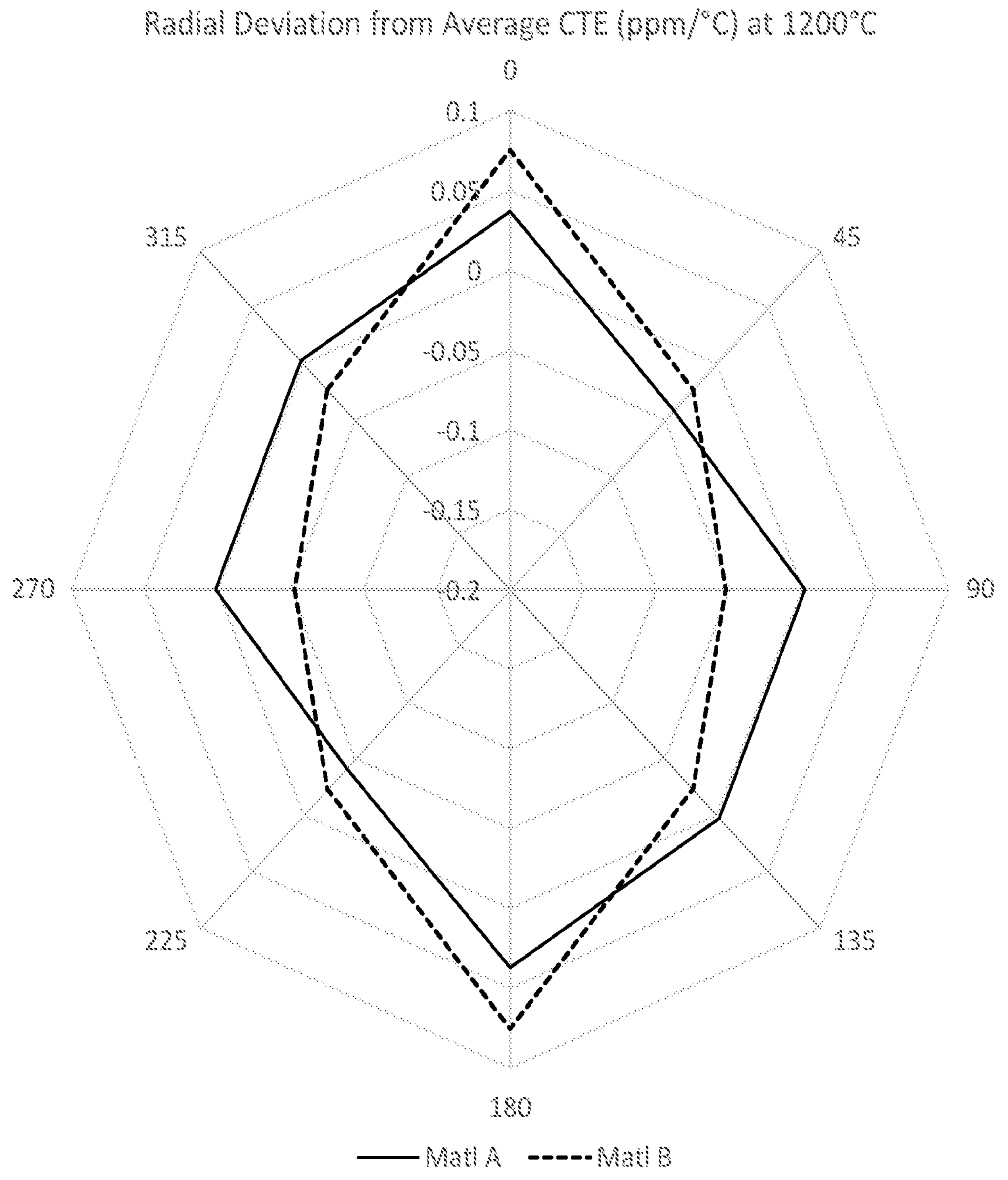
FIG. 6 is a graph depicting radial variance in average coefficient of thermal expansion (CTE) of graphite materials A and B at 1200° C.

Gap asymmetry performance can be measured by performing an absolute radial CTE deviation analysis over a range of temperatures. (The CTE describes how the size of an object changes with a change in temperature. Specifically, it measures the fractional change in size per degree change in temperature at a constant pressure.) For example, FIG. 6 shows the radial deviation from average CTE of two isotropic graphite materials (A and B) used as the punches and die of the apparatus disclosed herein at 1200° C. FIG. 6 shows that for a material to be successful at maintaining the desired gap over a large temperature range, the radial deviation cannot vary in the x-y plane from the average CTE by $>0.3\times10^{-6}/°$ C. at the maximum from, e.g., room temperature to 2000° C.

Thus, in order to maintain the desired gap 3 across a temperature range necessary for sintering the insulating yttria powders having a resistivity of $1\times10^{+10}$ and greater as disclosed herein, the radial deviation from average CTE may preferably be minimized, and as such, the radial deviation is preferably from $0.3\times10^{-6}/°$ C. and less, preferably from $0.25\times10^{-6}/°$ C. and less, preferably from $0.2\times10^{-6}/°$ C. and less, and preferably $0.18\times10^{-6}/°$ C. and less across a temperature range of interest. In certain embodiments, it may be preferable that radial deviations from the average CTE of $0.16\times10^{-6}/°$ C. and less, preferably $0.14\times10^{-6}/°$ C. and less, preferably $0.12\times10^{-6}/°$ C. and less, preferably $0.1\times10^{-6}/°$ C. and less, preferably $0.08\times10^{-6}/°$ C. and less, and preferably $0.06\times10^{-6}/°$ C. and less are maintained to provide the desired gap 3 across a temperature range of from room temperature up to a sintering temperature of the ceramic powder and including up to a working temperature of the apparatus of about 2,000° C. The disclosed ranges of radial deviation from average CTE of the at least one graphite material in the x-y plane are required to be maintained across a rotational position about the central axis 9 of from 0 to 360 degrees, preferably from 0 to 270 degrees, preferably from 0 to 180 degrees, preferably from 0 to 90 degrees, preferably from 0 to 45 degrees, preferably less than 10 degrees, preferably less than 5 degrees, preferably about 3 degrees, and preferably about one degree, each with respect to the rotational position of the die and upper and/or lower punches.

Figure 7:
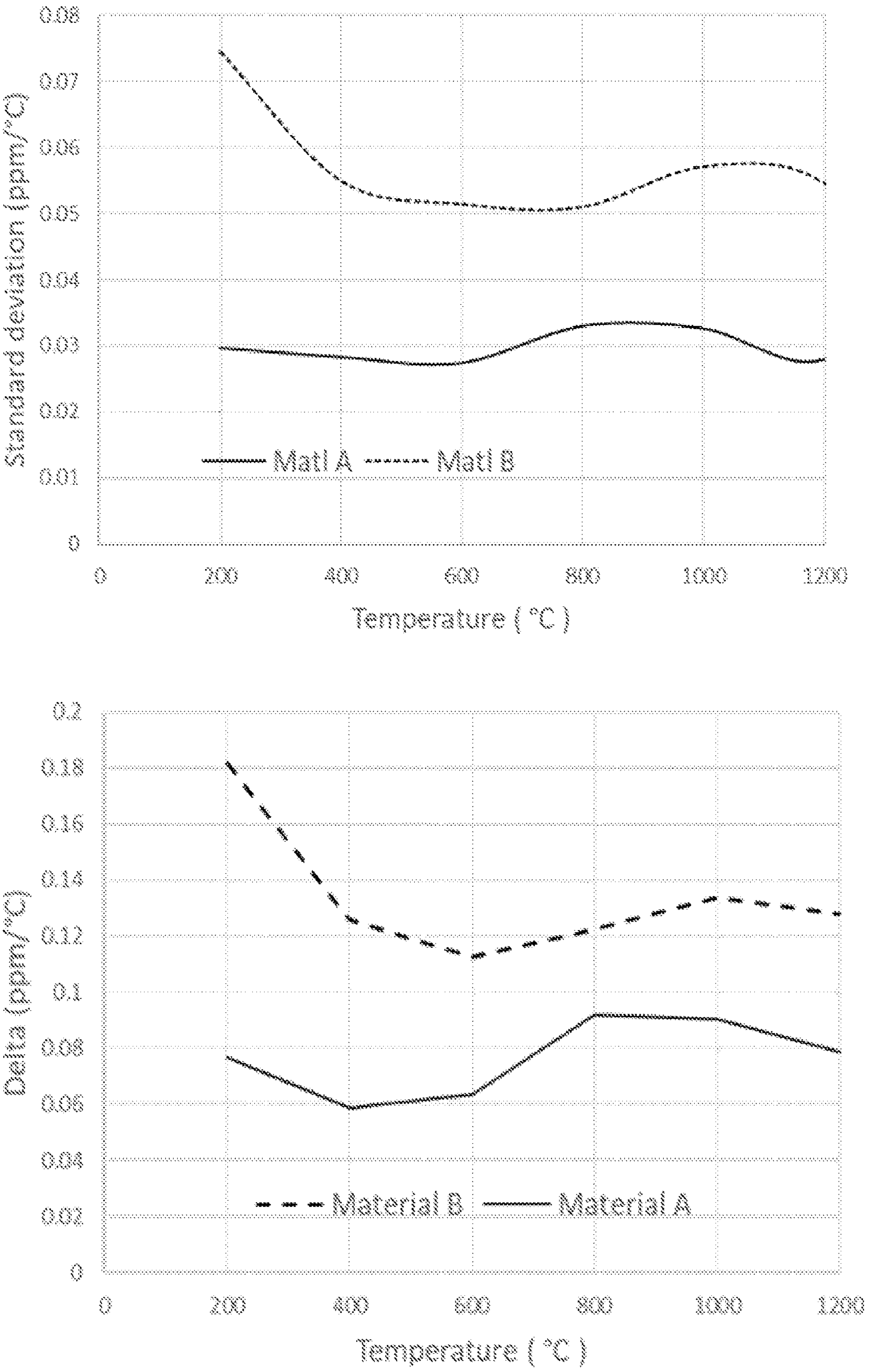
FIG. 7 *a*) illustrates the standard deviation of coefficient of thermal expansion of graphite materials A and B in ppm and b) variance in coefficient of thermal expansion of graphite materials A and B each as measured over the operating temperatures of 200 to 1200° C.
Figure 8:
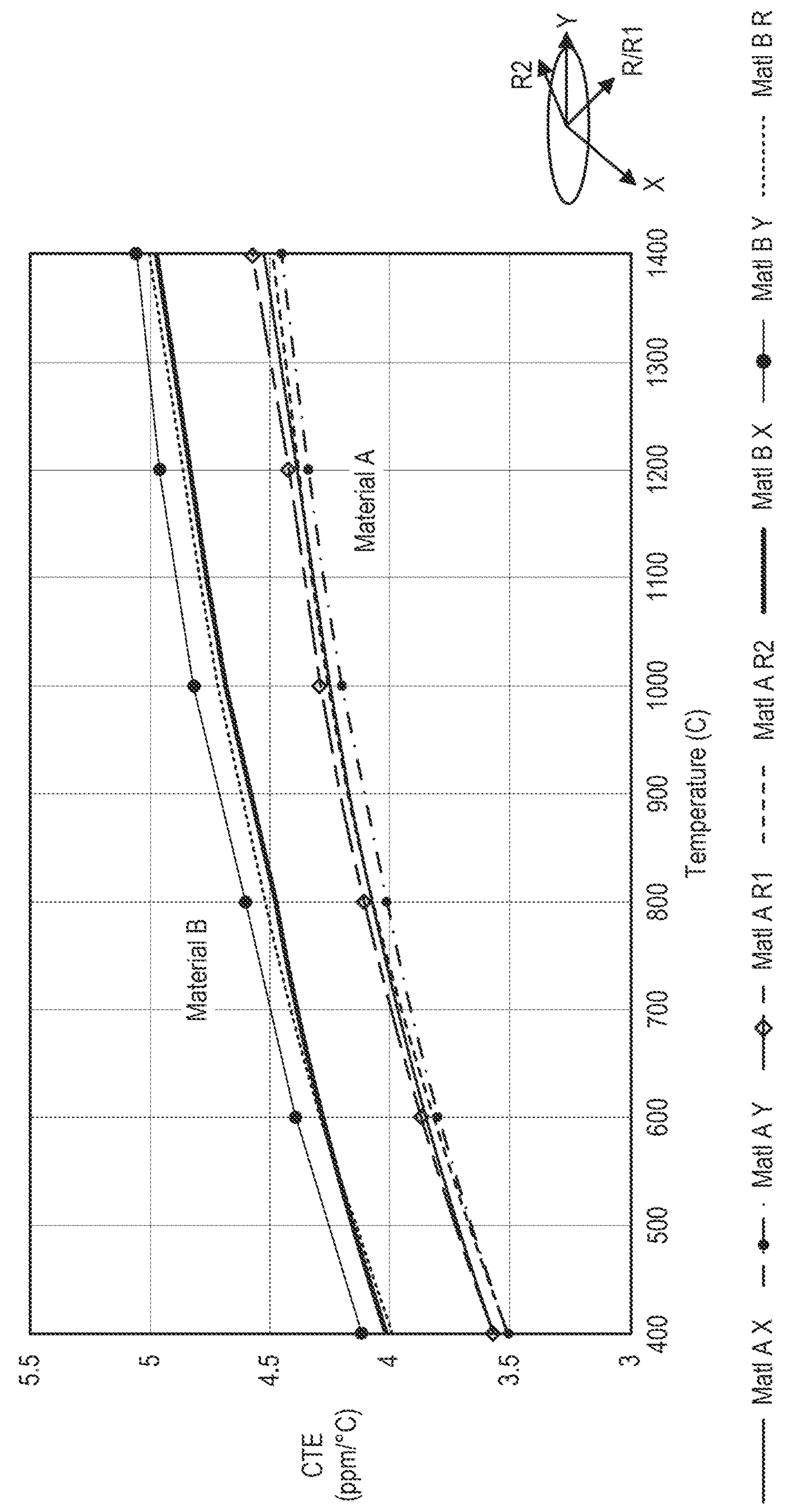
FIG. 8 is a graph illustrating a coefficient of thermal expansion of graphite materials A and B from 400 to 1400° C.

Material B displays an unacceptable CTE expansion in the x-y plane whereas Material A exhibited an acceptable CTE expansion throughout the temperature range. FIG. 7 *a*) shows the standard deviation in ppm/° C. of the graphite material CTE and b) the absolute variation (delta) in CTE (in ppm/° C. from lowest to highest) across the x-y plane of both materials of FIG. 6 across the range of temperatures. FIG. 8 depicts variance in coefficient of thermal expansion of graphite materials A and B from 400 to 1400° C. The required ranges for radial deviation from average CTE may apply across a number of different graphite materials having a range of CTE expansions as disclosed herein, without limitation. As such, graphite materials meeting the disclosed ranges for radial deviation may have a CTE ranging for example from $4\times10^{-6}/°$ C. to $7\times10^{-6}/°$ C. and may be useful for fabrication of the punches 4, 4' and/or die 6. In embodiments, it is preferable that the CTE of the upper 4 and lower 4' punches is less than or equal to the CTE of the die 6. The table following lists the maximum radial deviation (max variation in CTE) in the x-y plane, the average CTE, and the standard deviation in CTE of exemplary Material A. The average of the maximum variation in CTE across all temperatures was calculated to be 0.083 ppm/° C.

TABLE 3

| Temperature (° C.) | Max Variation in CTE (ppm/° C.) | Average CTE (ppm/° C.) | Standard Deviation CTE (ppm/° C.) |
|---|---|---|---|
| 200 | 0.077 | 3.357 | 0.030 |
| 400 | 0.059 | 3.543 | 0.028 |
| 600 | 0.064 | 3.843 | 0.027 |
| 800 | 0.092 | 4.069 | 0.033 |
| 1000 | 0.091 | 4.253 | 0.033 |
| 1200 | 0.079 | 4.387 | 0.028 |
| 1400 | 0.120 | 4.513 | 0.044 |

The advantages of the specific tool set design used according to an embodiment may lead to the overall technical effect to provide a large yttria ceramic body of very high purity and having a high and uniform density and low volumetric porosity and thereby a reduced tendency towards breakage in the sintering process, in particular in the SPS process, according to the present disclosure. Therefore, all features disclosed with respect to the tool set also apply to the product of a sintered ceramic body of dimension greater than 100 mm.

By using the tool set as disclosed herein it becomes possible to achieve a more homogeneous temperature distribution in the yttrium oxide powder 5 to be sintered, and make a yttria sintered ceramic body, in particular one of large dimension, exceeding for example 100 mm and/or 200 mm in greatest dimension, having very high (>98% of theoretical density of yttrium oxide) and uniform density (<4% variation across a greatest dimension) and thereby a reduced tendency towards breakage. The word "homogeneous" means that a material or system has substantially the same property at every point; it is uniform without irregularities. Thus, by "homogeneous temperature distribution" is meant that the temperature distribution is spatially uniform and does not have considerable gradients, i.e., a substantially uniform temperature exists regardless of position in a horizontal x-y plane along the ceramic powder 5.

The tool set as disclosed may further comprise spacer elements, shims, liners and other tool set components. Typically, such components are fabricated from at least one of the graphite materials having the properties as disclosed herein.

Method of Making the Yttrium Oxide Sintered Body

Preparation of the sintered yttrium oxide body sintered body may be achieved by use of pressure assisted sintering combined with direct current sintering and related techniques, which employ a direct current to heat up an electrically conductive die configuration or tool set, and thereby a material to be sintered. This manner of heating allows the application of very high heating and cooling rates, enhancing densification mechanisms over grain growth promoting diffusion mechanisms, which may facilitate preparation of sintered yttrium oxide body sintered bodies of very fine grain size, and transferring the intrinsic properties of the original powders into their near or fully dense products.

The above-mentioned characteristics of the corrosion resistant sintered yttrium oxide bodies and components formed from the sintered yttrium oxide bodies are achieved in particular by adapting the purity of the yttrium oxide powder, the surface area of the yttrium oxide powder, the heating and cooling rates of the yttrium oxide powder as well as the sintered body, the pressure applied to the yttrium oxide powder, the temperature of the yttrium oxide powder, the duration of sintering the powder, the temperature of the sintered yttrium oxide body or component during the optional annealing step, and the duration of the annealing step.

Disclosed is a process of making a sintered yttrium oxide body, the process comprising the steps of:

a. disposing yttrium oxide powder inside an inner volume defined by a spark plasma sintering tool, wherein the spark plasma sintering tool comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide and creating vacuum conditions inside the inner volume;

b. applying a pressure of from 10 MPa to 60 MPa to the yttrium oxide powder by moving at least one of the upper punch and the lower punch within the inner volume of the die to apply pressure to the yttrium oxide powder while heating the yttrium oxide powder to a sintering temperature of from 1200 to 1600° C. and performing sintering to form a sintered yttrium oxide body; and c. lowering the temperature of the sintered yttrium oxide body, wherein the yttrium oxide powder of step a) has a surface area of 10 $m^2/g$ or less, wherein the sintered yttrium oxide body has a total impurity level of 40 ppm or less, a density of not less than 4.93 $g/cm^3$, at least one surface comprising at least one pore, and wherein no pore is larger than 5 μm in diameter.

The following additional steps are optional:

d. optionally annealing the sintered yttrium oxide body by applying heat to raise the temperature of the sintered yttrium oxide body to reach an annealing temperature, performing annealing;

e. lowering the temperature of the annealed sintered yttrium oxide body; and f. optionally machining the annealed sintered yttrium oxide body to create a sintered yttrium oxide body component, wherein the component is selected from the group consisting of a dielectric window or RF window, a focus ring, a nozzle or a gas injector, a shower head, a gas distribution plate, an etch chamber liner, a plasma source adapter, a gas inlet adapter, a diffuser, an electronic wafer chuck, a chuck, a puck, a mixing manifold, an ion suppressor element, a faceplate, an isolator, a spacer, and a protective ring.

The sintering tool (herein the terms "tool" and "apparatus" are used interchangeably) may be a pressure assisted sintering apparatus such as, for example, a Spark Plasma Sintering (SPS) apparatus. SPS is also known as Field Assisted Sintering Technology (FAST), or Direct Current Sintering (DCS). Direct current and these related techniques employ a direct current to heat up an electrically conductive die configuration, and thereby a material to be sintered. This manner of heating allows the application of very high heating and cooling rates, enhancing densification mechanisms over grain growth promoting diffusion mechanisms, and transferring the intrinsic properties of the original powders into their near or fully dense products.

The method is characterized in that the SPS tool set described above is located inside a vacuum chamber and comprises at least a die system and upper and lower punches, together defining a volume whereby the sintering process of the powder is carried out by disposing the powder inside the volume defined by the tool set of the sintering apparatus. The die system may have an inner wall and the at least one punch system may have an outer wall wherein the inner wall of the die system and the outer wall of the punch system are separated by a gap.

The specific process steps are now described in detail:

Process step (a)—disposing yttrium oxide powder inside an inner volume defined by a tool set of a spark plasma sintering tool, wherein the spark plasma sintering tool comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide and creating vacuum conditions inside the inner volume:

The method as disclosed utilizes commercially available yttrium oxide powder or those prepared from chemical synthesis techniques, without the need for sintering aids, cold pressing, forming or machining a green body prior to sintering.

A yttrium oxide powder is loaded into, for example, a die of an SPS sintering apparatus as disclosed above, wherein the spark plasma sintering tool comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide. Vacuum conditions as known to those skilled in the art are established within the powder disposed in the inner volume. Typical vacuum conditions include pressures of $10^{-2}$ to $10^{-3}$ torr. The vacuum is applied primarily to remove air to protect the graphite from burning and to remove a majority of the air from the powder.

The yttrium oxide starting material for carrying out the sintering process is a high-purity commercially available yttrium oxide powder. However, other yttrium oxide powders may also be used, for example those produced from chemical synthesis processes and related methods. The purity of the yttrium oxide starting powder is preferably higher than 99.99%, more preferably higher than 99.998%, and most preferably more than 99.999%. In some embodiments, the purity of the yttrium oxide starting powder is higher than 99.9999%. In other words, the total impurity level of the yttrium oxide powder may be less than 50 ppm, preferably less than 40 ppm, more preferably less than 30 ppm, more preferably less than 25 ppm, more preferably less than 20 ppm, more preferably less than 15 ppm, still more preferably less than 10 ppm, and still more preferably less than 6 ppm (inclusive of 0 ppm) with regard to total impurity levels. A high purity starting powder is desirable for optimal etch performance in the finished sintered yttrium oxide body/component.

In contrast to other sintering techniques in the prior art, the yttrium oxide powder employed in the process of the present disclosure is free of sintering aids and polymeric binders.

The average particle size of the yttrium oxide powder used as a starting material in the SPS process according to one embodiment of the present invention is usually from 0.5 to 20 μm, preferably from 1 to 15 μm, preferably from 2 to 10 μm, and more preferably from 5 to 8 μm.

The yttrium oxide powder preferably has a surface area of 10 $m^2/g$ or less. In some embodiments, the yttrium oxide powder has a surface area of from 1.0 to 10.0 $m^2/g$, preferably from 1.5 to 8.0 $m^2/g$, preferably from 2 to 7 and more preferably from 2 to 5 $m^2/g$.

Preferably, the yttrium oxide powder starting material is not ball milled prior to its use in the process of the present development. Ball milling is a potential source of contaminants/impurities.

In some embodiments, the yttrium oxide powder may be processed in such a way as to remove unwanted moisture, organics or agglomeration. Such processing may include tumbling, jet milling and/or sieving prior to its use in step a) of the process disclosed herein.

In embodiments, the yttrium oxide powder may be calcined prior to use in the process of the present development. Exemplary calcination temperatures include temperatures of from about 600° C. to about 1000° C. for a duration of 4 to 12 hours in an oxygen containing environment. Before and/or after calcination, the yttrium oxide powder may be sieved and/or tumbled without the use of milling media according to known methods.

Process step (b)—applying a pressure of from 10 MPa to 60 MPa to the yttrium oxide powder by moving at least one of the upper punch and the lower punch within the inner volume of the die to apply pressure to the yttrium oxide powder while heating the yttrium oxide powder to a sintering temperature of from 1200 to 1600° C. and performing sintering to form a sintered yttrium oxide body; and Process step (c)—lowering the temperature of the sintered yttrium oxide body:

After the yttrium oxide material is disposed in the inner volume defined by the tool set of the spark plasma sintering tool and a majority of air has been removed from the die/powder, pressure is applied to the yttrium oxide material disposed between the graphite punches. The pressure is preferably increased to a pressure of from 10 MPa to 60 MPa, preferably from 10 MPa to 40 MPa, more preferably from 15 MPa to 40 MPa, preferably from 20 and 40 MPa and even more preferably from 20 and 30 MPa.

The pressure is preferably applied in the axial direction on the material provided in the die. After pressure application, the yttria powder forms a powder compact which may have a packing density of from 20% to 60% by volume, from 20% to 55% by volume, preferably from 30% to 60% by volume, preferably from 30% to 55% by volume, preferably from 40% to 60% by volume, and preferably from 40% to 55% by volume. Higher packing densities are desirable to improve the thermal conductivity within the powder compact, thereby reducing differences in temperature across the powder compact during heating and sintering.

In preferred embodiments, the yttrium oxide powder is heated directly by the punches and die of the SPS apparatus. The die may be comprised of an electrically conductive material such as graphite, which facilitates resistive/joule heating. SPS apparatus and procedures are disclosed in, for example, US 2010/0156008 A1, which is herein incorporated by reference.

The application of heat to the yttrium oxide powder provided in the die facilitates sintering temperatures from about 1000 to 1700° C., preferably from about 1200 to 1600° C., preferably from about 1300 to 1550, preferably from about 1350 to 1500, and more preferably from about 1400 to 1500° C. In one embodiment, sintering is achieved in a time of from 0 to 1440 minutes; in other embodiments, sintering is achieved in a time of from 0 to 720 minutes; in other embodiments, sintering is achieved in a time of from 0 to 360 minutes; in other embodiments, sintering is achieved in a time of from 0 to 240 minutes; in other embodiments, sintering is achieved in a time of from 0 to 120 minutes; in other embodiments, sintering is achieved in a time of from 0 to 60 minutes; in other embodiments, sintering is achieved in a time of from 0 to 30 minutes; in other embodiments, sintering is achieved in a time of from 0 to 20 minutes; in other embodiments, sintering is achieved in a time of from 0 to 10 minutes; in other embodiments, sintering is achieved in a time of from 0 to 5 minutes.

The temperature of the sintering apparatus according to the present disclosure is measured typically within the graphite die of the apparatus. Thus, it is preferred that the temperature is measured as close as possible to the yttrium oxide being sintered so that the indicated temperatures are indeed realized within the yttrium oxide.

The order of application of pressure and temperature in one embodiment may vary according to the present disclosure, which means that it is possible to apply at first the indicated pressure and thereafter to apply heat to achieve the desired temperature. Moreover, in other embodiments it is also possible to apply at first the indicated heat to achieve the desired temperature and thereafter the indicated pressure. In a third embodiment according to the present disclosure, the temperature and the pressure may be applied simultaneously to the yttrium oxide to be sintered and raised until the indicated values are reached.

Inductive or radiant heating methods may also be used for heating the sintering apparatus and indirectly heating the yttrium oxide powder in the tool set.

In contrast to other sintering techniques, preparation of the sample prior to sintering, i.e., by cold pressing or forming a green body before sintering is not necessary, and the powder is filled directly in the mold. This may provide for higher purity in the final, sintered yttrium oxide body.

In further contrast to other sintering techniques, sintering aids are not required. Additionally, a high purity starting powder is desirable. The lack of sintering aids and the use of high purity starting materials, from 99.99% to more than 99.9999% purity, enables the fabrication of a high purity, sintered yttrium oxide body which provides improved etch resistance for use in semiconductor etch chambers.

In some embodiments, sintering under isothermal dwell time may be applied for a time period of from 0 minutes to 1440 minutes; in other embodiments, sintering under isothermal dwell time may be applied for from 0 minutes to 720 minutes; in other embodiments, sintering under isothermal dwell time may be applied for from 0 minutes to 360 minutes; in other embodiments, sintering under isothermal dwell time may be applied for from 0 to 240 minutes; in other embodiments, sintering under isothermal dwell time may be applied for from 0 to 120 minutes; in other embodiments, sintering under isothermal dwell time may be applied for from 0 to 60 minutes; in other embodiments, sintering under isothermal dwell time may be applied for from 0 to 30 minutes; in other embodiments, sintering under isothermal dwell time may be applied for from 0 to 20 minutes; in other embodiments, sintering under isothermal dwell time may be applied for from 0 to 10 minutes; in other embodiments, sintering under isothermal dwell time may be applied for from 0 to 5 minutes.

In one embodiment of the present invention, the SPS process step comprises a pre-sintering step with a specific heating ramp of from 0.1° C./min to 100° C./min, from 0.25° C./min to 50° C./min, preferably from 0.5° C./min to 50° C./min preferably from 0.75° C./min to 50° C./min, preferably 1° C./min to 50° C./min, more preferably 2 to 25° C./min, more preferably 3 to 20° C./min, preferably 4 to 15° C./min, preferably 5 to 10° C./min, until a specific pre-sintering time is reached.

In a further embodiment of the present invention, the SPS process step comprises a pre-sintering step with a specific pressure ramp of from 0.10 MPa/min to 30 MPa/min, from 0.2 to 25, preferably 0.25 to 20, 0.25 MPa/min to 15 MPa/min, preferably 0.5 to 10 MPa/min preferably 1 to 10 MPa/min until a specific pre-sintering time is reached.

In another embodiment of the present invention, the SPS process step comprises a pre-sintering step with the above-mentioned specific heating ramp and with the above-mentioned specific pressure ramp.

In process step (c), the sintered yttrium oxide may be passively cooled by removal of the heat source and natural convection occurs until a temperature is reached which may facilitate the optional annealing process. In a further embodiment, the sintered yttrium oxide body may be cooled under convection with inert gas, for example, at 1 bar of argon or nitrogen. Other gas pressures of greater than or less than 1 bar may also be used. To initiate the cooling step, the power applied to the SPS apparatus may be removed. The pressure applied to the sintered sample is removed at the end of the SPS process before (natural) cooling occurs.

During sintering, a volume reduction typically occurs such that the sintered yttrium oxide body may comprise a volume that is about one third that of the volume of the starting yttrium oxide powder when disposed in the tool set of the sintering apparatus.

By use of the SPS tool set having the range of gap dimensions as disclosed herein whereby the gap is maintained throughout the method and in particular during the sintering step as disclosed, resistive overheating is prevented and as a result this difference in temperature may be minimized such that density in the sintered ceramic body has minimal variation across the distance between an inner surface 8 of the die system and a central axis 9 defining a center. Uniform densification during sintering may result in density variations across a largest dimension of the sintered ceramic body as disclosed herein which are preferably less than 4%, less than 3%, preferably less than 2%, preferably less than 1%, more preferably less than 0.5%, preferably from 0.25 to 5%, preferably from 0.25 to 4%, preferably from 0.25 to 3%, preferably from 0.25 to 2%, preferably from 0.25 to 1%, preferably from 0.25 to 0.5%, preferably from 0.5 to 3.5%, and preferably from 1 to 3%, across a greatest dimension of a sintered ceramic body.

Further contributing to uniform densification during sintering is a high packing density to between 30 and 60% by volume of the powder compact comprising the yttrium oxide powder as disclosed herein prior to sintering, which may be achieved using the yttria powders and method as disclosed.

The temperature of the sintering apparatus according to the present disclosure is measured typically within the die comprising at least one graphite material of the sintering apparatus. Thus, it is preferred that the temperature is measured as close as possible to the ceramic powder being sintered so that the indicated temperatures are indeed realized within the ceramic powder.

The order of application of pressure and temperature in one embodiment may vary according to the present disclosure, which means that it is possible to apply at first the indicated pressure and thereafter to apply heat to achieve the desired temperature. Moreover, in other embodiments it is also possible to apply at first the indicated heat to achieve the desired temperature and thereafter the indicated pressure. In a third embodiment according to the present disclosure, the temperature and the pressure may be applied simultaneously to the ceramic powder to be sintered and raised until the indicated values are reached.

Inductive or radiant heating methods may also be used for heating the sintering apparatus and indirectly heating the yttria powder in the tool set.

In contrast to other sintering techniques, preparation of the powder prior to sintering, i.e., by cold pressing or forming a green body using organic additives such as binders, dispersants and the like before sintering is not necessary, and the powder is filled directly inside the inner volume of the spark plasma sintering tool to form a powder compact without the use of organic additives. This reduced handling may provide for higher purity in the final, sintered yttria ceramic body.

In accordance with aspects of process step b), the temperature and pressure are maintained for a time period of 1 min to 360 min, preferably from 1 to 240 minutes, preferably from 1 to 120 minutes, preferably from 1 to 60 minutes, preferably from 5 to 360 minutes, preferably from 10 to 360 minutes, preferably from 30 to 360 minutes, preferably from 45 to 360 minutes, preferably from 60 to 360 minutes, and preferably from 60 to 90 minutes to perform sintering.

In accordance with aspects of process step (c)—lowering the temperature of the sintered yttrium oxide body, the sintered yttrium oxide may be passively cooled by removal of the heat source and natural convection occurs until a temperature is reached which may facilitate the optional annealing process. In a further embodiment, the sintered yttrium oxide body may be cooled under convection with inert gas, for example, at 1 bar of argon or nitrogen. Other gas pressures of greater than or less than 1 bar may also be used. To initiate the cooling step, the power applied to the SPS apparatus may be removed. The pressure applied to the sintered sample is removed at the end of the SPS process before (natural) cooling occurs.

Process step (d)—in an optional step, annealing the sintered yttrium oxide body by applying heat to raise the temperature of the sintered yttrium oxide body to reach an annealing temperature, performing annealing; and Process step (e) lowering the temperature of the annealed sintered yttrium oxide body to an ambient temperature by removing the heat source applied to the sintered yttrium oxide body:

In optional step (d), the resulting sintered yttrium oxide body of step c) is subjected to an annealing process. Annealing may be performed in a furnace external to the sintering apparatus, or within the sintering apparatus itself, without removal of the sintered yttrium oxide body from the apparatus. For example, in one embodiment the sintered yttrium oxide may be removed from the sintering apparatus after cooling in accordance with process step (c), and the process step of annealing may be conducted in a separate apparatus such as a furnace. In other embodiments, for the purpose of annealing in accordance with this disclosure, the yttrium oxide being sintered in step (b) may subsequently be annealed while inside the sintering apparatus, without the requirement of removal from the sintering apparatus between the sintering step (b) and optional annealing step (d).

Annealing leads to a refinement of the chemical and physical properties of the sintered yttrium oxide body. The step of annealing can be performed by conventional methods used for the annealing of glass, ceramics and metals, and the degree of refinement can be selected by the choice of annealing temperature and the duration of time that annealing is allowed to continue.

The optional annealing step (d) can be carried out at a temperature of from 1200 to 1800° C., preferably from 1250 to 1700° C., and more preferably from 1300 to 1650° C. At such temperatures, oxygen vacancies in the crystal structure may be corrected back to stochiometric ratios.

The step of annealing the sintered yttrium oxide may be completed in from 5 min to 24 hours, preferably 20 min to 20 hours, and more preferably 60 min to 16 hours.

The optional annealing process step (d) is preferably carried out in an oxidizing atmosphere in air.

After the optional process step (d) of annealing the sintered yttrium oxide is performed, the temperature of the annealed sintered yttrium oxide is allowed to cool to an ambient temperature in accordance with process steps (c) or (e). The sintered and annealed yttrium oxide bodies are dense and typically have an average grain size of from 0.25 μm to 25 μm, preferably of from 0.5 to 20 μm, preferably of from 0.75 to 15 μm, preferably of from 1 to 10 μm, and more preferably from 1 to 5 μm.

The SPS process according to one embodiment and described above is suitable for use in the preparation of large sintered yttrium oxide bodies. The process as disclosed provides for rapid powder consolidation and densification, retaining a small (on the order of less than 13 μm) d50 grain size in the sintered body transferred from the starting powder materials, and achieving high, uniform densities in excess of 98% of theoretical with minimal (<3%) density variation across a longest dimension. This combination of fine grain size, uniform and high density provides for a high strength sintered yttrium oxide body of large dimension suitable for machining, handling and use as a component in a semiconductor processing chamber. For example, in one embodiment, the sintered yttrium oxide body may be formed in a disk shape having a dimension from 40 mm to 600 mm or from 40 to 625 mm in size and across a range of thicknesses, from 40 mm to 100 mm. In another embodiment, the sintered yttrium oxide body may be formed in a disk shape having a diameter from 100 mm to 600 mm or from 100 to 325 mm in diameter. In another embodiment, the sintered yttrium oxide body may be formed having a dimension from 100 mm to 406 mm. In other embodiments, the sintered yttrium oxide body has a size of from 200 mm to 600 mm or from 200 mm to 625 mm, preferably from 300 to 600 mm or from 300 to 625 mm, preferably from 350 to 600 mm or from 350 to 625 mm, preferably from 400 to 600 mm or 400 to 625 mm, more preferably from 450 to 600 mm or from 450 to 625 mm, more preferably from 500 to 600 mm or from 500 to 625 mm, more preferably 550 to 600 mm or from 550 to 625 mm, each with regard to at least one dimension which may be a longest dimension of the sintered body.

Finally, in accordance with process step (f), the sintered (or sintered and annealed) yttrium oxide body may then be optionally machined into, for example, a final sintered yttrium oxide component for use in a plasma etching chamber such as, for example, a dielectric window or RF window, a focus ring, a nozzle or a gas injector, a shower head, a gas distribution plate, an etch chamber liner, a plasma source adapter, a gas inlet adapter, a diffuser, an electronic wafer chuck, a chuck, a puck, a mixing manifold, an ion suppressor element, a faceplate, an isolator, a spacer, and a protective ring. Machining of the sintered yttrium oxide body (or sintered and annealed) to create a sintered component may be carried out according to methods known to those skilled in the art.

The method as disclosed herein provides for an improved control over the maximum pore size, high density, density variation, high purity, improved mechanical strength and thereby handleability of a sintered yttrium oxide body/component, in particular, for those bodies of dimensions greater than, for example, between 200 and 600 mm across a maximum dimension.

Thus, in one embodiment disclosed herein is a sintered yttrium oxide body having a total impurity level of 40 ppm or less, a density of not less than 4.93 g/$cm^3$, wherein the sintered yttrium oxide body has at least one surface comprising at least one pore, wherein no pore is larger than 5 μm in diameter, wherein the sintered yttrium oxide body is made by a process comprising the steps of:

a. disposing yttrium oxide powder inside an inner volume defined by a tool set of a spark plasma sintering tool, wherein the spark plasma sintering tool set comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide and creating vacuum conditions inside the inner volume;
b. applying a pressure of from 10 MPa to 60 MPa to the yttrium oxide powder by moving at least one of the upper punch and the lower punch within the inner volume of the die to apply pressure to the yttrium oxide powder while heating the yttrium oxide powder to a sintering temperature of from 1200 to 1600° C. and performing sintering to form a sintered yttrium oxide body; and
c. lowering the temperature of the sintered yttrium oxide body, wherein the yttrium oxide powder of step a) has a surface area of 10 $m^2$/g or less, wherein the sintered yttrium oxide body has a total impurity level of 40 ppm or less, a density of not less than 4.93 g/$cm^3$, at least one surface comprising at least one pore, wherein no pore is larger than 5 μm in diameter.

The sintered yttrium oxide body (inclusive of annealed sintered yttrium oxide) thus prepared may be used in apparatus for plasma-etching. Most integrated circuit (IC) manufacturing processes typically include a number of manufacturing steps that can sequentially form, shape or otherwise modify various layers. One way of forming a layer can be to deposit and then etch the layer. Usually, etching can include forming an etch mask over an underlying layer. An etch mask may have a particular pattern that can mask certain portions of an underlying layer while exposing other portions. Etching can then remove portions of an underlying layer exposed by an etch mask. In this way, an etch mask pattern may be transfect to an underlying layer.

Plasma etching is currently used to process semiconducting materials for their use in the fabrication of electronics. Small features can be etched into the surface of the semiconducting material in order to be more efficient or enhance certain properties when used in electronic devices. For example, plasma etching can be used to create deep trenches on the surface of silicon for uses in microelectromechanical systems. This application suggests that plasma etching also has the potential to play a major role in the production of microelectronics. Similarly, research is currently being done on how the process can be adjusted to the nanometer scale.

Plasma etching is carried out usually in plasma etch chambers which are commonly used to etch one or more layers formed on a semiconductor substrate, which is typically supported on a substrate support within the chamber.

During plasma etching, plasma is formed above the surface of the substrate by supplying radiofrequency (RF) electromagnetic radiation to a low-pressure gas (or gas mixture). By adjusting the electrical potential of the substrate, charged species in the plasma can be directed to impinge upon the surface of the substrate and thereby remove material (e.g., atoms) therefrom.

Plasma etching can be made more effective by using gases that are chemically reactive with the material to be etched. So called "reactive ion etching" combines the energetic impinging effects of the plasma with the chemical etching effects of a reactive gas.

The sintered yttrium oxide according to an embodiment of the present disclosure may be used to fabricate plasma chamber components. Such components may have benefits that include long life-time in aggressive etch conditions because they can be made highly dense and pure by sintering with the above-described SPS process. The sintered yttrium oxide bodies have many advantages in the context of plasma processing, including resistance to particle generation, improved plasma etch resistance, and increased component lifetime. In addition, cleaning of the yttrium oxide parts may be easier, because it may be possible to use aggressive cleaning methods such as highly corrosive or aggressive chemicals.

Examples of chamber components that can be formed from the sintered yttrium oxide bodies disclosed herein include an electrostatic chuck (ESC), a ring (e.g., a process kit ring or single ring), a chamber wall liner, a base, a gas distribution plate, a shower head, a liner, a liner kit, a shield, a plasma screen, a flow equalizer, a cooling base, a chamber viewport, a chamber lid, and so on.

In one embodiment, the processing chamber according to an embodiment of the present disclosure includes a chamber body and a shower head that enclose an interior volume. Alternatively, the shower head may be replaced by a lid and a nozzle which may also be prepared from the yttrium oxide described above either as a full material or as a coating. The chamber body may be fabricated from aluminium, stainless steel or other suitable material. The chamber body generally includes sidewalls, focus or edge rings surrounding a wafer, and a bottom. One or more of the shower head (or lid and/or nozzle), sidewalls and/or bottom include the sintered yttrium oxide according to an embodiment of the present disclosure.

The features and advantages are more fully shown by the illustrative examples discussed below.

EXAMPLES

The following examples are included to more clearly demonstrate the overall nature of the disclosure. These examples are exemplary, not restrictive, of the disclosure.

All particle size measurements were performed using a Horiba model LA-960 Laser Scattering Particle Size Distribution Analyzer capable of measuring particle size from 10 nm to 5 mm. All specific surface area (SSA) measurements for the starting powders, powder mixtures, and calcined powder mixtures were performed using a Horiba BET Surface Area Analyzer model SA-9601 capable of measuring across a specific surface area of 0.01 to 2000 $m^2/g$ with an accuracy of 10% and less for most samples. Purities and impurities were measured using an ICP-MS from Agilent 7900 ICP-MS model G8403. All density measurements were performed in accordance with ASTM B962-17, based upon Archimedes methods as known to those skilled in the art. Embodiments of the yttrium oxide powder and ceramics formed therefrom according to the Examples are known to be inherently insulating, highly resistive materials having a resistivity of from about $1\times10^{+10}$ ohm-cm and greater.

Comparator Example 1

A polycrystalline ceramic sintered body of 406 mm largest dimension was prepared from a crystalline powder of yttrium oxide having a specific surface area of from 4.5 to 6.5 $m^2/g$, and a d10 particle size of from 1.5 to 3.5 μm, a d50 particle size of from 4 to 6 μm, and a d90 particle size of 6.5 to 8.5 μm. The powder had total impurities of about 14 ppm relative to a total mass of the yttrium oxide powder. A die of a spark plasma sintering tool was lined with at least one graphite foil having properties as disclosed herein, and the die and each of the upper and lower punches of the tool comprised at least one graphite material as disclosed herein. The powder was disposed inside an inner volume defined by the spark plasma sintering tool and the tool had a gap of about 100 μm. The gap was configured between an inwardly facing surface of the at least one graphite foil and an outer wall of each of the upper punch and the lower punch of the spark plasma sintering tool. Vacuum conditions of from $10^{-2}$ to $10^{-3}$ torr were created inside the inner volume. The powder was sintered at 1,400° C. at a pressure of 20 MPa for a duration of 30 minutes to form a sintered ceramic body in a disc shape having a greatest dimension, or diameter, of 406 mm. The overall density of the sample was measured as 4.78 g/cc, or 95.03% of the theoretical density for yttrium oxide (reported as 5.03 g/cc). A density variation was measured to be about 4.5% relative to the highest density measurement across the greatest dimension. The sintered ceramic body prepared using the spark plasma sintering tool having a gap as disclosed in accordance with this example resulted in low overall density, high density variation, and subsequent fracture of the sintered body.

Example 1 (Sample 353 High Density, Large Dimension Polycrystalline Sintered Ceramic Body)

A sintered ceramic body of 406 mm largest dimension was prepared from a crystalline powder of yttrium oxide having a specific surface area of from 6 to 8 m2/g, and a d10 particle size of from 1 to 3 μm, a d50 particle size of from 4 to 6 μm, and a d90 particle size of from 7.5 to 9.5 μm. The powder had total impurities of about 25 ppm relative to the total mass of the yttrium oxide powder. A die of a spark plasma sintering tool was lined with at least one graphite foil having properties as disclosed herein, and the die and each of the upper and lower punches comprised at least one graphite material as disclosed herein. The yttria powder was disposed inside an inner volume defined by the spark plasma sintering tool having a gap of from about 50 to about 70 μm wherein the gap was configured between an inwardly facing surface of the at least one graphite foil and an outer wall of each of the upper punch and the lower punch of the sintering tool. Pre-application of pressure to the yttrium oxide powder was performed in a multiple step process whereby about 10 MPa pressure was pre-applied under a vacuum of from about $10^{-2}$ to $10^{-3}$ torr to form a powder compact having a packing density of from about 35 to 45% by volume. The powder compact was sintered at a temperature of 1,550° C. at a pressure of 20 MPa for a duration of 60 minutes. A radial variance from the average coefficient of thermal expansion (CTE) of the at least one graphite material comprising the die and/or the upper and lower punches about a central axis of the sintering tool was determined to be about $0.2\times10^{-6}$/° C. and less. The average density across five measurements was performed and a density of 5.020 g/cc, or 99.80% of the theoretical density for yttrium oxide (according to D. R. Lide, CRC Handbook of Chemistry and Physics, 84th Edition, 2012 ("the CRC Handbook"), the theoretical density of yttrium oxide is 5.03 g/cm3) was measured. Thus, using the tool having the specified gap distance and radial variance as disclosed herein, a high density, sintered ceramic of large dimension may be formed.

Example 2 (Sample 152 Polycrystalline Yttrium Oxide Sintered Ceramic Body)

A 100 mm sintered yttrium oxide body was formed from a yttrium oxide powder having a surface area of from 6.5 to 8.0 m2/g and 99.999% purity, corresponding to an average total impurity of 18 ppm relative to a total mass of the yttrium oxide powder. The d10 particle size was from 1.5 to 3.5 μm, the median particle size (d50) was from 4 to 6 μm, and the d90 particle size was 7.5 to 9.5 μm. A die of a spark plasma sintering tool was lined with at least one graphite foil having properties as disclosed herein, and the die and each of the upper and lower punches of the tool comprised at least one graphite material as disclosed herein. The yttria powder was disposed inside an inner volume defined by the sintering tool, and vacuum conditions of from 10-2 to 10-3 torr were created inside the inner volume. The tool had a gap of from about 25 to about 50 μm, wherein the gap was configured between an inwardly facing surface of the at least one graphite foil and an outer wall of each of the upper punch and the lower punch of the sintering tool. A radial variance in average coefficient of thermal expansion (CTE) of the at least one graphite material comprising the die and/or the upper and lower punches about a central axis of the sintering tool was determined to be about $0.2\times10^{-6}$/° C. and less. Sintering was performed at 1,400° C. for 30 minutes at 30 MPa. Thereafter, annealing was performed in air at 1,400° C. for 8 hours. An average density of 5.02 g/cc was measured, corresponding to 99.9% of the theoretical density of yttrium oxide.

The following yttrium oxide samples H1/66 to H4/152 according to an embodiment of the present invention were prepared and compared with yttrium oxide samples CM1/107, CM2/108 and 118 which were not prepared according to the present disclosure.

H1/66:

An 80 mm sintered yttrium oxide body was made from a powder having a surface area of 2.89 $m^2/g$, a d50 particle size of 5.4 μm and <10 ppm of TREO (total rare earth oxides) and total impurities of 48 ppm for a powder purity of 99.9952%. The body was formed at a sintering temperature of 1500° C. for 60 minutes at 30 MPa. Annealing was performed at a temperature ramp of 5° C./minute to 1450°

C. for 1 hour then 1400° C. for 8 hours in air. The sintered yttrium oxide body had density of 4.948 $g/cm^3$ and a maximum pore diameter of 1.1 μm. A d10, d50 and d90 grain size was measured at 0.5, 0.8 and 1.4 μm, respectively.

H2/65:

A 40 mm yttrium oxide sample was formed from a powder having a surface area of 6.84 $m^2/g$ at a sintering temperature of 1550° C. for 10 minutes at 30 MPa. Annealing was performed for four hours in a furnace at a temperature of 1300° C. in air. The starting yttrium oxide powder had total purity of 99.999% corresponding to 10 ppm. The median particle size was measured to be 5.82 μm. The sintered yttrium oxide body had a total impurity level of 11 ppm. Purity of the starting powder was maintained in the sintered yttrium oxide body, indicating very minimal to no contaminants were introduced during processing. A d10, d50 and d90 grain size was measured at 4.0, 13.0 and 27.1 μm, respectively and an average grain size of 14 μm was measured.

H3/79:

A 40 mm sintered yttrium oxide body was formed from a powder having a surface area of 3.33 $m^2/g$ and median (d50) particle size of 5.17 μm. The starting powder had total impurities of between 2 and 4 ppm. Sintering of the yttrium oxide body was performed using a sintering temperature of 1500° C. for a duration of 10 minutes at a pressure of 30 MPa. Temperature was ramped at 50° C./minute with simultaneous pressure application at 5 MPa/minute. Annealing was performed by ramping the temperature at 5° C./minute to 1300° C. and holding for four hours in air. The sintered yttrium oxide body had a total impurity level of between 9 and 10 ppm, indicating minimal introduction of contaminants as a result of the process. The maximum pore size was measured to be 0.6 μm and density of 5.03 g/cc was measured. A d10, d50 and d90 grain size was measured at 0.8, 1.4 and 2.4 μm, respectively. An average grain size of 1.47 μm was also measured.

H4/152:

A 100 mm sintered yttrium oxide body was formed from a powder having a surface area of 6.95 $m^2/g$ and 99.999% purity of TREO (<10 ppm) and an average total impurity of 18 ppm. The median particle size (d50) was 4.65 μm. Sintering was performed at 1400° C. for 30 minutes at 30 MPa. Thereafter annealing was performed in air at 1400° C. for 8 hours. A density of 5.024 $g/cm^3$ was measured with a maximum pore size of 2 μm. After a two-step $CF_4/O_2$ etch process as disclosed herein, an average step height of 0.98 μm, an average etch rate of 0.68 nm/min and an etch volume of 340,000 $\mu m^3$ were obtained. Before and after a two-step $CF_4/O_2$ etch process as disclosed herein, an arithmetical mean height (Sa) of 10 and 14 nm respectively were measured. After an oxygen etch process as disclosed herein, an average step height of 0.1 μm, an average etch rate of 0.07 nm/min and an etch volume of 30,000 $\mu m^3$ were obtained. After an $SF_6$ etch process as disclosed herein, an average step height of 0.28 μm, an average etch rate of 0.19 nm/min and an etch volume of 90,000 $\mu m^3$ were obtained.

Single Step, $CF_4$ Etch Procedure

To assess etch performance, polished ceramic samples of dimension 6 mm×6 mm×2 mm were mounted onto a c plane sapphire wafer using a silicone-based heat sink compound. Regions of each part were blocked from exposure to the etch process by bonding a 5 mm×5 mm square sapphire ceramic to the sample surface.

The dry etch process was performed using a Plasma-Therm Versaline DESC PDC Deep Silicon Etch which is standard equipment for the industry. Etching was completed in 4 hour etch segments for a total duration of 24 hours. The process was conducted at a pressure of 10 millitorr with a $CF_4$ flow rate of 90 standard cubic centimeters per minute (sccm), an oxygen flow of 30 sccm, and Argon flow of 20 sccm. The bias was 600 volts and 2000 watts ICP power. This etch recipe has a silicon etch rate of 512 nm/minute. The etch recipe etches fused silica (quartz glass) at a rate of 72 nm/minute. The etch conditions as used here to assess sample performance were selected to subject the disclosed materials to extreme etch conditions in order to differentiate performance.

Upon completion of the etch procedure, surface roughness was measured.

Single Step, $CF_4$ Etch Volume Procedure:

In an embodiment, the sintered yttrium oxide body is characterized by an etch volume of less than about 12000 $\mu m^3$, preferably less than about 9000 $\mu m^3$, more preferably less than about 7000 $\mu m^3$. This etch volume is realized in case an etch process as reference process is carried in which a sample of the dimension of 6 mm×6 mm×2 mm is subjected to etching conditions at a pressure of 10 millitorr with a $CF_4$ flow rate of 90 standard cubic centimetres per minute (sccm), an oxygen flow of 30 standard cubic centimetres per minute (sccm), and argon flow of 20 standard cubic centimetres per minute (sccm), a bias of 600 volts and 2000 watt ICP power for 24 hours. The respective etch process is described in more detail further below in the experimental section. Thereby, the etch volume relates to the volume of the yttrium oxide body being removed during the indicated etch process.

Single Step, $CF_4$ Etch Rate Procedure:

In some embodiments, the yttrium oxide body is characterized by exhibiting an etch rate of less than about 0.08 nm/min, preferably less than about 0.06 nm/min, more preferably less than about 0.05 nm/min. This etch rate is realized in case a single step CF4 etch process as reference process is carried in which a sample of the dimension of 6 mm×6 mm×2 mm is subjected to etching conditions at a pressure of 10 millitorr with a $CF_4$ flow rate of 90 standard cubic centimetres per minute (sccm), an oxygen flow of 30 standard cubic centimetres per minute (sccm), and argon flow of 20 standard cubic centimetres per minute (sccm), a bias of 600 volts and 2000 watt ICP power for a duration of 24 hours. Thereby, the etch rate relates to the thickness reduction of the yttrium oxide body being removed during the indicated etch process.

Single Step $CF_4$ Sdr Procedure (Unetched, Etched)

In some embodiments, the sintered yttrium oxide body is characterized by having a developed interfacial area ratio in an unetched area of less than $100\times10^{-5}$, more preferably less than $75\times10^{-5}$, most preferably less than $50\times10^{-5}$, according to ISO standard 25178-2-2012, section 4.3.2; and having a developed interfacial area ratio in an etched area of less than $600\times10^{-5}$, more preferably less than $500\times10^{-5}$, more preferably less than $400\times10^{-5}$, more preferably less than $300\times10^{-5}$, most preferably less than $200\times10^{-5}$, according to ISO standard 25178-2-2012, section 4.3.2. This latter developed interfacial ratio is realized in case a sample of the yttrium oxide body with a dimension of 6 mm×6 mm×2 mm is subjected to etching conditions at a pressure of 10 millitorr with a $CF_4$ flow rate of 90 standard cubic centimetres per minute (sccm), an oxygen flow of 30 standard cubic centimetres per minute (sccm), and argon flow of 20 standard cubic centimetres per minute (sccm), a bias of 600 volts and 2000 watt ICP power for 24 hours CF4 etch time. The respective etch process is described in more detail further below.

Single Step $CF_4$ Sa (Unetched, Etched)

In some embodiments, the sintered yttrium oxide body is further characterized by having an arithmetical mean height Sa of less than 30 nm, more preferably less than 28 nm, most preferably less than 25 nm, according to ISO standard 25178-2-2012, section 4.1.7; and with an arithmetical mean height Sa of less than 40 nm, more preferably loss than 35 nm, most preferably less than 30 nm, according to ISO standard 25178-2-2012, section 4.1.7. The latter arithmetical mean height Sa is realized in case a sample of the yttrium oxide body with a dimension of 6 mm×6 mm×2 mm is subjected to etching conditions at a pressure of 10 millitorr with a $CF_4$ flow rate of 90 standard cubic centimetres per minute (sccm), an oxygen flow of 30 standard cubic centimetres per minute (sccm), and argon flow of 20 standard cubic centimetres per minute (sccm), a bias of 600 volts and 2000 watt ICP power for a duration of 24 hours. The respective etch process is described in more detail further below.

Surface Roughness Measurement

Surface roughness measurements were performed using a Keyence 3D laser scanning confocal digital microscope model VK-X250X under ambient conditions in a class 1 cleanroom. The microscope rests on a TMC tabletop CSP passive benchtop isolator with 2.8 Hz Natural Frequency.

This non-contact system uses laser beam light and optical sensors to analyze the surface through reflected light intensity. The microscope acquires 1,024 data points in the x direction and 786 data points in the y direction for a total of 786,432 data points. Upon completion of a given scan, the objective moves by the pitch set in the z direction and the intensity is compared between scans to determine the focus. The ISO 25178 Surface Texture (Areal Roughness Measurement) is a collection of international standards relating to the analysis of surface roughness with which this microscope is compliant.

The surface of samples was laser scanned using the confocal microscope at 10× magnification to capture a detailed image of the sample. Line roughness was obtained on a profile of 7 partitioned blocks. The lambda chi(λ), which represents the measurement sampling lengths, was adjusted so that the line reading was limited to measurements from the 5 middle blocks of the 7 according to ISO specification 4288: Geometrical Product Specifications (GPS)—Surface texture: Profile method—Rules and procedures for the assessment of surface texture.

Areas were selected within etched and masked regions of a sample for measurement. Areas were selected to be most representative of the typical sample surface and used to calculate Sa and Sdr.

The surface roughness Sa and Sdr are well-known parameters in the underlying technical field and, for example, described in ISO standard 25178-2-2012, section 4.1.7 (surface roughness Sa) and 4.3.2 (surface roughness Sdr).

Step Height Measurements

The step height as a result of etch processing was directly measured by using the Keyence 3D laser scanning confocal digital microscope model VK-X250X at a magnification of 20×. Selected areas in etched and unetched regions of a sample were used to create separate reference planes. The average height difference across three measurements between these reference planes may be taken as the step height.

Etch Rate Calculation

An average etch rate in nanometers per hour may be calculated from the average step height by dividing the step height by the total etch time to arrive at an etching rate in nanometers per minute.

Volume Measurements

Etched volume was calculated from measurements on the Keyence 3D laser scanning confocal digital microscope model VK-X250X at 50×. A 7×7 image template is created, from which a 7×1 region is selected for measurement. A reference plane is first established on a representative region of the sample which has been masked and therefore unetched. To establish the reference plane, an area within the masked region is selected. A software enabled tilt correction is completed across the area to account for variations in sample thickness and mounting. Thereafter, a total area of 600 μm×200 μm is selected in the etched region of the image at a maximum distance from the masked surface. The height of the etched surface as compared to the reference plane created upon the masked surface is measured, and a volume of material removed by etching with respect to the reference plane is calculated across the selected area.

Differences Between Ra and Sa Measurements

Sa is the arithmetical mean height of the surface and described within ISO 25178: Geometric Product Specifications (GPS)—Surface texture: areal is an International Organization for Standardization collection of international standards relating to the analysis of 3D areal surface texture. This is based upon non-contact laser microscopy.

Ra is the arithmetic mean roughness of the 2D profile according to ISO 4287:1997 Geometrical Product Specifications (GPS)—Surface texture: Profile method. This is based upon a mechanical stylus in contact with the surface to create a linear profile.

Sa represents height differences across a 3D measurement surface, while Ra represents height differences across a 2D linear profile scan.

Ra is limited by the stylus tip geometry and as such may result in loss of fine feature detail and distortion of peaks and valleys. This becomes problematic when measuring fine, submicron features and is a limitation in the use of Ra values to compare with Sa values.

Additional samples were made according to the process of the present invention and are summarized in the tables below. Where applicable they are compared to commercially available quartz (TSC 03) and comparator yttrium oxide samples (107, 108, and 118).

As an example, sample 188-1 was made as follows: A yttrium oxide powder having a surface area of 3.3 $m^2/g$ and 13 ppm total impurities, corresponding to a powder purity of 99.9987% was used to form a 100 mm yttrium oxide sintered body. Preapplication of pressure was performed in a multiple step process whereby 20 MPa pressure was pre-applied under vacuum. Thereafter 5 MPa was applied simultaneous to heating at rate of 10° C./min from room temperature to 600° C. Pressure was increased to 30 MPa between 600° C. and the sintering temperature at a rate of 10° C./minute. Sintering was performed at a temperature of 1400° C. and pressure of 30 MPa for a duration of 30 minutes to complete sintering. After sintering, power was shut off to the sintering apparatus, allowing for natural cooling. Annealing was performed at a temperature of 1400° C. for 8 hours in an oxygen containing environment. The density was 5.002 $g/cm^3$.

In another example, sample 116 was made as follows: A 40 mm yttrium oxide sample was formed from a powder having a surface area of 6.84 $m^2/g$ at a sintering temperature of 1550° C. for 10 minutes at 30 MPa. Annealing was performed for nine hours in a furnace at a temperature of between 1400 and 1450° C. in air. The starting yttrium oxide powder had total purity of 99.999% corresponding to 10 ppm. The median particle size was measured to be 5.82 μm. The sintered yttrium oxide body had a total impurity level of 11 ppm. Purity of the starting powder was maintained in the sintered yttrium oxide body, indicating very minimal to no contaminants were introduced during processing. A d10, d50 and d90 grain size was measured at 0.7, 6.7 and 25.4 μm, respectively.

In another example, sample 224 was made as follows: A yttrium oxide powder having a surface area of 5 to 6 $m^2/g$ and an average of 8 ppm total impurities corresponding to a powder purity of 99.9992% was used to form a 100 mm yttrium oxide sintered body. Pressure was pre-applied at 20 MPa for about 5 minutes and 50 millitorr vacuum established. Thereafter, pressure was reduced to 5 MPa and heating to 600° C. was accomplished at a rate of 10° C./minute. Simultaneous application of heat and pressure were performed to reach a pressure of 20 MPa and temperature application at a rate of 10° C./min to 1400° C. Sintering was performed at a temperature of 1400° C. and pressure of 20 MPa for a duration of 30 minutes to complete sintering. After sintering, power was shut off to the sintering apparatus allowing for natural cooling. The sintered yttrium oxide body had a d10, d50 and d90 grain size of 0.4, 0.7 and 1.2 μm, respectively.

In another example, sample 189-1 was made as follows: A yttrium oxide powder having a surface area of 4.2 $m^2/g$ and 24.8 ppm total impurities, corresponding to a powder purity of 99.9975% was used to form a 100 mm yttrium oxide sintered body. Preapplication of pressure was performed in a multiple step process whereby 20 MPa pressure was pre-applied under vacuum. Thereafter 5 MPa was applied simultaneous to heating at rate of 10° C./min from room temperature to 600° C. Pressure was increased to 30 MPa between 600° C. and the sintering temperature at a rate of 10° C./minute. Sintering was performed at a temperature of 1400° C. and pressure of 30 MPa for a duration of 30 minutes to complete sintering. After sintering, power was shut off to the sintering apparatus, allowing for natural cooling. Annealing was performed at a temperature of 1400° C. for 8 hours in an oxygen containing environment. The sintered yttrium oxide body had impurities of 36 ppm and a purity of 99.996%. The density of the annealed and sintered yttrium oxide body was 5.006 $g/cm^3$ and had a maximum pore size of 0.7 microns. After a two-step $CF_4/O_2$ etch process as disclosed herein, an average step height of 0.82 μm, an average etch rate of 0.57 nm/min and an etch volume of 270,000 $μm^3$ were obtained.

In another example, sample 045 was made as follows: A yttrium oxide powder having a surface area of 9 to 10 $m^2/g$ and 26 ppm total impurities, corresponding to a powder purity of 99.9974% was used to form a 100 mm yttrium oxide sintered body. Preapplication of pressure was performed in a multiple step process whereby 20 MPa pressure was pre-applied under vacuum as disclosed herein. Thereafter 5 MPa was applied simultaneous to heating at rate of 10° C./min from room temperature to 600° C. Pressure was increased to 30 MPa between 600° C. and the sintering temperature at a rate of 10° C./minute. Sintering was performed at a temperature of 1400° C. and pressure of 30 MPa for a duration of 30 minutes to complete sintering. After sintering, power was shut off to the sintering apparatus, allowing for natural cooling. An average density using the Archimedes method was measured to be 5.021 $g/cm^3$. Annealing was performed at a temperature of 1400° C. for 8 hours in an oxygen containing environment. An average density after annealing using the Archimedes method was measured to be 5.010 $g/cm^3$.

In another example, sample 200-1 was made as follows: A yttrium oxide powder having a surface area of 4.7 $m^2/g$ and 9.5 ppm total impurities corresponding to a powder purity of 99.9991% was used to form a 150 mm yttrium oxide sintered body. Pressure was pre-applied at 20 MPa for about 5 minutes. Thereafter, pressure was reduced to 5 MPa and heating to 600° C. was accomplished at a rate of 25° C./minute. Simultaneous application of heat and pressure were performed at a heating rate of 25° C./min and a pressure rate of 5 MPa/min to 1000° C. and 20 MPa. Heating at a rate of 10° C./minute was performed between 1000° C. to the sintering temperature. Sintering was performed at a temperature of 1400° C. and pressure of 20 MPa for a duration of 30 minutes to complete sintering. After sintering, power was shut off to the sintering apparatus allowing for natural cooling. Annealing was performed at a temperature of 1400° C. for 8 hours in an oxygen containing environment. The density of the annealed and sintered yttrium oxide body was 4.945 $g/cm^3$ and had a maximum pore size of 1.4 microns. After a two-step $CF_4/O_2$ etch process as disclosed herein, an average step height of 0.2 μm, an average etch rate of 0.14 nm/min and an etch volume of 60,000 $μm^3$ were obtained. After an oxygen etch process as disclosed herein, an average step height of 0.1 μm, an average etch rate of 0.07 nm/min and an etch volume of 30,000 $μm^3$ were obtained. After an $SF_6$ etch process as disclosed herein, an average step height of 0.27 μm, an average etch rate of 0.19 nm/min and an etch volume of 80,000 μm3 were obtained.

In another example, sample 212-1 was made as follows: A yttrium oxide powder having a surface area of 5.6 $m^2/g$ and 8.1 ppm total impurities corresponding to a powder purity of 99.9992% was used to form a 100 mm yttrium oxide sintered body. Pressure was pre-applied at 20 MPa for about 5 minutes and 50 millitorr vacuum established. Thereafter, pressure was reduced to 5 MPa and heating to 600° C. was accomplished at a rate of 50° C./minute. Simultaneous application of heat and pressure were performed at a pressure rate of 10 MPa/min and temperature application at a rate of 25° C./min to 30 MPa and 1450° C. Sintering was performed at a temperature of 1450° C. and pressure of 30 MPa for a duration of 30 minutes to complete sintering. After sintering, power was shut off to the sintering apparatus allowing for natural cooling. Annealing was performed at a temperature of 1400° C. for 8 hours in an oxygen containing environment. The density of the annealed and sintered yttrium oxide body was 5.022 $g/cm^3$ and had a maximum pore size of 1.0 micron. The sintered yttrium oxide body had a total average impurity of 6 ppm, corresponding to purity of 99.9994%. After a two-step $CF_4/O_2$ etch process as disclosed herein, an average step height of 1.1 μm, an average etch rate of 0.77 nm/min and an etch volume of 358,000 $μm^3$ were obtained.

In another example, sample 314 was made as follows: A yttrium oxide powder having a surface area of 2.8 $m^2/g$ and 24.8 ppm total impurities corresponding to a powder purity of 99.9975% was used to form a yttrium oxide sintered body having a longest dimension of 406 mm. Pressure was pre-applied at 5 MPa and temperature was ramped from room temperature at 10° C./minute to 800° C. Simultaneous application of heat and pressure were performed at a heating rate of 10° C./min and pressure ramping to 20 MPa from between 800° C. to 1000° C. Pressure was maintained at 20 MPa from 1000° C. to the sintering temperature with a heating rate of 10° C./min. Sintering was conducted at a temperature of 1450° C. and pressure of 20 MPa for a sintering duration of 60 minutes. The heat and pressure were terminated after the sintering duration and natural cooling occurred. The sintered yttrium oxide body was annealed in an oxygen containing environment at 1400° C. for 8 hours using a heating and cooling rate of 0.8° C./minute. The average density of the annealed and sintered yttrium oxide body was 4.935 g/cm$^3$ with a density range across the longest dimension of between 4.898 and 4.970 g/cm$^3$.

In another example, sample 457 was made as follows: A yttrium oxide powder having a surface area of 5-6 m$^2$/g and 17 ppm total impurities corresponding to a powder purity of 99.9983% was used to form a yttrium oxide sintered body having a longest dimension of 406 mm. Calcination of the powder was performed at 600° C. for 8 hours with a surface area of 5-6 m$^2$/g. Pressure was pre-applied at 5 MPa and temperature was ramped from room temperature at 10° C./minute to 600° C. Simultaneous application of heat and pressure were performed at a heating rate of 5° C./min and pressure ramping to 30 MPa from between 600° C. to 1000° C. Pressure was maintained at 30 MPa from 1000° C. to the sintering temperature with a heating rate of 5° C./min. Sintering was conducted at a temperature of 1475° C. and pressure of 30 MPa for a sintering duration of 60 minutes. The pressure was removed after the sintering duration. Cooling was performed using forced convection at 50% blower power for about 4 hours. Cooling using varying blower power levels from about 25% to 100% enables forced convection cooling rates of between 2.5° C./min to 5° C./min. Sintering was conducted at a temperature of 1475° C. and pressure of 30 MPa for a duration of 60 minutes. The sintered yttrium oxide body was annealed in an oxygen containing environment at 1400° C. for 4 hours using a heating rate of 0.8° C./minute and a cooling rate of 2° C./minute. The average density of the annealed and sintered yttrium oxide body was 4.985 g/cm$^3$ with a density range across the longest dimension of between 4.980 and 4.989 g/cm$^3$. A maximum pore size was measured to be 1.4 μm, and an Sa value of 18 nm and Sdr value of $1178\times10^{-5}$ were measured after a $CF_4/O_2$ etch process as disclosed. An average grain size of 0.65 μm was measured using line intercept techniques for this sample.

In another example, sample 353 was made as follows: A yttrium oxide powder having a surface area of 6.5 to 7.5 m$^2$/g and an average of 11 ppm total impurities corresponding to a powder purity of 99.9989% was used to form a yttrium oxide sintered body having a longest dimension of 406 mm. Calcination of the powder was performed at 1000° C. for 24 hours and the surface area was 1.5 to 2.5 m$^2$/g. Pressure was pre-applied at 5 MPa and temperature was ramped from room temperature at 10° C./minute to 800° C. Simultaneous application of heat and pressure were performed at a heating rate of 10° C./min and pressure ramping to 30 MPa from between 800° C. to 1000° C. Pressure was maintained at 30 MPa from 1000° C. to the sintering temperature with a heating rate of 10 C/min. Sintering was conducted at a temperature of 1475° C. and pressure of 30 MPa for a sintering duration of 60 minutes. The heat and pressure were terminated after the sintering duration and natural cooling occurred. The sintered yttrium oxide body was annealed in an oxygen containing environment at 1400° C. for 0 minutes (without an isothermal annealing duration) at a heating rate of 0.8° C./minute and passive cooling rate of 0.8° C./minute. The average density of the annealed and sintered yttrium oxide body was 4.981 g/cm$^3$.

In another example, sample 414 was made as follows: A yttrium oxide powder having a surface area of 6.5 to 7.5 m$^2$/g and an average of 11 ppm total impurities corresponding to a powder purity of 99.9989% was used to form a yttrium oxide sintered body having a longest dimension of 406 mm. Calcination of the powder was performed at 500° C. for 48 hours and the surface area was 6.5 to 7.5 m$^2$/g. Pressure was pre-applied at 5 MPa and temperature was ramped from room temperature at 10° C./minute to 800° C. Simultaneous application of heat and pressure were performed at a heating rate of 10° C./min and pressure ramping to 30 MPa from between 800° C. to 1000° C. Pressure was maintained at 30 MPa from 1000° C. to the sintering temperature with a heating rate of 10° C./min. Sintering was conducted at a temperature of 1400° C. and pressure of 30 MPa for a sintering duration of 60 minutes. The heat and pressure were terminated after the sintering duration and natural/passive cooling occurred. The average density of the annealed and sintered yttrium oxide body was 4.985 g/cm$^3$.

In yet another example, sample 476 was made as follows: A yttrium oxide powder having a surface area of 2 m$^2$/g and 5-6 ppm total impurities corresponding to a powder purity of 99.9995% was used to form a yttrium oxide sintered body having a longest dimension of 406 mm. The powder was tumbled for 24 hours prior to sintering without use of milling media. Pressure was pre-applied at 5 MPa and temperature was ramped from room temperature at 10° C./minute to 600° C. Simultaneous application of heat and pressure were performed at a heating rate of 5° C./min and pressure ramping to 30 MPa from between 600° C. to 1000° C. Pressure was maintained at 30 MPa from 1000° C. to the sintering temperature with a heating rate of 5° C./min. Sintering was conducted at a temperature of 1475° C. and pressure of 30 MPa for a sintering duration of 60 minutes. The pressure was removed after the sintering duration. Cooling was performed using forced convection at 50% blower power. Cooling using varying blower power levels enables forced convection cooling rates of between 2.5° C./min to 5° C./min. The sintered yttrium oxide body was annealed in an oxygen containing environment at 1400° C. for 4 hours using a heating rate of 1° C./minute and cooling rate of 2° C./minute. The average density of the annealed and sintered yttrium oxide body was 4.953 g/cm$^3$ with a density range across the longest dimension of between 4.891 and 5.014 g/cm$^3$.

In a set of examples, samples 084 and 084-1, 085 and 085-1, 086 and 086-1, 087 and 087-1, 095 and 096 were made as follows: 100 mm yttrium oxide sintered bodies corresponding to samples 084 and 084-1, 085 and 085-1, 086 and 086-1, 087 and 087-1, 095 and 096 were prepared from a powder having a surface area of between 6.5 to 7.5 m$^2$/g and an average of 11 ppm total impurities, providing a powder purity of 99.9989%. The powder was calcined prior to sintering at 800° C. for 8 hours and had a surface area of 5 to 6.5 m$^2$/g. Samples 084-1, 085-1, 086-1, 087-1, 095 and 096 were annealed at 1400° C. at a ramp rate of 5° C./minute for 8 hours in an oxygen environment. Densities and process conditions are as disclosed in the corresponding density and sintering/annealing tables herein.

Comparator Sample 107: The purity of a comparator yttrium oxide body was measured by ICPMS methods to be 99.9958%, having 42 ppm of contaminants. Porosity measurements were performed as disclosed herein, and a maximum pore size of 38 μm was measured. Grain size measurements were performed and a large average grain size of 27 μm was measured. The material was measured to have an average density of 4.987 g/cm$^3$ using the Archimedes method with a standard deviation of 0.038. Although the exact sintering conditions are unknown, in order to sinter yttrium oxide powder to form this material, it is probable that high sintering temperatures in excess of 1600° C. for extended times such as several days, were used. These parameters would contribute to the large grain size measured. The sample exhibited significant fractional area of porosity with large pore sizes and an inferior etch performance and extensive surface roughening relative to the sintered yttrium oxide as disclosed.

Comparator Sample 108: Material properties of a comparator yttrium oxide body were analyzed. The purity of a comparator yttrium oxide body was measured by ICPMS methods to be 99.8356%, having 1644 ppm of contaminants including 1291 ppm of zirconia as a sintering aid to promote densification. Porosity measurements were performed as disclosed herein, and a maximum pore size of 12 μm was measured. The material was measured to have an average density of 4.997 g/cc using the Archimedes method with a standard deviation of 0.011. Although the exact sintering conditions are unknown, in order to sinter yttrium oxide to form this material, it is probable that the zirconia was added to the powder to promote densification which may degrade etch performance. The sample exhibited significant fractional area of porosity with large pore sizes and surface roughening relative to the sintered yttrium oxide as disclosed.

Comparator Sample 118: The purity of a comparator yttrium oxide body was measured by ICPMS methods to be 99.9967%, having 33 ppm of contaminants. Porosity measurements were performed as disclosed herein, and a maximum pore size of 7 μm was measured. The material was measured to have an average density of 5.003 g/cc using the Archimedes method. The sample exhibited significant fractional area of porosity with large pore sizes and an inferior etch performance relative to the sintered yttrium oxide as disclosed.

Tables 4 to 7 summarize the process conditions and resulting densities of samples prepared according to the process of the present disclosure.

TABLE 4

Sintering and Annealing Conditions of Sintered Yttrium Oxide Bodies Sintering and Annealing Parameters

| Sample | Sintering T (° C.) | Sintering P (MPa) | Sintering Time (min) | Anneal Temp (° C.) | Anneal Time (hour) |
|---|---|---|---|---|---|
| 45 | 1400 | 30 | 30 | none | none |
| 45-1 | 1400 | 30 | 30 | 1400 | 8 |
| 84 | 1550 | 10 | 30 | none | none |
| 85 | 1300 | 40 | 30 | none | none |
| 86 | 1300 | 50 | 30 | none | none |
| 87 | 1300 | 60 | 30 | none | none |
| 95 | 1200 | 40 | 30 | none | none |
| 96 | 1300 | 30 | 30 | none | none |
| H4/152 | 1400 | 30 | 30 | 1400 | 8 |
| 187 | 1400 | 15 | 30 | 1400 | 8 |
| 212 | 1450 | 30 | 30 | none | none |
| 282 | 1400 | 20 | 30 | none | none |
| 294 | 1400 | 30 | 30 | none | none |
| 308 | 1500 | 30 | 30 | none | none |
| 314 | 1450 | 20 | 60 | 1400 | 8 |
| 317 | 1475 | 30 | 30 | none | none |
| 317-5 | 1475 | 30 | 30 | 1400 | 8 |
| 319 | 1475 | 30 | 30 | none | none |
| 319-5 | 1475 | 30 | 30 | 1400 | 8 |
| 323 | 1475 | 30 | 30 | none | none |
| 323-1 | 1475 | 30 | 30 | 1300 | 0 |
| 328 | 1475 | 30 | 30 | none | none |
| 328-1 | 1475 | 30 | 30 | 1400 | 8 |

TABLE 4-continued

Sintering and Annealing Conditions of Sintered Yttrium Oxide Bodies Sintering and Annealing Parameters

| Sample | Sintering T (° C.) | Sintering P (MPa) | Sintering Time (min) | Anneal Temp (° C.) | Anneal Time (hour) |
|---|---|---|---|---|---|
| 329 | 1475 | 30 | 30 | none | none |
| 329-1 | 1475 | 30 | 30 | 1400 | 8 |
| 334 | 1475 | 30 | 30 | none | none |
| 334-1 | 1475 | 30 | 30 | 1400 | 8 |
| 341 | 1450 | 30 | 60 | 1300 | 0 |
| 353 | 1475 | 30 | 60 | 1400 | 0 |
| 374 | 1475 | 30 | 30 | none | none |
| 374-1 | 1475 | 30 | 30 | 1400 | 8 |
| 385 | 1450 | 30 | 30 | none | none |
| 385-1 | 1450 | 30 | 30 | 1400 | 8 |
| 386 | 1475 | 20 | 30 | none | none |
| 386-1 | 1475 | 20 | 30 | 1400 | 8 |
| 414 | 1400 | 30 | 60 | none | none |
| 440 | 1450 | 30 | 30 | none | none |
| 440-1 | 1450 | 30 | 30 | 1400 | 8 |
| 442 | 1450 | 20 | 30 | none | none |
| 442-1 | 1450 | 20 | 30 | 1400 | 8 |
| 447 | 1450 | 30 | 60 | 1400 | 1 |
| 457 | 1475 | 30 | 60 | 1400 | 4 |
| 476 | 1475 | 30 | 60 | 1400 | 4 |
| 481 | 1500 | 30 | 30 | none | none |
| 11 | 1400 | 30 | 30 | none | none |
| 200 | 1400 | 20 | 30 | none | none |
| 200-1 | 1400 | 20 | 30 | 1400 | 8 |
| 282-1 | 1400 | 20 | 30 | 1300 | 0 |
| 282-10 | 1400 | 20 | 30 | 1300 | 24 |
| 282-11 | 1400 | 20 | 30 | 1400 | 24 |
| 282-2 | 1400 | 20 | 30 | 1400 | 0 |
| 282-3 | 1400 | 20 | 30 | 1500 | 0 |
| 282-4 | 1400 | 20 | 30 | 1300 | 6 |
| 282-5 | 1400 | 20 | 30 | 1400 | 6 |
| 282-6 | 1400 | 20 | 30 | 1500 | 6 |
| 282-7 | 1400 | 20 | 30 | 1300 | 12 |
| 282-8 | 1400 | 20 | 30 | 1400 | 12 |
| 282-9 | 1400 | 20 | 30 | 1500 | 12 |
| 294-1 | 1400 | 30 | 30 | 1300 | 0 |
| 294-10 | 1400 | 30 | 30 | 1300 | 24 |
| 294-11 | 1400 | 30 | 30 | 1400 | 24 |
| 294-2 | 1400 | 30 | 30 | 1400 | 0 |
| 294-3 | 1400 | 30 | 30 | 1500 | 0 |
| 294-4 | 1400 | 30 | 30 | 1300 | 6 |
| 294-5 | 1400 | 30 | 30 | 1400 | 6 |
| 294-6 | 1400 | 30 | 30 | 1500 | 6 |
| 294-7 | 1400 | 30 | 30 | 1300 | 12 |
| 294-8 | 1400 | 30 | 30 | 1400 | 12 |
| 294-9 | 1400 | 30 | 30 | 1500 | 12 |
| 317-5 | 1475 | 30 | 30 | 1400 | 8 |
| 319-5 | 1475 | 30 | 30 | 1400 | 8 |
| 323-1 | 1475 | 30 | 30 | 1300 | 0 |
| 328-1 | 1475 | 30 | 30 | 1400 | 8 |
| 329-1 | 1475 | 30 | 30 | 1400 | 8 |
| 334-1 | 1475 | 30 | 30 | 1400 | 8 |
| 374-1 | 1475 | 30 | 30 | 1400 | 8 |
| 385-1 | 1450 | 30 | 30 | 1400 | 8 |
| 386-1 | 1475 | 20 | 30 | 1400 | 8 |
| 440-1 | 1450 | 30 | 30 | 1400 | 8 |
| 442-1 | 1450 | 20 | 30 | 1400 | 8 |
| 45-1 | 1400 | 30 | 30 | 1400 | 8 |
| 467 | 1475 | 60 | 30 | none | none |
| 489-1 | 1575 | 30 | 10 | none | none |
| 489-5 | 1550 | 30 | 10 | none | none |
| 489-6 | 1600 | 30 | 10 | none | none |
| 85-1 | 1300 | 40 | 30 | 1400 | 8 |
| 86-1 | 1300 | 50 | 30 | 1400 | 8 |
| 87-1 | 1300 | 60 | 30 | 1400 | 8 |
| H1/66 | 1500 | 30 | 60 | 1400-1450 | 9 |
| H2/65 | 1550 | 30 | 10 | 1300 | 4 |
| H3/79 | 1500 | 30 | 10 | 1300 | 4 |
| 188-1 | 1400 | 30 | 30 | 1400 | 8 |
| 188 | 1400 | 30 | 30 | none | none |
| 189-1 | 1400 | 30 | 30 | 1400 | 8 |
| 212-1 | 1450 | 30 | 30 | 1400 | 8 |

TABLE 4-continued

| Sintering and Annealing Conditions of Sintered Yttrium Oxide Bodies Sintering and Annealing Parameters | | | | | |
|---|---|---|---|---|---|
| Sample | Sintering T (° C.) | Sintering P (MPa) | Sintering Time (min) | Anneal Temp (° C.) | Anneal Time (hour) |
| 186-1 | 1400 | 30 | 30 | 1400 | 8 |
| 224 | 1400 | 20 | 30 | none | none |
| 116 | 1550 | 30 | 10 | 1400-1450 | 9 |

TABLE 5

| Density for 150 mm Sintered Yttrium Oxide Bodies 150 mm Dimension | | | |
|---|---|---|---|
| Sample Identifier | Average Density (g/cc) | Std Dev (g/cc) | % TD |
| 200 | 4.966 | 0.016 | 98.726 |
| 200-1 | 4.945 | 0.010 | 98.318 |
| 11 | 5.021 | 0.002 | 99.819 |
| 467 | 5.026 | 0.001 | 99.928 |

TABLE 6

| Density for 40 mm Sintered Yttrium Oxide Bodies 40 mm Dimension | | | |
|---|---|---|---|
| Sample Identifier | Average Density (g/cc) | Std Dev (g/cc) | % TD |
| 489-1 | 5.020 | 0.008 | 99.806 |
| 489-5 | 5.016 | 0.012 | 99.712 |
| 489-6 | 5.023 | 0.003 | 99.856 |
| H3/79 | 5.03 | 0.005 | 100 |

TABLE 7

| Density and Density Variation for 406 mm Sintered Yttrium Oxide Bodies 406 mm dimension | | | |
|---|---|---|---|
| Sample | Std Dev | % TD | Max Density Variation (%) |
| 314 | 0.003 | 98.115 | 1.441 |
| 476 | 0.003 | 98.513 | 2.353 |
| 414 | 0.006 | 99.165 | 0.548 |
| 447 | 0.006 | 99.397 | 1.100 |
| 457 | 0.007 | 99.104 | 0.130 |
| 341 | 0.002 | 99.583 | N/A |
| 353 | 0.001 | 99.026 | N/A |

TABLE 8

| Properties for Comparator Samples | | | | |
|---|---|---|---|---|
| Comparator | Average Density | impurity (ppm) | % purity | Max Pore Size (um) |
| TSC-03 | N/A | <5 ppm | 99.9999+ | N/A |
| 107 | 4.987 | 42 | 99.9958 | 38 |
| 108 | 4.997 | 1644 | 99.8356 | 12 |
| 118 | 5.003 | 52 | 99.9948 | 7 |

Tables 9 and 10 summarize purities measured for starting powders and sintered yttrium oxide samples made according to the process disclosed herein.

TABLE 9

| Purity Characteristics for Sintered Yttrium Oxide Bodies | | | |
|---|---|---|---|
| Sample | Powder impurity range (ppm) | Average impurity (ppm) | Average % powder purity |
| 84 | 9.6-35.4 | 15 | 99.9985 |
| 187 | 6.3-9.1 | 7.7 | 99.9992 |
| 282 | 24.8-45.7 | 35.3 | 99.9965 |
| 282-1 | 24.8-45.7 | 35.3 | 99.9965 |
| 282-2 | 24.8-45.7 | 35.3 | 99.9965 |
| 282-3 | 24.8-45.7 | 35.3 | 99.9965 |
| 282-4 | 24.8-45.7 | 35.3 | 99.9965 |
| 282-5 | 24.8-45.7 | 35.3 | 99.9965 |
| 282-6 | 24.8-45.7 | 35.3 | 99.9965 |
| 282-7 | 24.8-45.7 | 35.3 | 99.9965 |
| 282-8 | 24.8-45.7 | 35.3 | 99.9965 |
| 282-9 | 24.8-45.7 | 35.3 | 99.9965 |
| 282-10 | 24.8-45.7 | 35.3 | 99.9965 |
| 282-11 | 24.8-45.7 | 35.3 | 99.9965 |
| 442 | 4.1-25.6 | 14.9 | 99.9985 |
| 442-1 | 4.1-25.6 | 14.9 | 99.9985 |
| 386 | 5.6-13 | 9.3 | 99.9991 |
| 386-1 | 5.6-13 | 9.3 | 99.9991 |
| 96 | 9.6-35.4 | 15 | 99.9985 |
| 294 | 24.8-45.7 | 35.3 | 99.9965 |
| 294-1 | 24.8-45.7 | 35.3 | 99.9965 |
| 294-2 | 24.8-45.7 | 35.3 | 99.9965 |
| 294-3 | 24.8-45.7 | 35.3 | 99.9965 |
| 294-4 | 24.8-45.7 | 35.3 | 99.9965 |
| 294-5 | 24.8-45.7 | 35.3 | 99.9965 |
| 294-6 | 24.8-45.7 | 35.3 | 99.9965 |
| 294-7 | 24.8-45.7 | 35.3 | 99.9965 |
| 294-8 | 24.8-45.7 | 35.3 | 99.9965 |
| 294-9 | 24.8-45.7 | 35.3 | 99.9965 |
| 294-10 | 24.8-45.7 | 35.3 | 99.9965 |
| 294-11 | 24.8-45.7 | 35.3 | 99.9965 |
| 152 | 9.6-35.4 | 15 | 99.9985 |
| 45 | 9.6-35.4 | 15 | 99.9985 |
| 45-1 | 9.6-35.4 | 15 | 99.9985 |
| 385 | 5.6-13 | 9.3 | 99.9991 |
| 385-1 | 5.6-13 | 9.3 | 99.9991 |
| 212 | 7.6-10 | 8.8 | 99.9991 |
| 440 | 4.1-25.6 | 14.9 | 99.9985 |
| 440-1 | 4.1-25.6 | 14.9 | 99.9985 |
| 323 | 24.8-45.7 | 35.3 | 99.9965 |
| 323-1 | 24.8-45.7 | 35.3 | 99.9965 |
| 317 | 7.6-10 | 8.8 | 99.9991 |
| 317-5 | 7.6-10 | 8.8 | 99.9991 |
| 319 | 9.6-35.4 | 15 | 99.9985 |
| 319-5 | 9.6-35.4 | 15 | 99.9985 |
| 328 | 24.8-45.7 | 35.3 | 99.9965 |
| 328-1 | 24.8-45.7 | 35.3 | 99.9965 |
| 329 | 24.8-45.7 | 35.3 | 99.9965 |
| 329-1 | 24.8-45.7 | 35.3 | 99.9965 |
| 334 | 24.8-45.7 | 35.3 | 99.9965 |
| 334-1 | 24.8-45.7 | 35.3 | 99.9965 |
| 374 | 5.6-13 | 9.3 | 99.9991 |
| 374-1 | 5.6-13 | 9.3 | 99.9991 |
| 308 | 9.6-35.4 | 15 | 99.9985 |
| 481 | 4.1-25.6 | 14.9 | 99.9985 |
| 95 | 9.6-35.4 | 15 | 99.9985 |
| 85 | 9.6-35.4 | 15 | 99.9985 |
| 85-1 | 9.6-35.4 | 15 | 99.9985 |
| 86 | 9.6-35.4 | 15 | 99.9985 |
| 86-1 | 9.6-35.4 | 15 | 99.9985 |
| 87 | 9.6-35.4 | 15 | 99.9985 |
| 87-1 | 9.6-35.4 | 15 | 99.9985 |
| 200 | 4.1-25.6 | 14.9 | 99.9985 |
| 200-1 | 4.1-25.6 | 14.9 | 99.9985 |
| 11 | 9.6-35.4 | 15 | 99.9985 |
| 467 | 4.1-25.6 | 14.9 | 99.9985 |
| 489-1 | 2.6-5.8 | 4.2 | 99.9996 |
| 489-5 | 2.6-5.8 | 4.2 | 99.9996 |

TABLE 9-continued

Purity Characteristics for Sintered Yttrium Oxide Bodies

| Sample | Powder impurity range (ppm) | Average impurity (ppm) | Average % powder purity |
|---|---|---|---|
| 489-6 | 2.6-5.8 | 4.2 | 99.9996 |
| 269 | 5.4-27.5 | 16.45 | 99.9984 |
| 314 | 24.8-45.7 | 35.25 | 99.9965 |
| 387 | 5.6-13 | 9.3 | 99.9991 |
| 476 | 5.6-13 | 9.3 | 99.9991 |
| 414 | 9.6-35.4 | 15 | 99.9985 |
| 447 | 4.1-25.6 | 14.85 | 99.9985 |
| 457 | 4.1-25.6 | 14.85 | 99.9985 |
| 341 | 24.8-45.7 | 35.25 | 99.9965 |
| 373 | 9.6-35.4 | 15 | 99.9985 |
| 353 | 9.6-35.4 | 15 | 99.9985 |

Table 10 shows the maintenance of purity during the process disclosed herein from the powder to the sintered yttrium oxide body.

TABLE 10

Purity from powder to sintered yttrium oxide body

| Sample | powder ppm range | Average ppm purity | average % powder purity | Sintered body contaminants (ppm) | Sintered body purity (%) |
|---|---|---|---|---|---|
| 189-1 | 24.8-45.7 | 35.25 | 99.9965 | 36.1 | 99.9964 |
| 79 | 2.6-5.8 | 4.2 | 99.9996 | 9.2 | 99.9991 |
| 212 | 7.6-10 | 8.8 | 99.9991 | 6.1 | 99.9994 |

Tables 11 to 13 show the etch results for different process gases on quartz (TSC 03) commercially available yttrium oxide parts (107, 108, 118) and on sintered yttrium oxide samples prepared according to the present disclosure, inclusive of the processing conditions. The $CF_4/O_2$ etching was conducted in a two-step process. Step 1 was performed with a pressure of 10 mtorr, $CF_4$ flow of 90 sccm, $O_2$ flow of 30 sccm, Argon flow of 20 sccm with a bias voltage of 600 V, power of 2000 W for 1500 seconds. Step 2 was implemented with a pressure of 10 mtorr, $CF_4$ flow of 0 sccm, $O_2$ flow of 100 sccm, Argon flow of 20 sccm with a bias voltage of 600 V, power of 2000 W for 300 seconds. The first and second steps were repeated sequentially until the time of $CF_4$ exposure in the first step was 24 hours. The $O_2$ etching conditions were: a pressure of 25 mtorr; $CF_4/SF_6$ flow 0 sccm; $O_2$ flow 100 sccm; Ar flow 20 sccm; Bias voltage 600 V; Power 2000 W for a total of 6 hours and the $SF_6$ etching conditions were: pressure of 25 mtorr; $SF_6$ flow 100 sccm; $O_2$ flow 0 sccm; Ar flow 50 sccm; Bias voltage 300 V; Power 2000 W for a total of 24 hours. The results show excellent corrosion resistance for the sintered yttrium oxide bodies made according to the present disclosure.

Sintered yttrium oxide bodies prepared according to the present development preferably exhibit a step height of from 0.2 to 0.98 μm for a $CF_4/O_2$ etch process as disclosed, from 0.27 to 0.44 μm for an $SF_6$ etch process as disclosed herein, and from 0.1 to 0.13 μm for an $O_2$ etch process as disclosed herein.

Sintered yttrium oxide bodies prepared according to the present development preferably exhibit an etch volume of from $0.6\times10^5$ to $3.4\times10^5$ $\mu m^3$ for a $CF_4/O_2$ etch process as disclosed, an etch volume of from $0.8\times10^5$ to $1.4\times10^5$ $\mu m^3$ for an $SF_6$ etch process as disclosed herein, and from 0.28 to 0.39 $\mu m^3$ for an $O_2$ etch process as disclosed herein.

Sintered yttrium oxide bodies prepared according to the present development preferably exhibit an etch rate of from 0.14 to 0.68 nm/min for a $CF_4/O_2$ etch process as disclosed, from 0.19 to 0.310 nm/min for an $SF_6$ etch process as disclosed herein, and from 0.07 to 0.09 nm/min for an $O_2$ etch process as disclosed herein.

TABLE 11

$CF_4/O_2$ Etch Results

| CF4/02 Etch | Average Step Height (um) | Etch Rate (nm/min) | Average Volume ($um^3$) x $10^5$ | Max Pore Size (um) |
|---|---|---|---|---|
| TSC 03 | 98.54 | 68.43 | 317.1 | N/A |
| 107 | 5.62 | 3.91 | 18 | 38 |
| 118 | 2.95 | 2.05 | 9.3 | 3 |
| 152 | 0.98 | 0.68 | 3.4 | 2 |
| 189-1 | 0.82 | 0.57 | 2.7 | 1 |
| 186-1 | 0.82 | 0.57 | 2.5 | 1.3 |
| 200 | 0.2 | 0.14 | 0.6 | 1.4 |

TABLE 12

$O_2$ Etch Results

| O2 Etch | Average Step Height (um) | Etch Rate (nm/min) | Average Volume ($um^3$) × $10^5$ | Max Pore Size (um) |
|---|---|---|---|---|
| TSC 03 | 3.983 | 2.766 | 12.620 | N/A |
| 107 | 0.883 | 0.613 | 2.750 | 38 |
| 200 | 0.130 | 0.090 | 0.387 | 1.4 |
| 152 | 0.100 | 0.069 | 0.279 | 2 |

TABLE 13

$SF_6$ Etch Results

| $SF_6$ Etch | Average Step Height (um) | Etch Rate (nm/min) | Average Volume ($um^3$) × $10^5$ | Max Pore Size (um) |
|---|---|---|---|---|
| TSC 03 | 4.33 | 3.01 | 14.1 | N/A |
| 107 | 3.3 | 2.29 | 10.1 | 38 |
| 152 | 0.28 | 0.19 | 0.9 | 2 |
| 200 | 0.27 | 0.19 | 0.8 | 1.4 |
| 196 | 0.44 | 0.31 | 1.4 | 0.5 |
| TSC 03 | 4.33 | 3.01 | 14.1 | N/A |
| 107 | 3.3 | 2.29 | 10.1 | 38 |
| 152 | 0.28 | 0.19 | 0.9 | 2 |
| 200 | 0.27 | 0.19 | 0.8 | 1.4 |

TABLE 13

Grain Size Results

| Part | Grain Size d10, um | Grain Size d50, um | Grain Size d90, um | Grain Size d100, um |
|---|---|---|---|---|
| H3/79 | 0.8 | 1.4 | 2.4 | 6.5 |
| 63 | 0.7 | 1.2 | 2.2 | 5.7 |
| 62 | 0.4 | 0.9 | 1.5 | 3.4 |
| H1/66 | 0.5 | 0.8 | 1.4 | 3.8 |
| H2/65 | 4 | 13 | 27.1 | 69.2 |

Grain Boundaries

The composition and characteristics of the grain boundaries may relate to etch and erosion performance. As reported by M. Watanabe and D. B. Williams in "The quantitative analysis of thin film specimens; a review of progress from the Cliff-Lorimer to the new Zeta-factor methods" (J. Microsc. 221 (2006) 89-109) which is incorporated herein by reference in its entirety, the grain boundary characteristics may be calculated by ξj (zeta) factor quantification. The mass thickness (ρt) and elemental compositions (CN) are calculated as:

$$\rho t = \sum_{j}^{N} \frac{\zeta_j I_j A_j}{D_e} \quad C_N = \frac{\zeta_N I_N A_N}{\sum_{j}^{N} \zeta_j I_j A_j}$$

Where ρ is specimen density, t is specimen thickness, zeta factor is for an element j with known chemistry and thickness, and Ij is intensity for element j. De is the electron dose calculated as:

$$D_e = N_e I_p \tau$$

e per unit charge probe current live time

Using ρt, the x ray signals may be corrected for absorption according to the following equation:

$$A_j = \frac{(\mu/\rho)^j_{sp} \rho t \operatorname{cosec}(\alpha)}{1 - \exp\left[(\mu/\rho)^j_{sp} \rho t \operatorname{cosec}(\alpha)\right]}$$

Where:

| Absorption Factor | Mass Absorption Coefficient | Collection Angle |
|---|---|---|
| $A_j$ element j | $(\mu/\rho)^j_{sp}$ element j by species | α |

Figure 32:
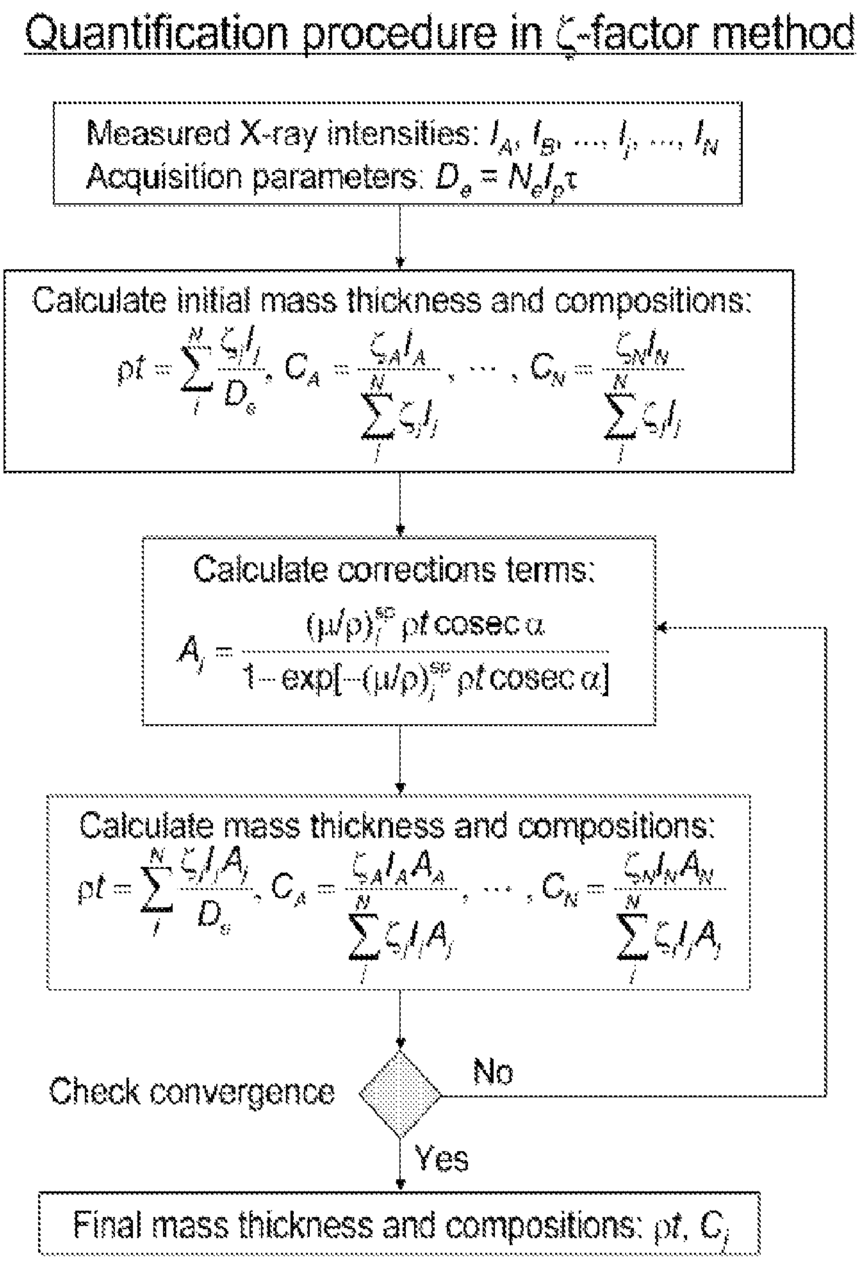
FIG. 32 is a flow chart for a quantification procedure for the zeta factor method using x ray absorption correction.

And the mass thickness (ρt) and elemental compositions (CN) are calculated with corrections for x ray signal absorption as reported in "Quantification of boundary segregation in the analytical electron microscope" (M. Watanabe, D. B. Williams, J. Microsc. 221 (2006) 89-109 which is incorporated herein by reference in its entirety. An exemplary procedure for zeta factor methods is disclosed in accordance with FIG. 32 (Watanabe/Williams 2006).

Figure 9:
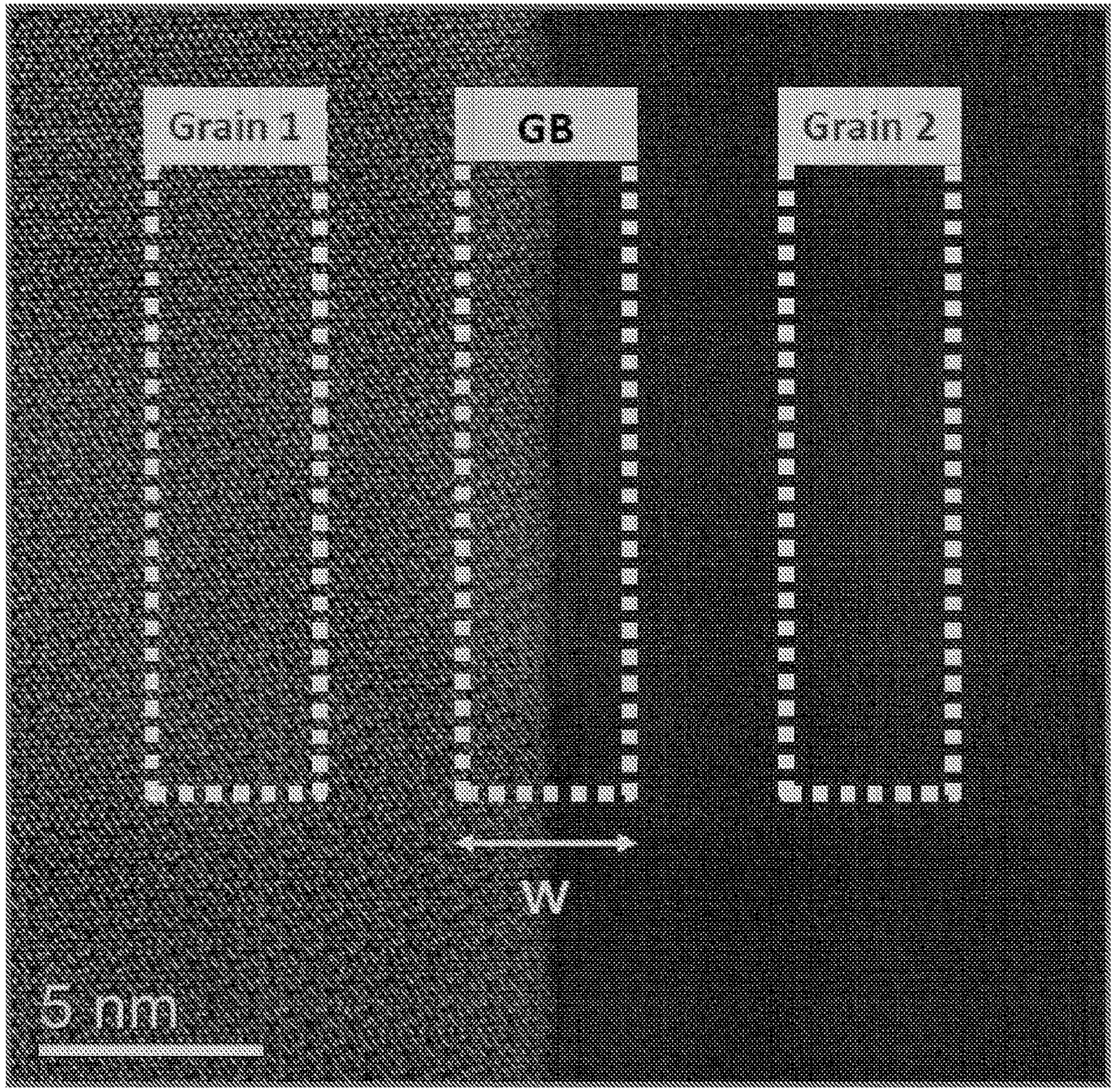
FIG. 9 is an EDS (energy dispersive x ray spectroscopy) spectrum acquired from selected areas on a grain boundary.

Thereafter, an EDS (energy dispersive x ray spectroscopy) spectrum is acquired from selected areas on a grain boundary and both abutting grains as depicted in FIG. 9, and the difference in elemental composition from the EDS spectrum between the grain boundary and the bulk grains is calculated as excess coverage in atoms/nm$^2$ (V. J. Keast, D. B. Williams, J. Microscopy Vol. 199 Pt. 1, (2000) pp. 45-55). According to Keast et. al., the excess coverage (or grain boundary coverage) in atoms/nm$^2$ describes the grain boundary by a feature, Γ, which may be calculated according to the equation following:

$$\Gamma = V/A \rho k_{sm} \frac{A_m}{A_s} \frac{I_s}{I_m}$$

Where ρ is the density of the matrix in atoms/nm$^3$, Am and As are the atomic masses of the matrix and segregant, respectively, and the geometric factor V/A is the ratio of the interaction volume to the area of the grain boundary inside the interaction volume and will be a function of d and the total specimen thickness. The segregant as used herein comprises silica.

Positive numbers for excess coverage indicate that the grain boundary has a higher concentration of a particular element relative to the bulk grain, and correspondingly negative numbers indicate that the element has a higher concentration with the bulk grain than the grain boundary.

Figure 10:
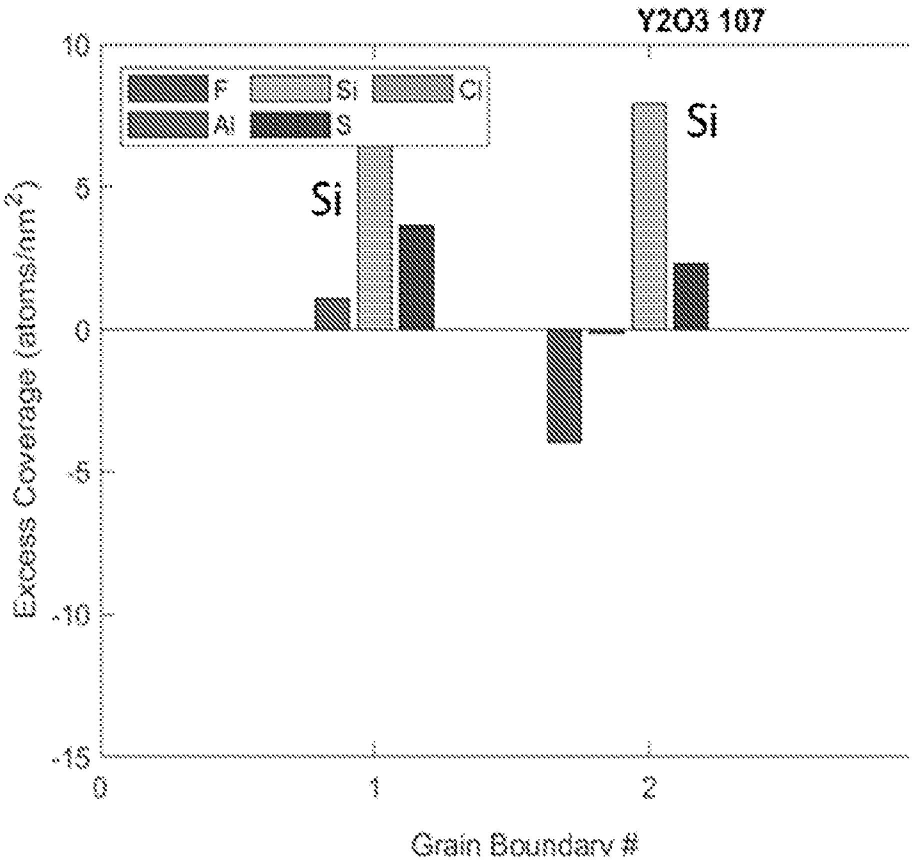
FIG. 10 illustrates the results of excess coverage in atoms/$nm^2$ across several grain boundaries for sample 107 of the Examples.

Comparator sample 107, a commercially available yttrium oxide sample, was analyzed as to its grain boundary composition and excess coverage. FIG. 10 illustrates the results of excess coverage in atoms/nm$^2$ across several grain boundaries for sample 107. Silica was present in the grain boundary in an excess amount of about 8 to 10 atoms/nm$^2$ relative to the abutting grains.

Figure 11:
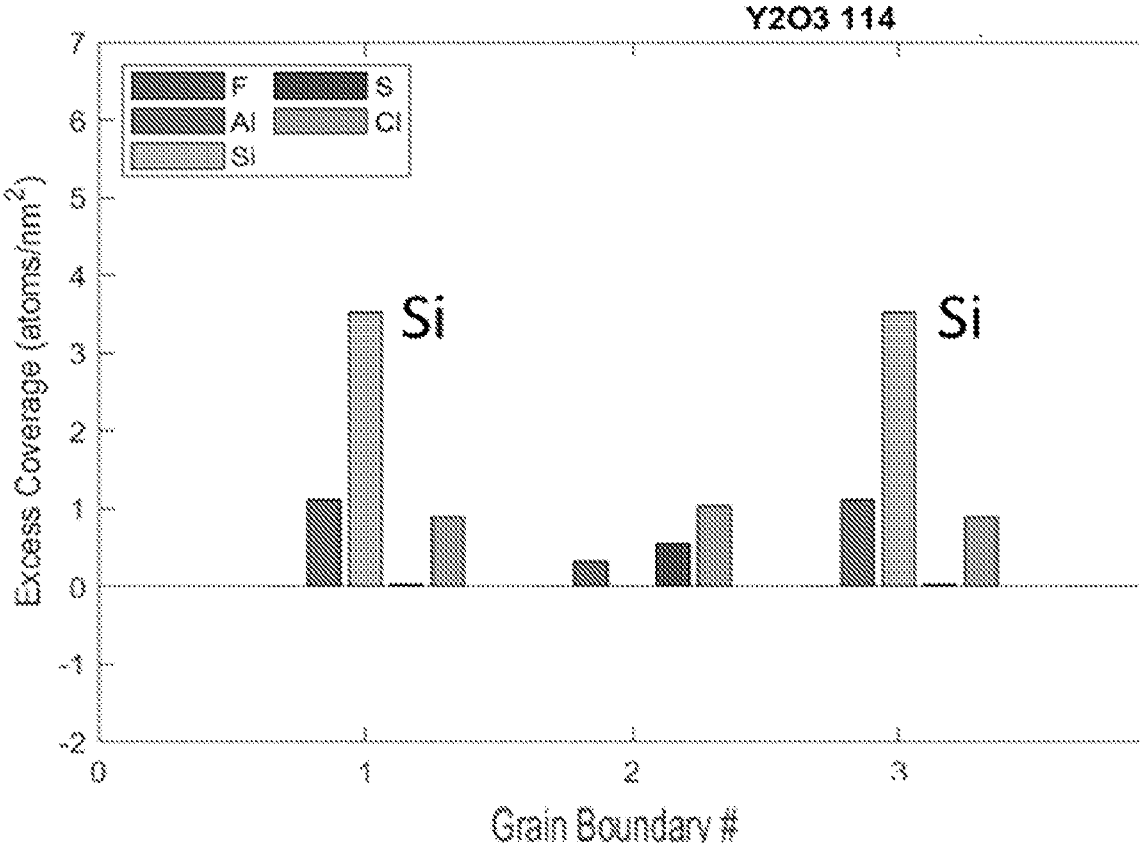
FIG. 11 illustrates the results of excess coverage in atoms/$nm^2$ across several grain boundaries for sample 114 of the Examples.

Sample 114, formed from a common powder supplier to that of sample 152, was analyzed as to its grain boundary composition and excess coverage. FIG. 11 illustrates the results of excess coverage in atoms/nm$^2$. Silica was present in the grain boundary in an amount of from about 2 to about 4 atoms/nm$^2$ relative to the bulk grain composition. All other elements were present in excess coverage amounts less than that of silica. These low levels of elements other than yttrium oxide present in the grain boundary of sample 114, corresponding to sample 152, may provide the preferred etch results as reported in Tables 8, 9 and 10 across various process gases.

Sample 157: Dielectric Loss

Sample 157 is a sintered yttrium oxide sample having a diameter of 203 mm (8") and a thickness of 5 mm, sintered at 1550° C. for 30 minutes at a pressure of 30 MPa for 10 to 25° C./minute. It was not annealed. Density was >98.5% of the theoretical density for yttrium oxide, which is reported as 5.03 g/cc. The dielectric results are listed in Table 15.

TABLE 15

Dielectric Results

| Sample | 1 MHz dielectric constant | 1 MHz dissipation factor |
|---|---|---|
| 157-1 | 11.2 | 0.048 |
| 157-2 | 11.3 | 0.054 |
| 157-3 | 11.26 | 0.025 |
| 157-4 | 11.4 | 0.018 |

In addition, dielectric loss (or dissipation factor) may be affected by grain size and grain size distribution. Fine grain size also may provide reduced dielectric loss, and thereby reduced heating upon use at higher frequencies. Dielectric losses on the order of from 1×10$^{-4}$ to 5.5×10$^{-2}$, preferably from 1×10$^{-4}$ to 5×10$^{-2}$, preferably from 1×10$^{-4}$ to 4×10$^{-2}$, preferably from 1.6×10$^{-2}$ to 5×10$^{-2}$, preferably from 1×10$^{-4}$ to $2\times10^{-2}$ may be achieved for the sintered ceramic body comprising a high purity yttrium oxide body. Yttrium oxide sample 157 had an average dielectric constant of 11.3 and average dielectric loss of $3.6\times10^{-2}$ across 4 measurements as listed in Table 15.

Figure 12:
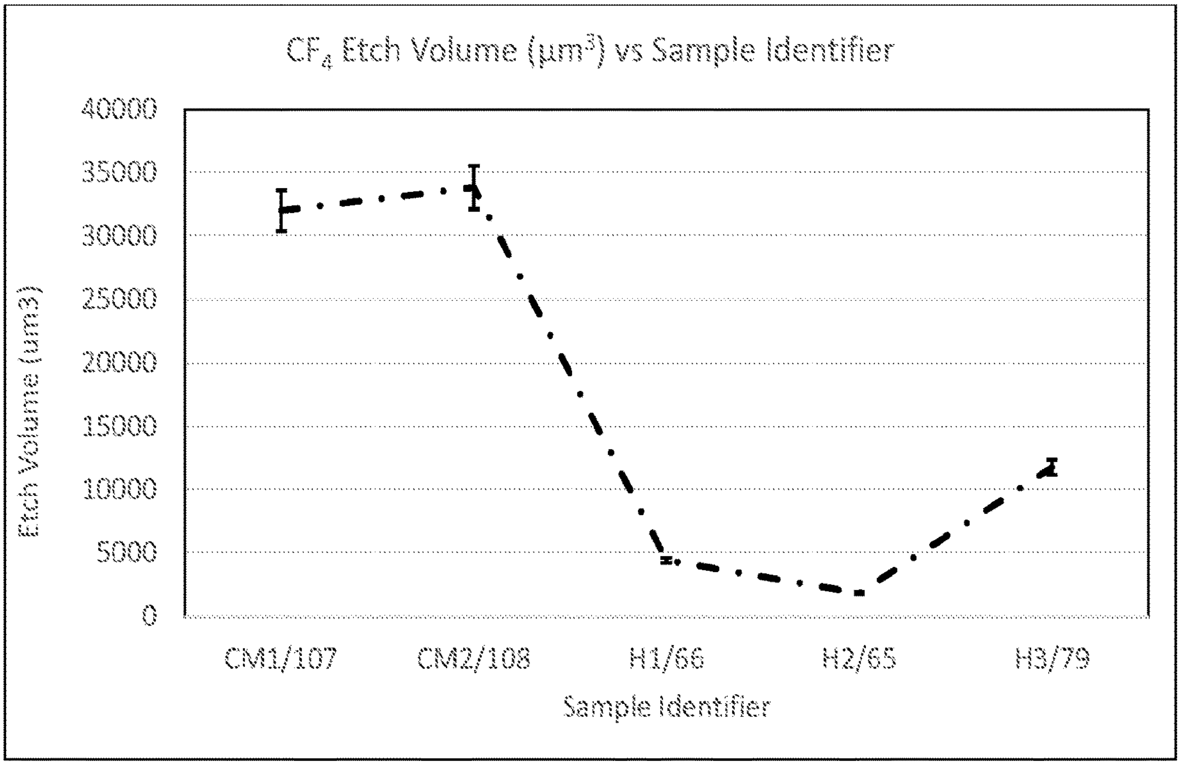
FIG. 12 shows the $CF_4$ etch volume after the single step $CF_4$ etch process as disclosed herein of prior art sintered yttrium oxide samples CM1/107 and CM2/108 as compared with sintered yttrium oxide samples H1/66, H2/65, and H3/79 according to embodiments of the present disclosure.

With reference to the Figures, select results are summarized as follows:

FIG. 12 shows the single step $CF_4$ etch volume of prior art sintered yttrium oxide samples CM1/107 and CM2/108 as compared with sintered yttrium oxide samples H1/66, H2/65, and H3/79 according to embodiments of the present disclosure. The sintered yttrium oxide samples according to the present disclosure are significantly more etch resistant over the prior art.

Figure 13:
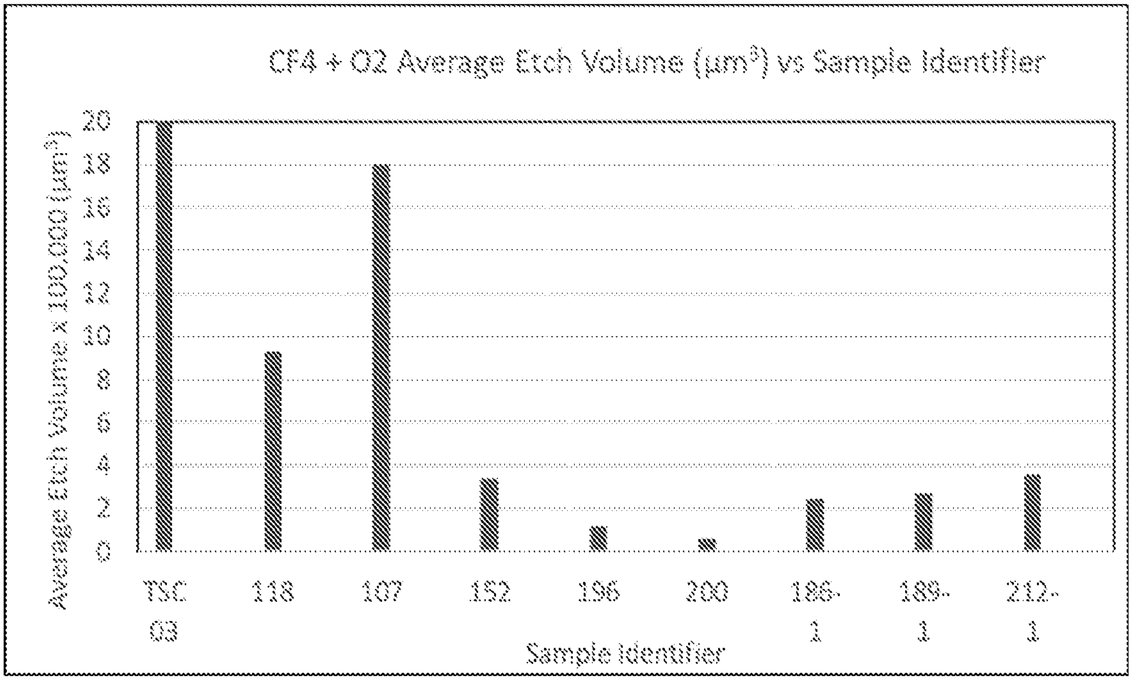
FIG. 13 shows the $CF_4$+$O_2$ average etch volume (after a two-step etch process as disclosed herein) of prior art TSC 03 (Quartz) and sintered yttrium oxide samples 118, and 107 as compared with various sintered yttrium oxide samples made according to embodiments of the present disclosure.

FIG. 13 shows the $CF_4+O_2$ average etch volume of prior art TSC 03 (Quartz) and sintered yttrium oxide samples 118, and 107 as compared with various sintered yttrium oxide samples made according to embodiments of the present disclosure. The sintered yttrium oxide samples according to the present disclosure are significantly more etch resistant over the prior art.

Figure 14:
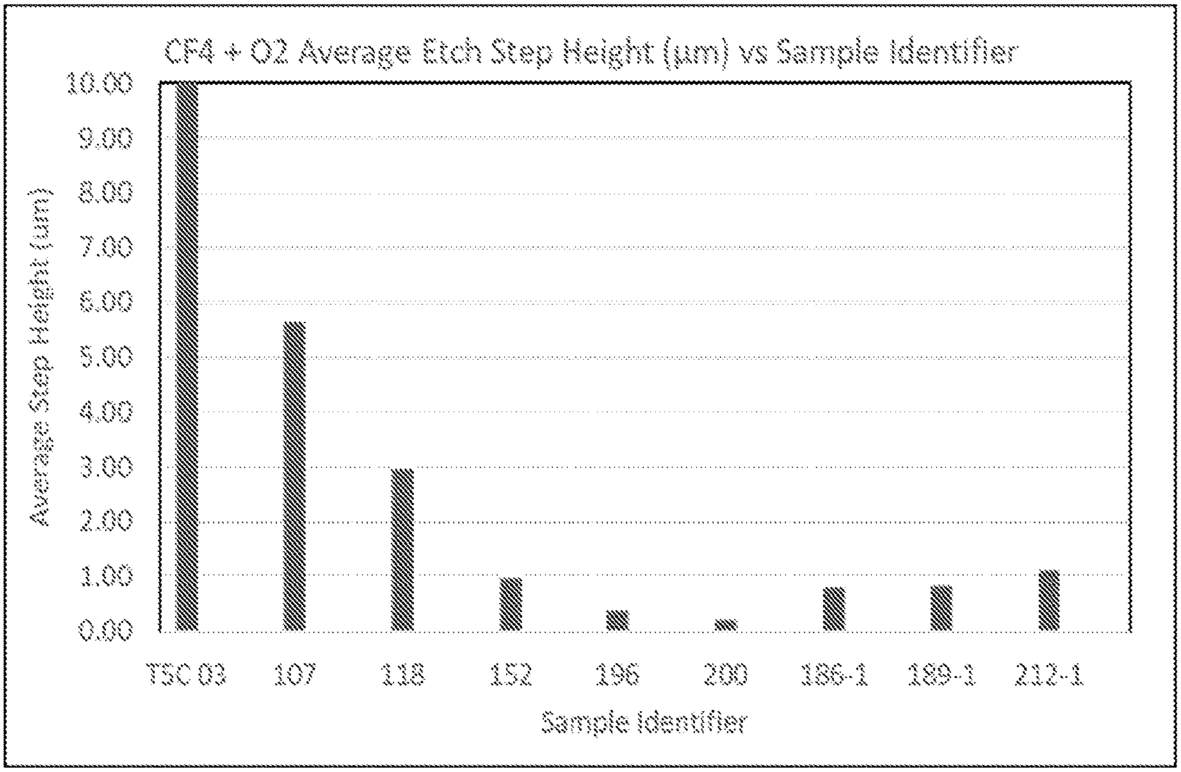
FIG. 14 shows the $CF_4$+$O_2$ average step height (after a two-step etch process) of prior art TSC 03 (Quartz), and sintered yttrium oxide samples 118 and 107 as compared with various sintered yttrium oxide samples made according to embodiments of the present disclosure.

FIG. 14 shows the $CF_4+O_2$ average step height of prior art TSC 03 (Quartz), and sintered yttrium oxide samples 118 and 107 as compared with various sintered yttrium oxide samples made according to embodiments of the present disclosure. The sintered yttrium oxide samples according to the present disclosure are significantly more etch resistant over the prior art.

Figure 15:
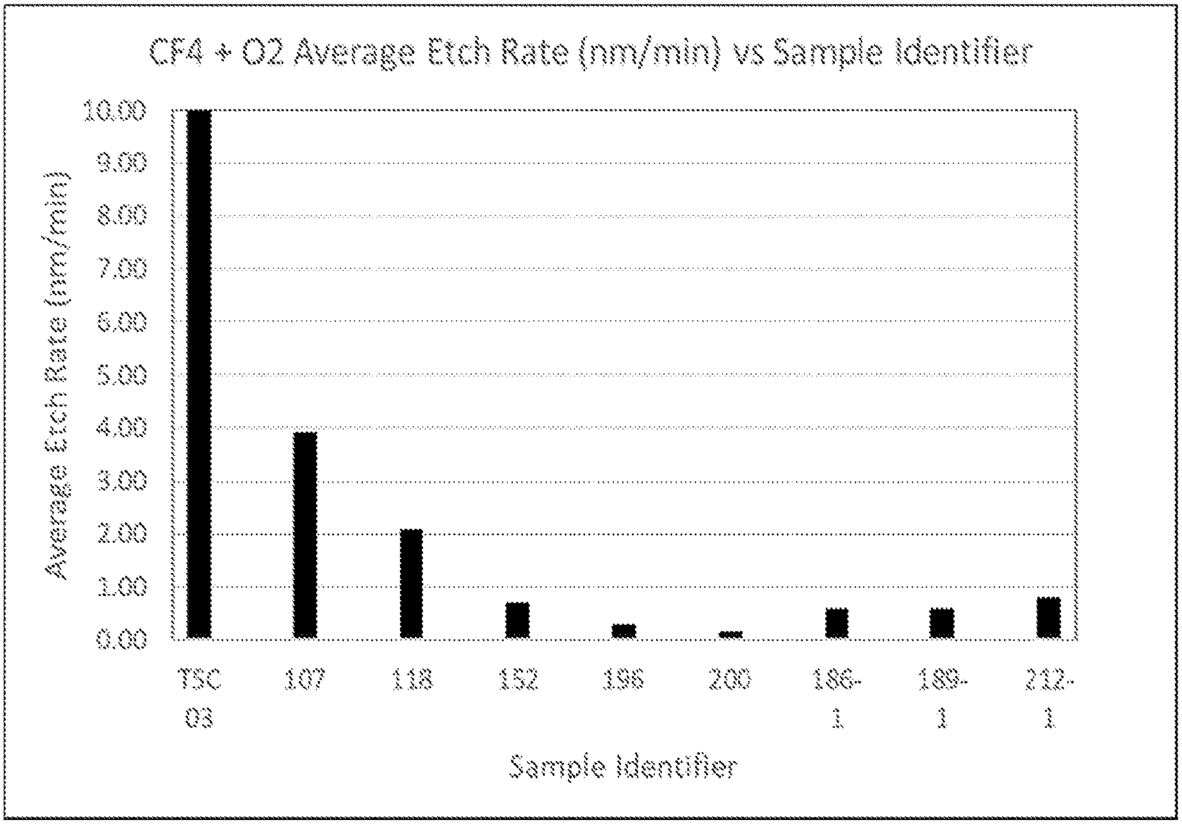
FIG. 15 shows the $CF_4$+$O_2$ average etch rate (after a two-step etch process) of prior art TSC 03 (Quartz), sintered yttrium oxide samples 118 and 107 as compared with various samples made according to embodiments of the present disclosure.

FIG. 15 shows the $CF_4+O_2$ average etch rate of prior art TSC 03 (Quartz), sintered yttrium oxide samples 118 and 107 as compared with various samples made according to embodiments of the present disclosure. The sintered yttrium oxide samples according to the present disclosure are significantly more etch resistant over the prior art.

Figure 16:
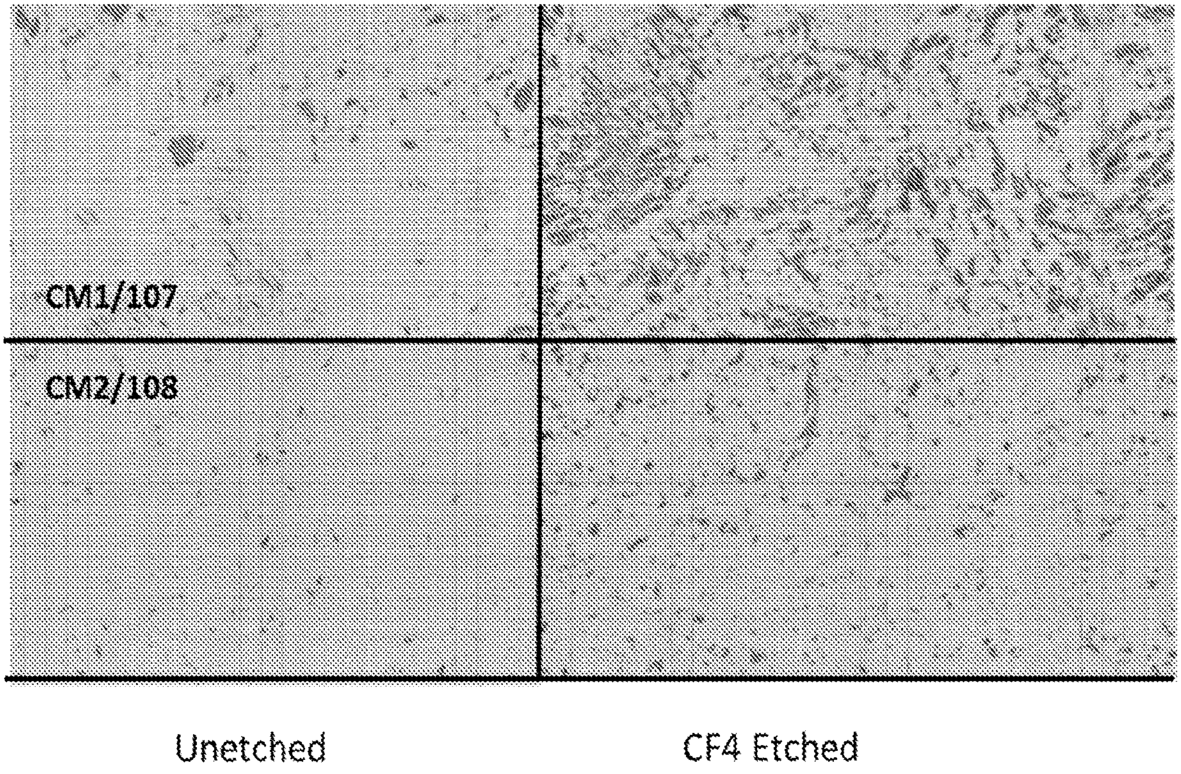
FIG. 16 shows an SEM micrograph at 50× of the surface of prior art sintered yttrium oxide samples CM1/107 and CM2/108 before and after a single step $CF_4$ etch process.

FIG. 16 shows an SEM micrograph at 50× of the surface of prior art sintered yttrium oxide samples CM1/107 and CM2/108 before and after a single step $CF_4$ etch process. Significant etching is observed.

Figure 17:
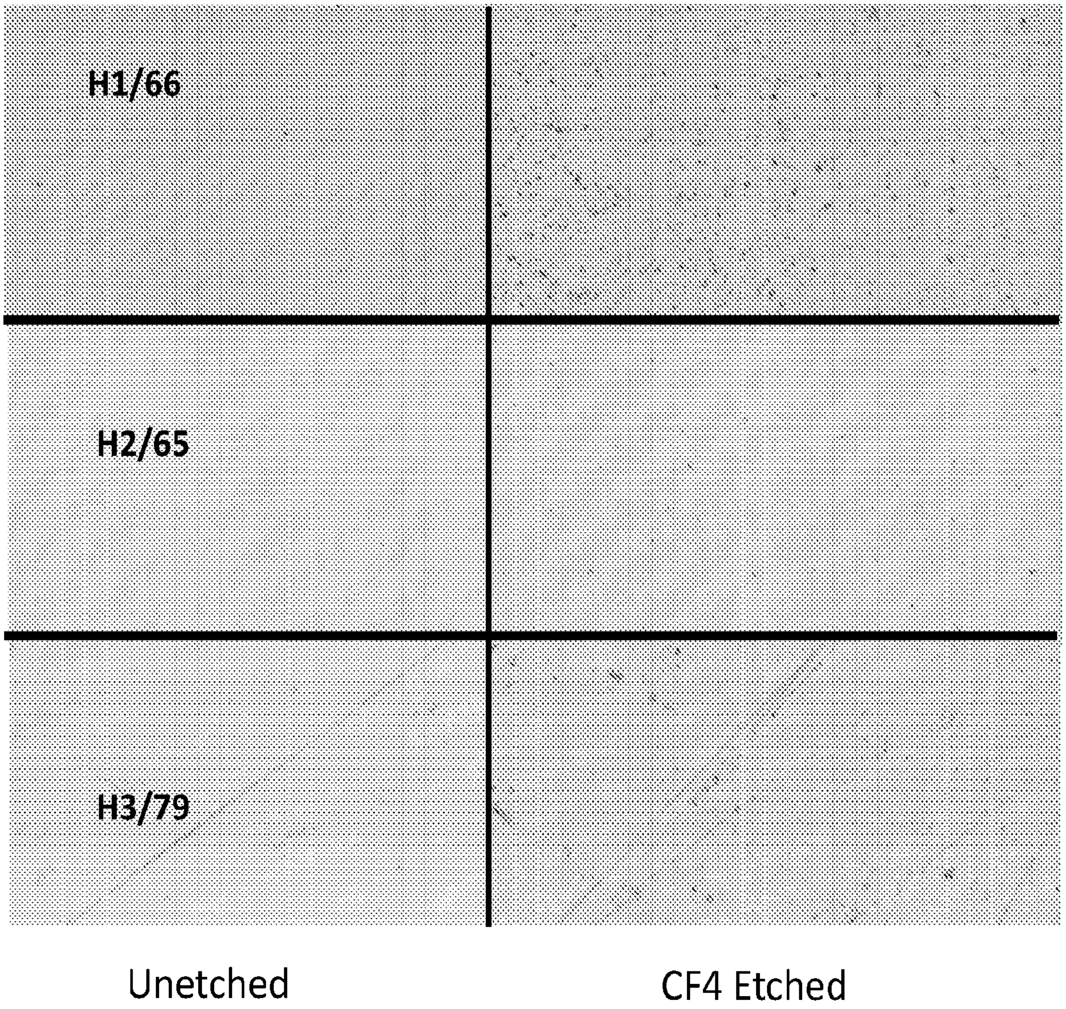
FIG. 17 shows an SEM micrograph at 50× of the surface of sintered yttrium oxide samples H1/66, H2/65, and H3/79 made according to the present disclosure before and after a single step $CF_4$ etch process.

FIG. 17 shows an SEM micrograph at 1000× of the surface of sintered yttrium oxide samples H1/66, H2/65, and H3/79 made according to the present disclosure before and after a single step $CF_4$ etch process. Samples made according to the present disclosure are resistant to etching.

Figure 18:
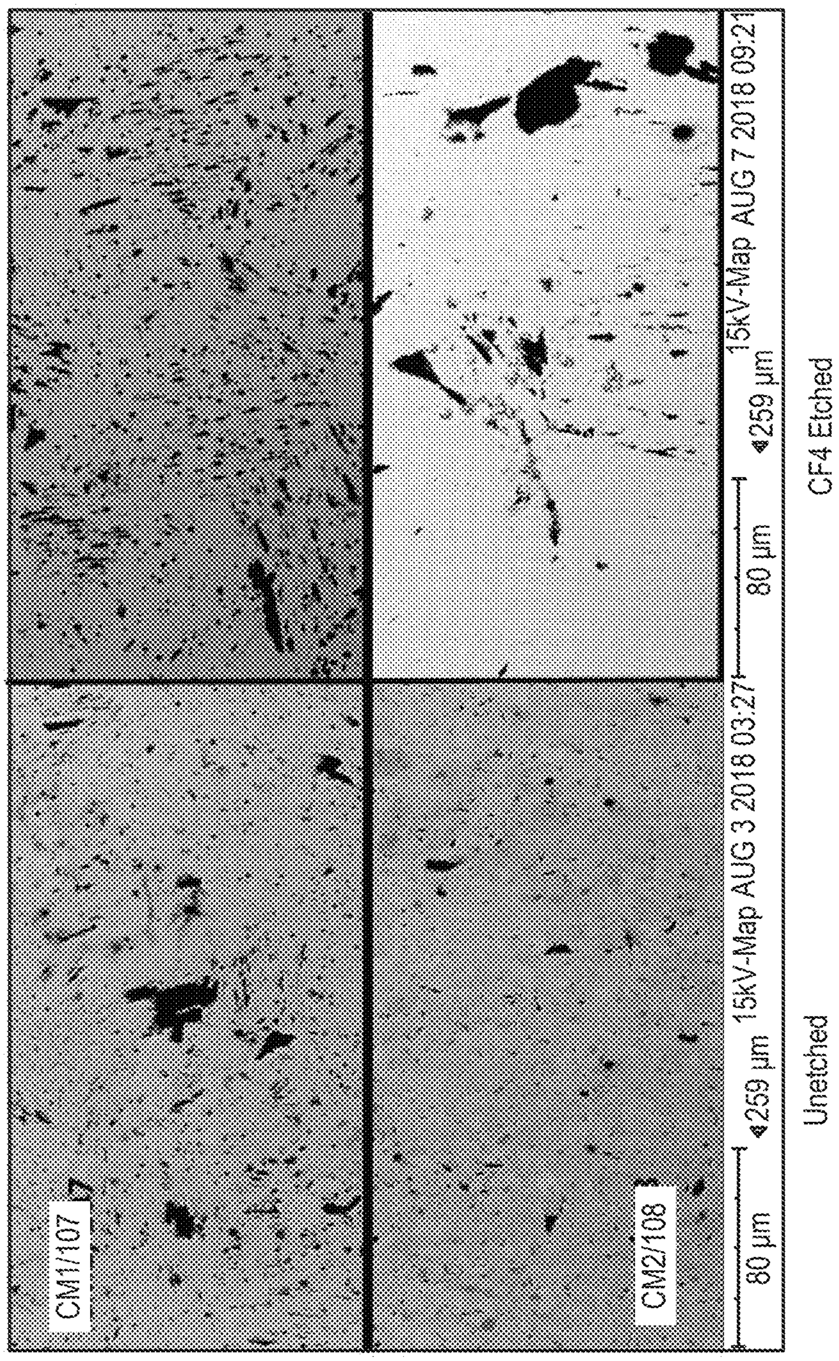
FIG. 18 shows an SEM micrograph at 1000× of a surface of prior art sintered yttrium oxide samples CM1/107 and CM2/108 before and after a single step $CF_4$ etch process.

FIG. 18 shows an SEM micrograph at 1000× of a surface of prior art sintered yttrium oxide samples CM1/107 and CM2/108 before and after a single step $CF_4$ etch process. Significant etching is observed.

Figure 19:
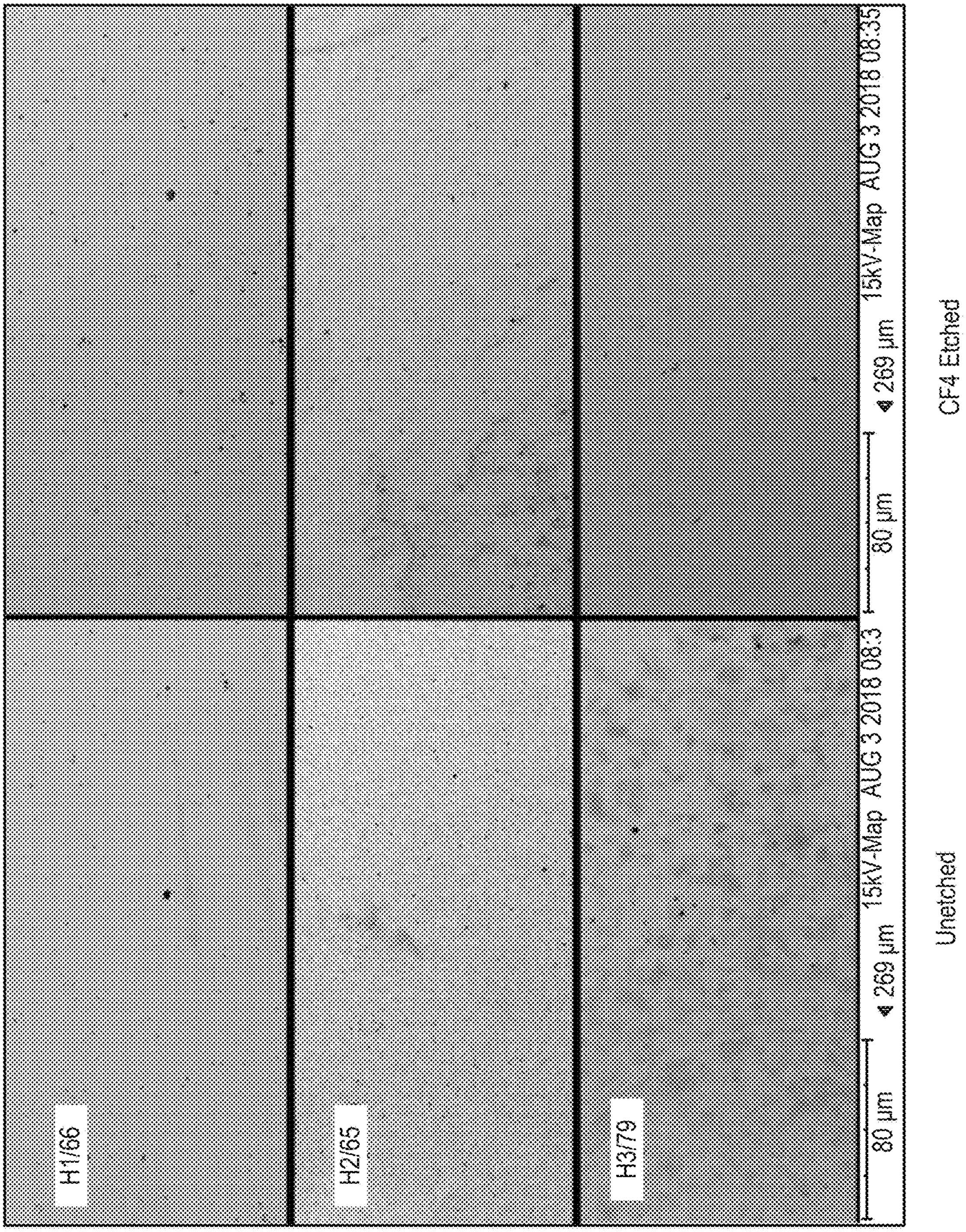
FIG. 19 shows an SEM micrograph at 1000× of the surface of sintered yttrium oxide samples H1/66, H2/65, and H3/79 made according to the present disclosure before and after a single step $CF_4$ etch process.

FIG. 19 shows an SEM micrograph at 1000× of the surface of sintered yttrium oxide samples H1/66, H2/65, and H3/79 made according to the present disclosure before and after a single step $CF_4$ etch process. Samples made according to the present disclosure are resistant to etching.

Figure 20:
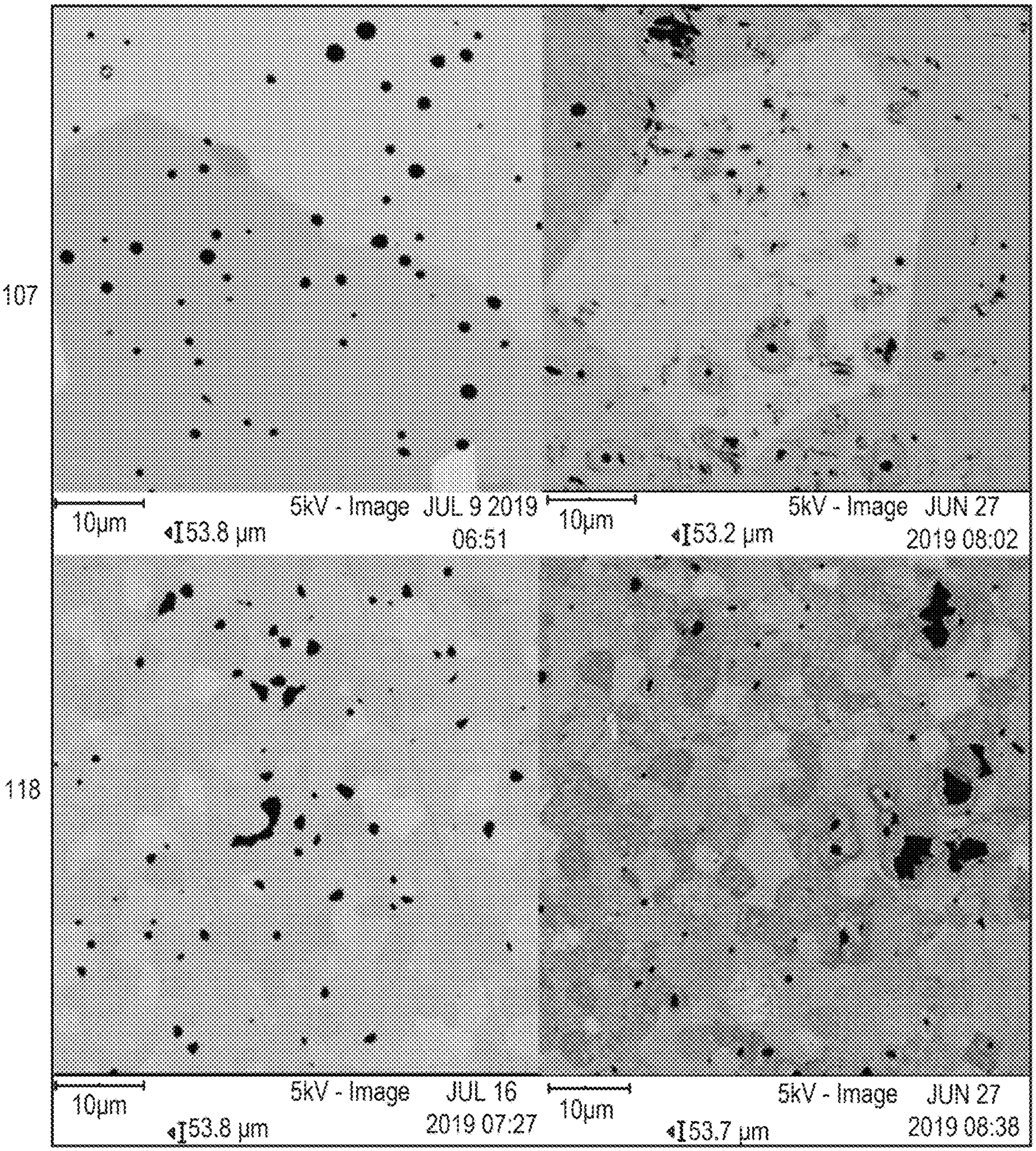
FIG. 20 shows an SEM micrograph at 5000× of a surface of prior art sintered yttrium oxide samples 107 and 118 before and after a single step $CF_4+O_2$ etch process.

FIG. 20 shows an SEM micrograph at 5000× of a surface of prior art sintered yttrium oxide samples 107 and 118 before and after a $CF_4+O_2$ etch process. Significant etching is observed.

Figure 21:
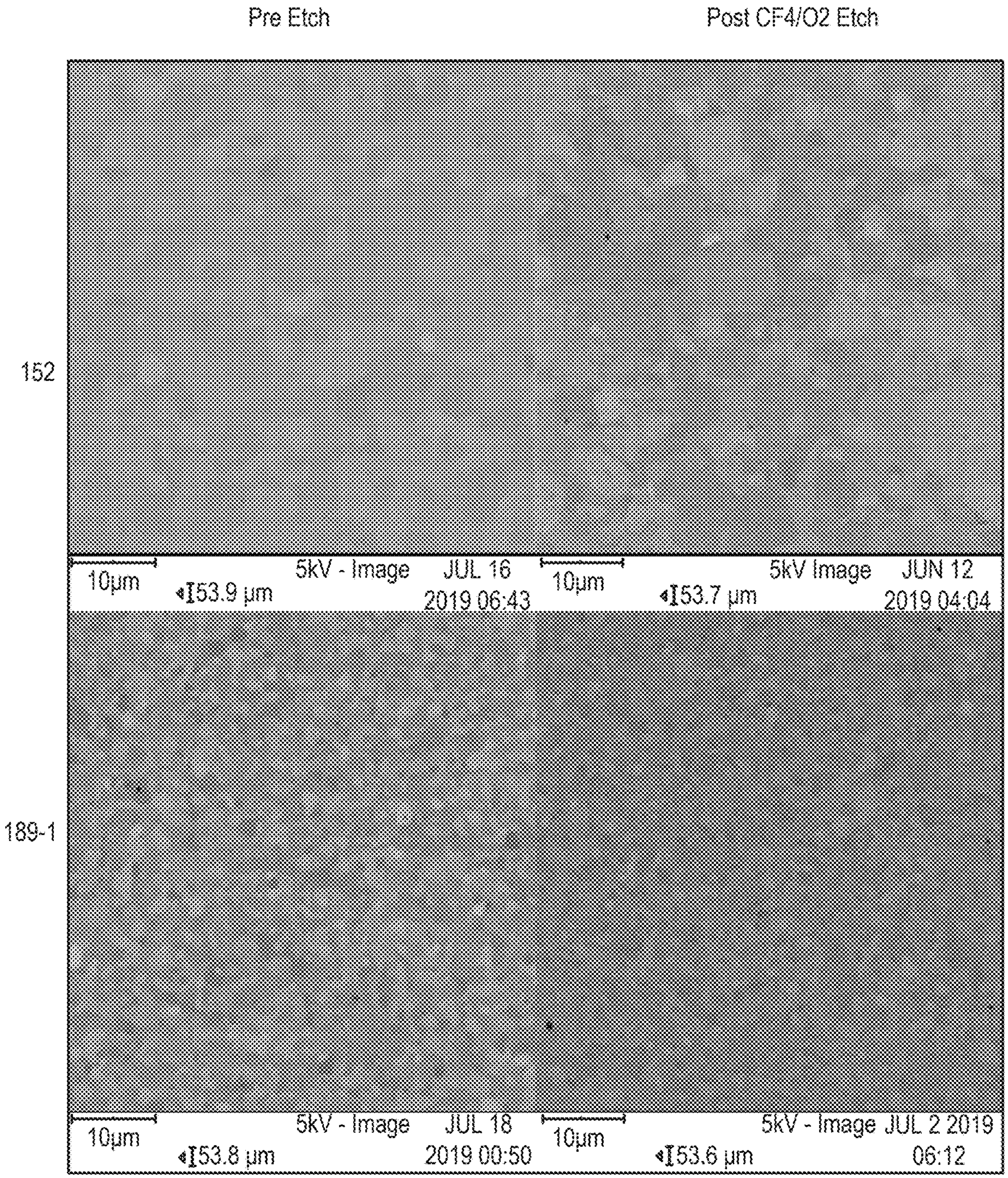
FIG. 21 shows an SEM micrograph at 5000× of the surface of sintered yttrium oxide samples 152 and 189-1 made according to the present disclosure before and after a two-step $CF_4+O_2$ etch process.

FIG. 21 shows an SEM micrograph at 5000× of the surface of sintered yttrium oxide samples 152 and 189-1 made according to the present disclosure before and after a $CF_4+O_2$ etch process. Samples made according to the present disclosure are resistant to etching.

Figure 22:
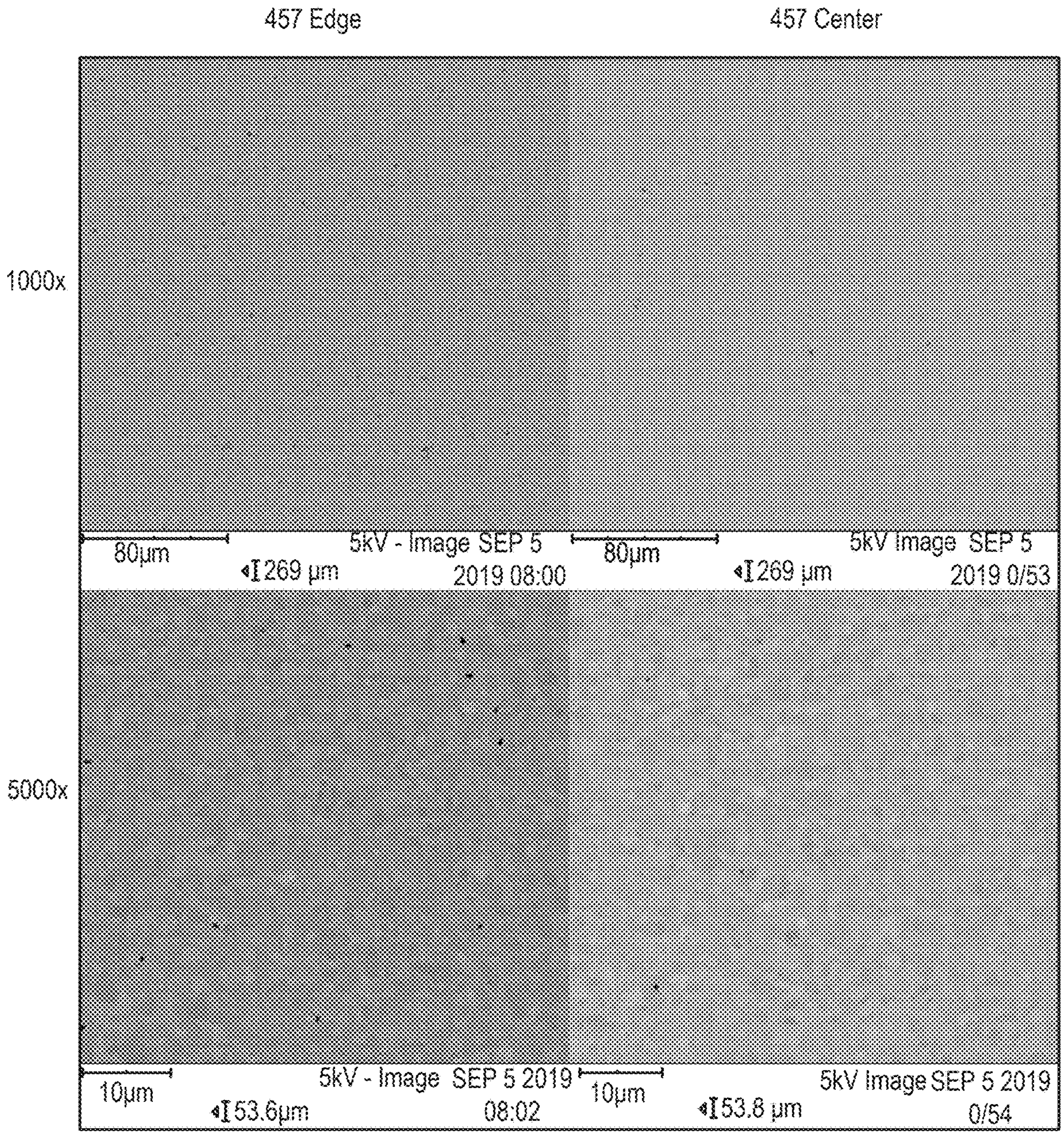
FIG. 22 shows an SEM micrograph at 1000× and 5000× of a surface at the edge of a sintered yttrium oxide sample and a surface at the center of the same sintered yttrium oxide sample 457 made according to the present disclosure.

FIG. 22 shows an SEM micrograph at 1000× and 5000× at the edge of a surface and at the center of the same surface of sintered yttrium oxide sample 457 made according to the present disclosure. Uniform density and minimal to no porosity is displayed across the surfaces. Samples made according to the present disclosure are highly dense and resistant to etching.

Figure 23:
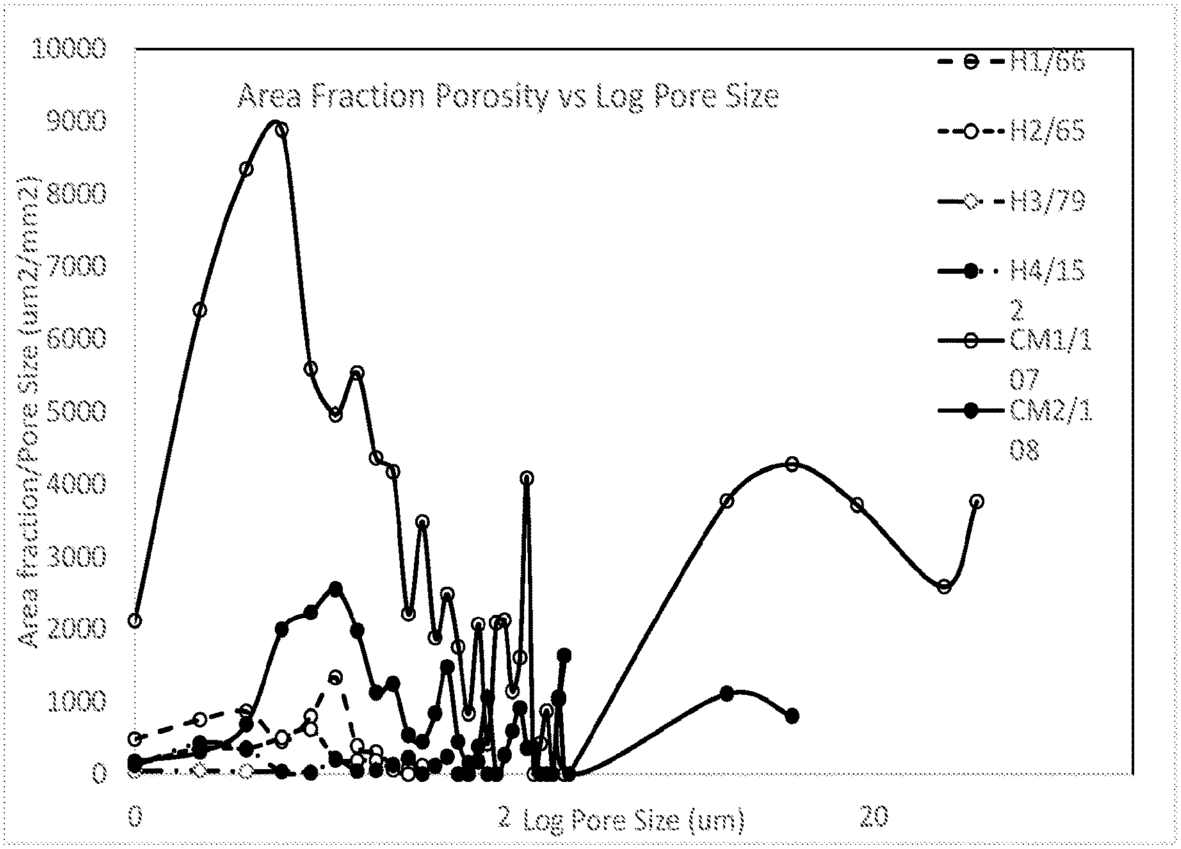
FIG. 23 shows that the yttrium oxide bodies according to one embodiment of the present disclosure (H1/66 to H4/152) do not have any pores with a pore size above 2.00 μm.

FIG. 23 shows that the yttrium oxide bodies according to one embodiment of the present disclosure (H1/66 to H4/152) do not have any pores with a pore size above 2.00 μm.

Figure 24:
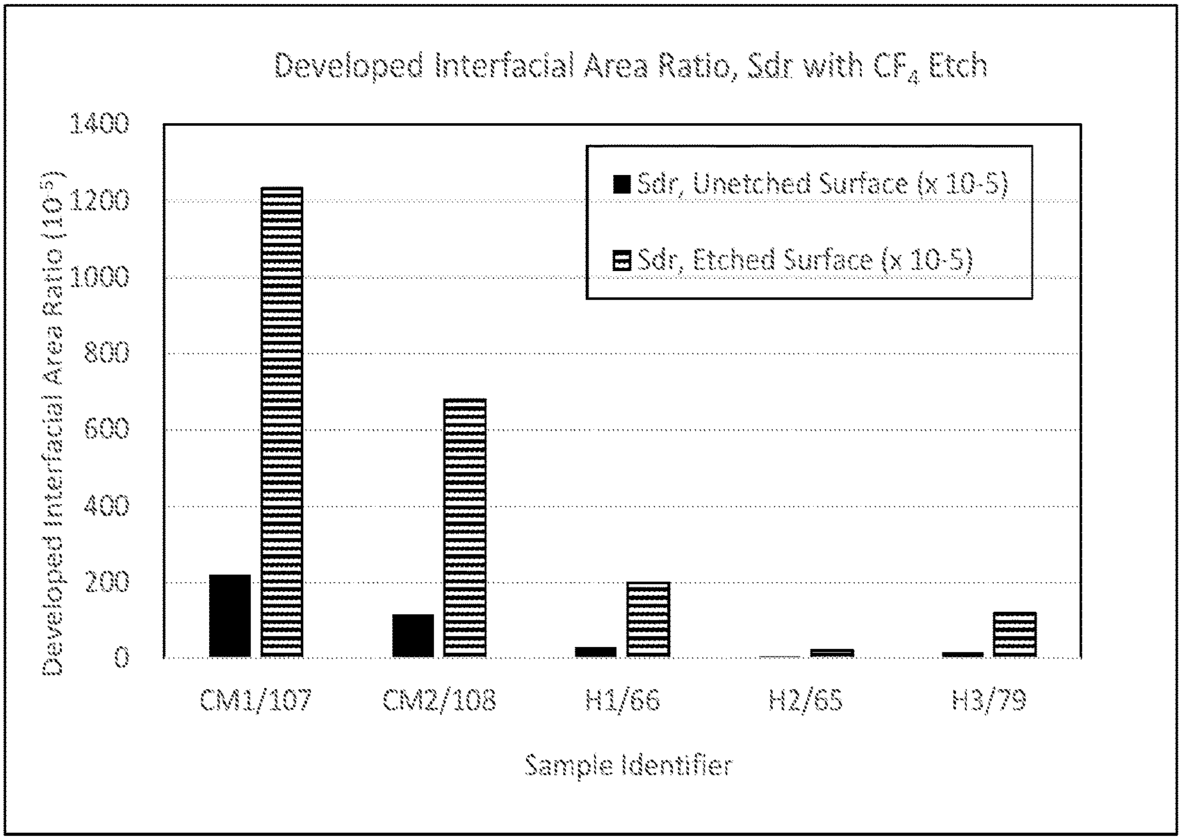
FIG. 24 is a graph illustrating the developed interfacial area ratio, Sdr, at an optical magnification of 50× of prior art sintered yttrium oxide samples CM1/107 and CM2/108 as compared with sintered yttrium oxide samples H1/66, H2/65, and H3/79 according to embodiments of the present disclosure before and after a single step $CF_4$ etch process.

FIG. 24 is a graph illustrating the developed interfacial area ratio, Sdr, at an optical magnification 50× of prior art sintered yttrium oxide samples CM1/107 and CM2/108 as compared with sintered yttrium oxide samples H1/66, H2/65, and H3/79 according to embodiments of the present disclosure before and after a single step $CF_4$ etch process. Samples made according to the present disclosure are resistant to etching.

Figure 25:
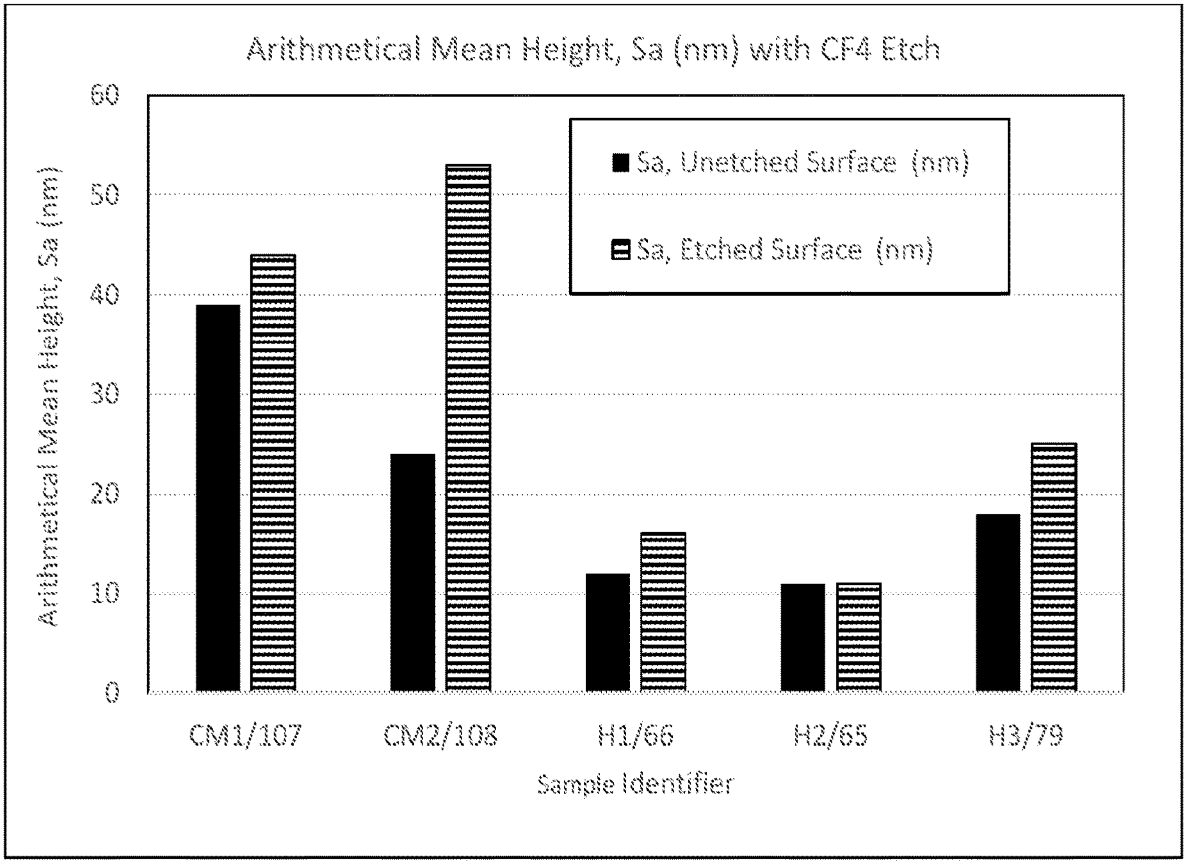
FIG. 25 is a graph illustrating the arithmetical mean height, Sa (nm), measured at an optical magnification 50× of prior art sintered yttrium oxide samples CM1/107 and CM2/108 as compared with sintered yttrium oxide samples H1/66, H2/65, and H3/79 according to embodiments of the present disclosure before and after a single step $CF_4$ etch process.

FIG. 25 is a graph illustrating the arithmetical mean height, Sa (nm), at an optical magnification 50× of prior art sintered yttrium oxide samples CM1/107 and CM2/108 as compared with sintered yttrium oxide samples H1/66, H2/65, and H3/79 according to embodiments of the present disclosure before and after a single step $CF_4$ etch process. FIG. 21 and FIG. 22 show that the yttrium oxide materials according to embodiments of the present invention (H1/66 to H3/79) have much lower developed interfacial area ratios Sdr and arithmetical mean heights Sa as compared with the comparative materials (CM1/107 and CM2/108).

Figure 26:
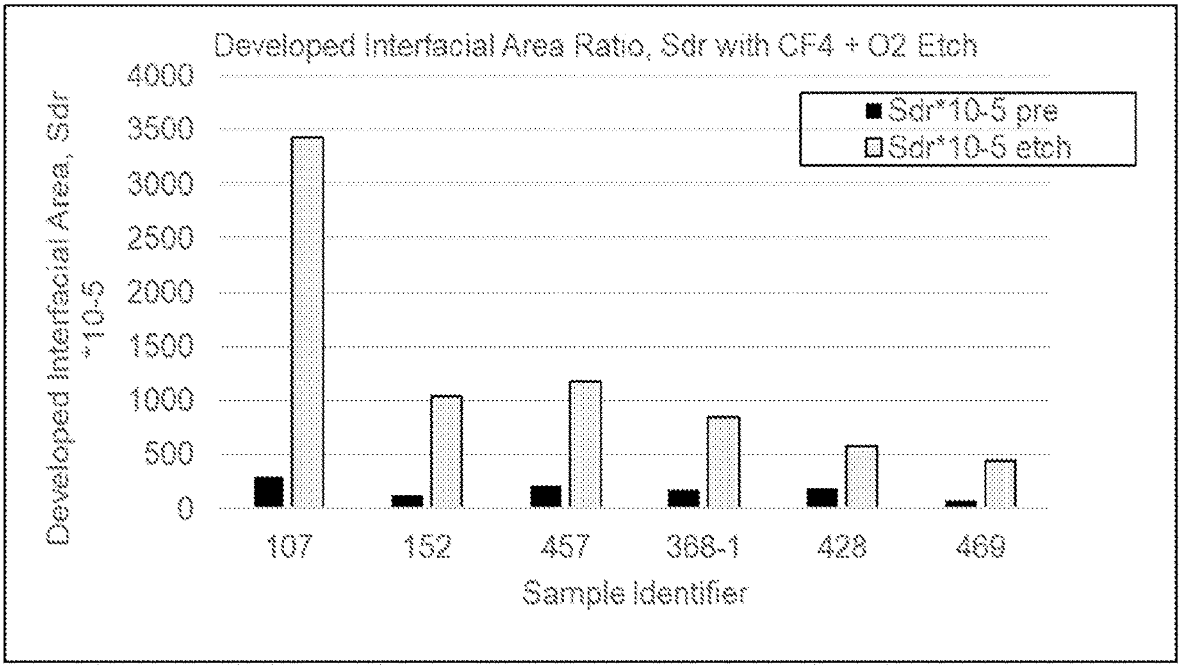
FIG. 26 is a graph showing the developed interfacial area ratio, Sdr, measured at an optical magnification 50× of prior art sintered yttrium oxide sample CM1/107 and various sintered yttrium oxide samples from the working examples before and after a two-step $CF_4+O_2$ etch process.

FIG. 26 is a graph showing the developed interfacial area ratio, Sdr, of various sintered yttrium oxide samples from the working examples before and after a $CF_4+O_2$ etch process. Samples made according to the present disclosure are resistant to etching.

Figure 27:
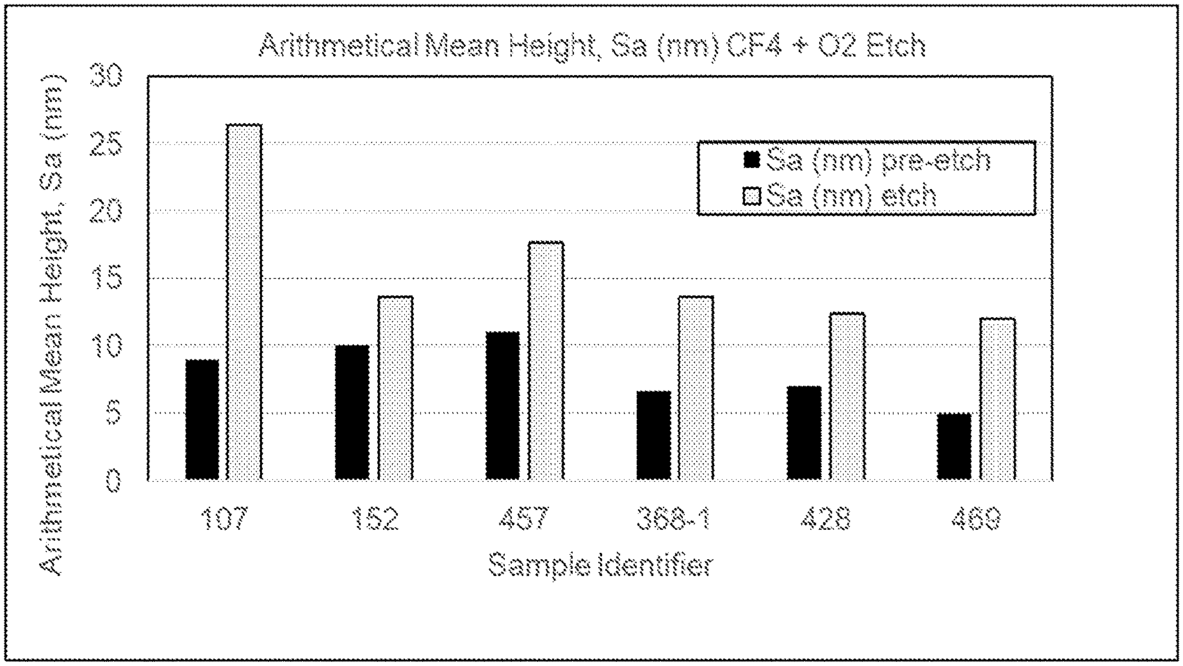
FIG. 27 is a graph illustrating the arithmetical mean height, Sa (nm), measured at an optical magnification 50× of prior art sintered yttrium oxide sample CM1/107 and of various samples from the working examples before and after a two-step $CF_4+O_2$ etch process.

FIG. 27 is a graph illustrating the arithmetical mean height, Sa (nm), of various samples from the working examples before and after a $CF_4+O_2$ etch process. Samples made according to the present disclosure are resistant to etching.

Figure 28:
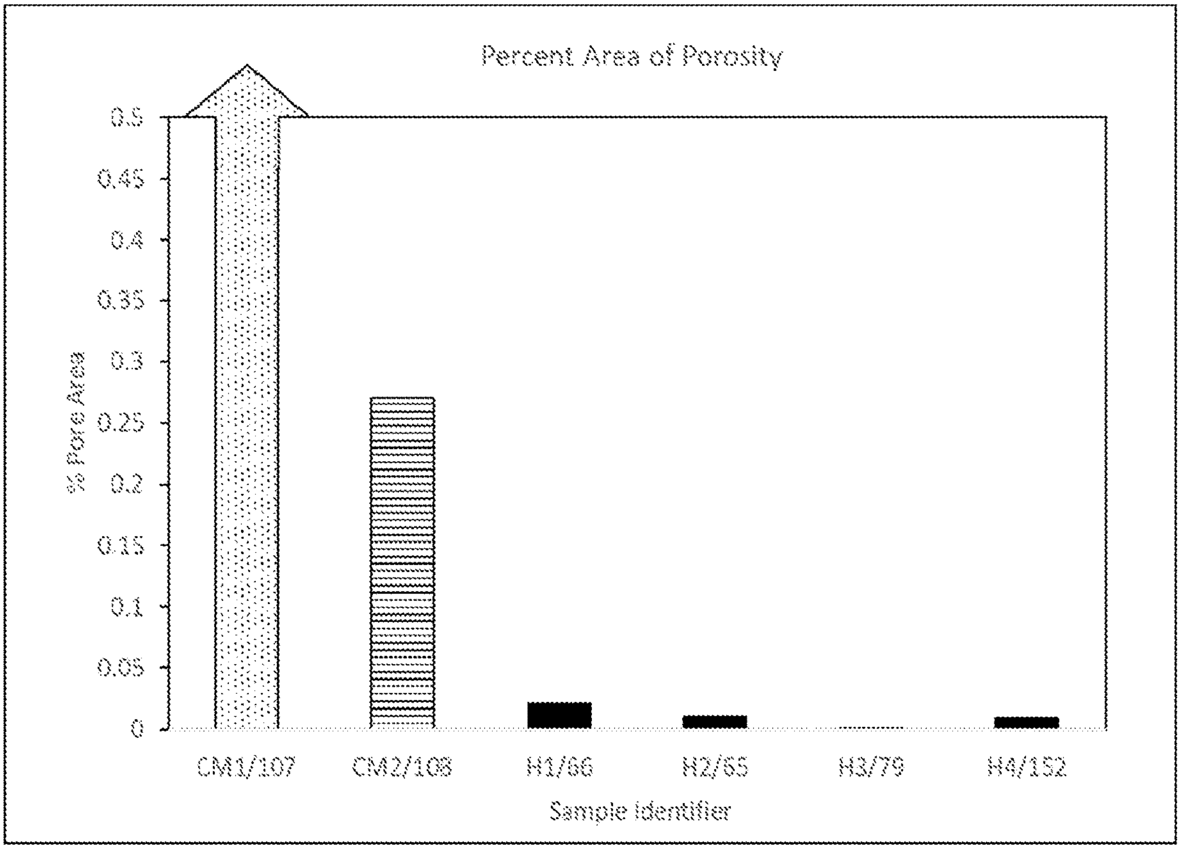
FIG. 28 is a graph illustrating the percent area porosity of various sintered yttrium oxide samples from the working examples compared to prior art sintered yttrium oxide samples.

FIG. 28 is a graph illustrating the percent area porosity of various sintered yttrium oxide samples from the working examples compared to prior art sintered yttrium oxide samples. The yttrium oxide materials according to one embodiment of the present invention (H1/66 to H4/152) have much lower percent area of pores as compared with the comparative materials (CM1/107 and CM2/108).

Figure 29:
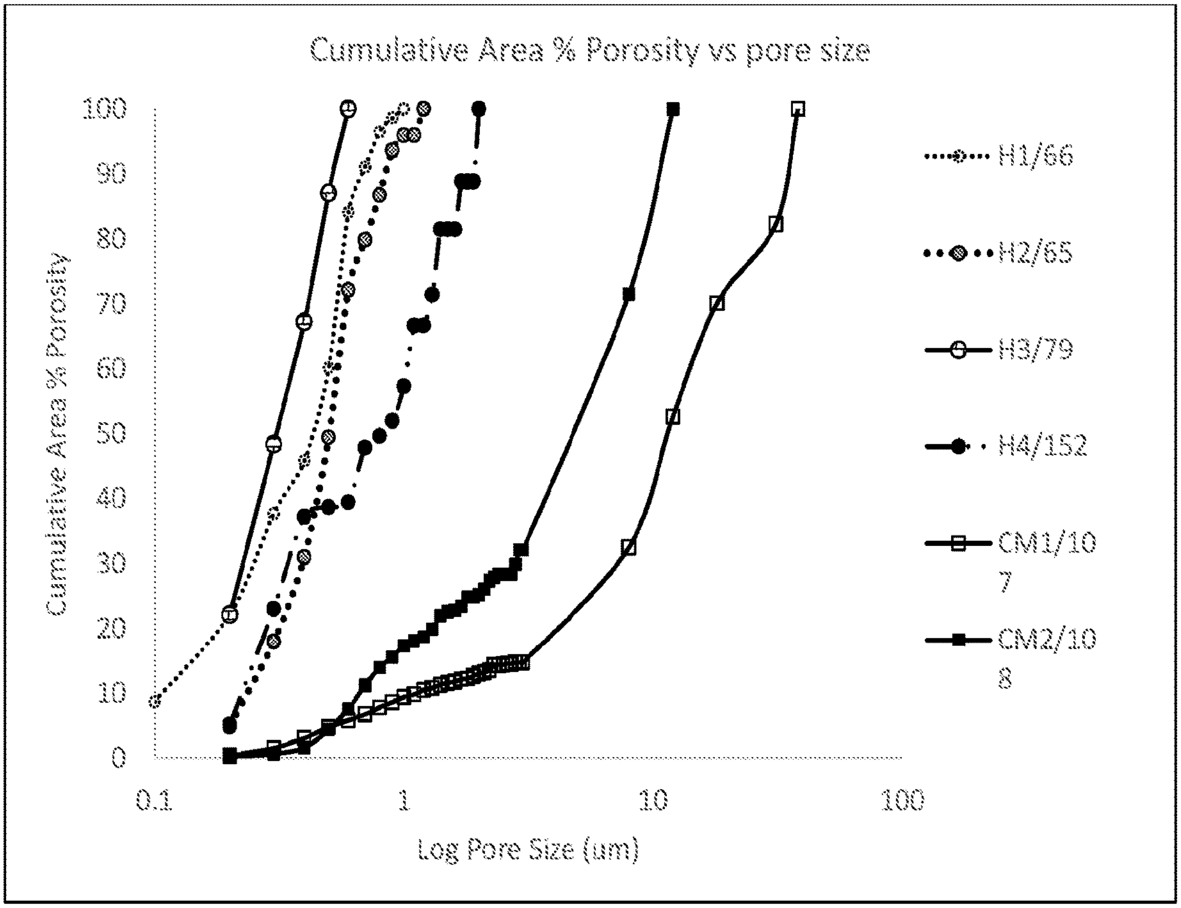
FIG. 29 is a graph illustrating the cumulative area in % versus the pore size (pore size distribution) of various samples from the working examples compared to prior art sintered yttrium oxide samples.

FIG. 29 is a graph illustrating the cumulative area in % versus the pore size (pore size distribution) of various samples from the working examples compared to prior art sintered yttrium oxide samples. In detail, at pore diameters of, for example, less than 1 μm, the cumulative percent of area comprised of porosity is from 96 to 100% for the yttrium oxide materials according to one embodiment of the present invention H1/66 to H3/79, while for the comparative materials CM1/107 to CM3 and H5/62 the cumulative percent of area is about 10% or less.

Figure 30:
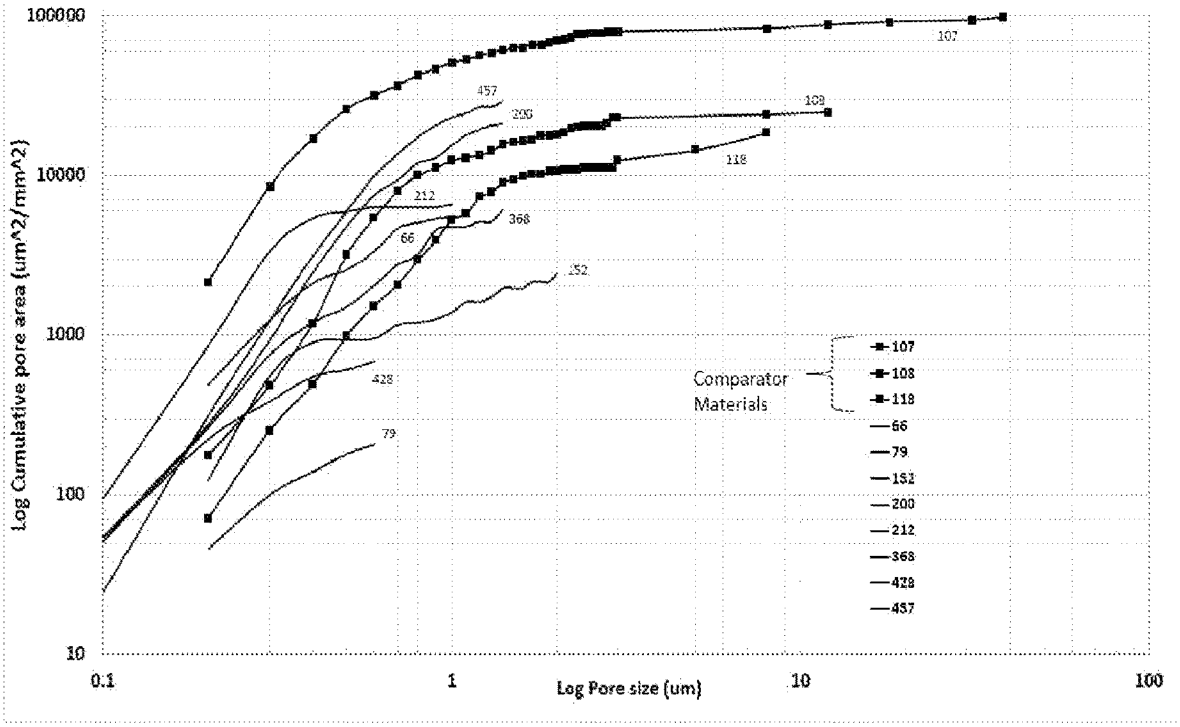
FIG. 30 is a graph illustrating the porosity distribution versus the log of the pore size of various samples from the working examples compared to prior art sintered yttrium oxide samples.

FIG. 30 is a graph illustrating the porosity distribution versus the log of the pore size of various samples from the working examples compared to prior art sintered yttrium oxide samples. Prior art materials 107, 108 and 118 exhibit larger pore sizes, on the order of 7 μm and greater, and a higher fraction of the surface, and thereby the volume, of the sintered yttrium oxide body comprising porosity.

Figure 31:
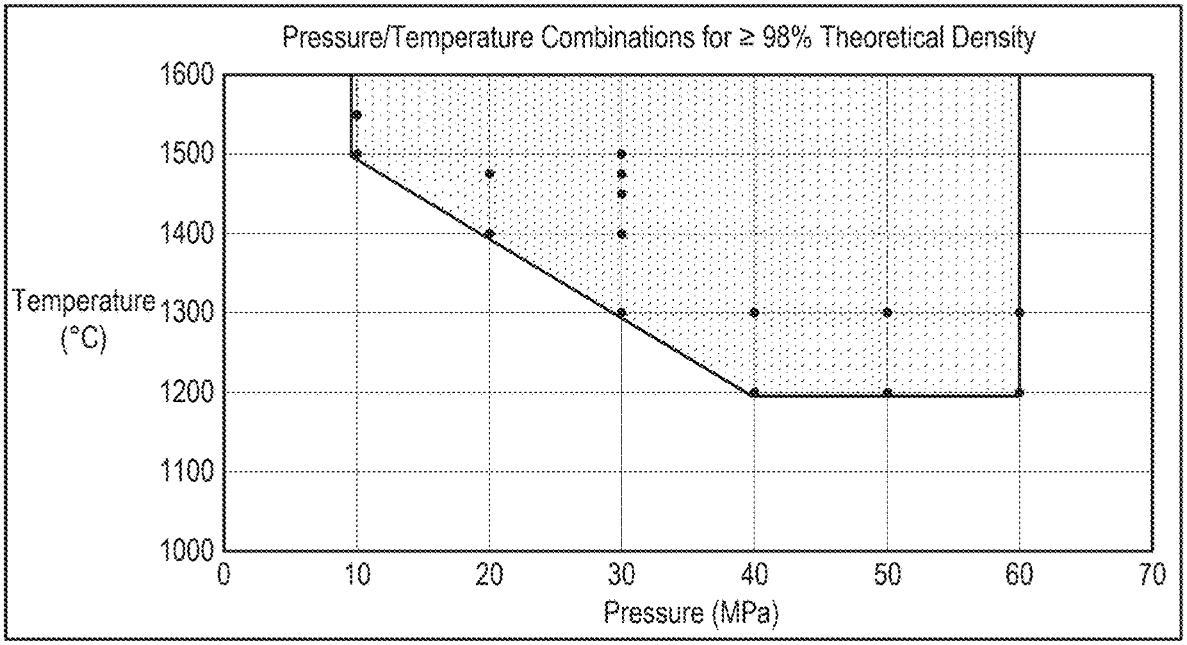
FIG. 31 is a graph illustrating the sintering pressure and temperature conditions required to obtain a sintered yttrium oxide body having a density that is 98% or greater relative to the theoretical density of yttrium oxide.

FIG. 31 is a graph illustrating the sintering pressure and temperature conditions required to obtain a sintered yttrium oxide body having a density that is 98% or greater than the theoretical density of yttrium oxide.

A number of embodiments have been described as disclosed herein. Nevertheless, it will be understood that various modifications may be made without departing from the spirit and scope of the embodiments as disclosed herein. Accordingly, other embodiments are within the scope of the following claims.

What is claimed is:

1. A sintered yttrium oxide body having a total impurity level of 40 ppm or less, a density of not less than 4.98 g/$cm^3$, wherein the sintered yttrium oxide body has a first area encompassed entirely by a first grain, a second area encompassed by a second grain and a third area extending along and encompassing at least one grain boundary between the first and second areas, wherein the at least one grain boundary comprising silica in an amount of not less than 1 to not greater than 10 atoms/$nm^2$ wherein the sintered yttrium oxide body has at least one surface comprising at least one pore, wherein of all pores on the at least one surface no pore is larger than 5 μm in diameter.

2. The sintered yttrium oxide body of claim 1, wherein no pore is larger than 4 μm in diameter.

3. The sintered yttrium oxide body of claim 1 wherein the total impurity level is 35 ppm or less.

4. The sintered yttrium oxide body of claim 1 having a pore size distribution with a maximum pore size of 1.50 μm for 95% or more of all pores on the at least one surface.

5. The sintered yttrium oxide body of claim 1 wherein the at least one surface has an area of which less than 0.15% is occupied by pores.

6. The sintered yttrium oxide body of claim 1 having at least one dimension of from 100 mm to 600 mm.

7. The sintered yttrium oxide body of claim 1 wherein the density does not vary by more than 3% along the at least one dimension.

8. A process of making a sintered yttrium oxide body, the process comprising the steps of:

a. disposing yttrium oxide powder inside an inner volume defined by a spark plasma sintering tool, wherein the spark plasma sintering tool comprises: a die comprising a sidewall comprising an inner wall and an outer wall, wherein the inner wall has a diameter that defines the inner volume; an upper punch and a lower punch operably coupled with the die, wherein each of the upper punch and the lower punch have an outer diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 70 μm wide and creating vacuum conditions inside the inner volume;

b. applying a pressure of from 10 MPa to 60 MPa to the yttrium oxide powder by moving at least one of the upper punch and the lower punch within the inner volume of the die to apply pressure to the yttrium oxide powder while heating to a sintering temperature of from 1200 to 1600° C. and performing sintering to form a sintered yttrium oxide body; and c. lowering the temperature of the sintered yttrium oxide body, wherein the yttrium oxide powder of step a) has a surface area of 10 $m^2$/g or less, wherein the sintered yttrium oxide body has a total impurity level of 40 ppm or less, a density of not less than 4.98 g/$cm^3$, at least one surface comprising at least one pore, wherein of all pores on the at least one surface no pore is larger than 5 μm in diameter.

9. The process of claim 8, further comprising the steps of:

d. optionally annealing the sintered yttrium oxide body by applying heat to raise the temperature of the sintered yttrium oxide body to reach an annealing temperature, performing annealing;

e. lowering the temperature of the annealed sintered yttrium oxide body to an ambient temperature by removing the heat source applied to the sintered yttrium oxide body; and f. optionally machining the annealed sintered yttrium oxide body to create a sintered yttrium oxide body component, wherein the component is selected from the group consisting of a dielectric window or RF window, a focus ring, a nozzle or a gas injector, a shower head, a gas distribution plate, an etch chamber liner, a plasma source adapter, a gas inlet adapter, a diffuser, an electronic wafer chuck, a chuck, a puck, a mixing manifold, an ion suppressor element, a faceplate, an isolator, a spacer, and a protective ring.

10. The process as in any one of claim 8 wherein the yttrium oxide powder is calcined prior to step a).

11. The process as in any one of claim 8 wherein the yttrium oxide powder has a surface area of from 1.5 to 7.0 $m^2$/g.

12. The process as in claim 8 wherein the sintering is performed for a time of from 1 minute to 120 minutes.

13. The process as in claim 8 wherein no pore on the at least one surface is larger than 4 μm in diameter.

14. The process as in claim 8 wherein the total impurity level of the sintered yttrium oxide body is 35 ppm or less.

15. The process as in claim 8 wherein the sintered yttrium oxide body has at least one dimension of from 100 mm to 600 mm.

* * * * *